(12) United States Patent
Tanaka et al.

(10) Patent No.: US 11,411,084 B2
(45) Date of Patent: Aug. 9, 2022

(54) SEMICONDUCTOR DEVICE, INVERTER CIRCUIT, DRIVE DEVICE, VEHICLE, AND ELEVATOR

(71) Applicant: KABUSHIKI KAISHA TOSHIBA, Tokyo (JP)

(72) Inventors: Katsuhisa Tanaka, Tsukuba (JP); Ryosuke Iijima, Setagaya (JP); Shinichi Kimoto, Tsukuba (JP); Shinsuke Harada, Tsukuba (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 17/191,900

(22) Filed: Mar. 4, 2021

(65) Prior Publication Data
US 2022/0013639 A1    Jan. 13, 2022

(30) Foreign Application Priority Data

Jul. 9, 2020    (JP) .............................. JP2020-118756

(51) Int. Cl.
*H01L 29/78*    (2006.01)
*H01L 29/16*    (2006.01)
(Continued)

(52) U.S. Cl.
CPC ........ *H01L 29/1608* (2013.01); *B60L 13/006* (2013.01); *B60L 50/51* (2019.02);
(Continued)

(58) Field of Classification Search
CPC ........... H01L 29/66727; H01L 29/1608; H01L 29/41766; H01L 29/41775;
(Continued)

(56) References Cited

U.S. PATENT DOCUMENTS 10,374,080 B2    8/2019  Ohse et al.
2013/0043524 A1  2/2013  Yamagami et al.
(Continued)

FOREIGN PATENT DOCUMENTS

JP    5565461 B2    8/2014
JP    5858933 B2    2/2016
(Continued)

*Primary Examiner* — Eric A. Ward
(74) *Attorney, Agent, or Firm* — Oblon, McClelland, Maier & Neustadt, L.L.P.

(57) ABSTRACT

A semiconductor device of an embodiment includes a first trench extending in a first direction in a silicon carbide layer; a second trench and a third trench adjacent to each other in the first direction; a first silicon carbide region of n type; a second silicon carbide region of p type on the first silicon carbide region; a third silicon carbide region of n type on the second silicon carbide region; a fourth silicon carbide region of p type between the first silicon carbide region and the second trench; a fifth silicon carbide region of p type between the first silicon carbide region and the third trench; a gate electrode in the first trench; a first electrode, part of which is in the second trench, the first electrode contacting the first silicon carbide region between the fourth silicon carbide region and the fifth silicon carbide region; and a second electrode.

20 Claims, 55 Drawing Sheets

(51) Int. Cl.
  *H01L 29/66* (2006.01)
  *H01L 29/417* (2006.01)
  *H02M 7/537* (2006.01)
  *B60L 13/00* (2006.01)
  *B60L 50/51* (2019.01)
  *B66B 1/30* (2006.01)
  *B61C 9/38* (2006.01)

(52) U.S. Cl.
  CPC ........ *B66B 1/308* (2013.01); *H01L 29/41741* (2013.01); *H01L 29/41775* (2013.01); *H01L 29/66727* (2013.01); *H01L 29/66734* (2013.01); *H01L 29/7806* (2013.01); *H01L 29/7813* (2013.01); *H02M 7/537* (2013.01); *B61C 9/38* (2013.01)

(58) Field of Classification Search
  CPC ........... H01L 29/66734; H01L 29/7805; H01L 29/7813; H01L 29/41741; H01L 29/7806; B60L 13/006; B60L 50/51; B61C 9/38; H02M 7/003; H02M 7/537
  See application file for complete search history.

(56) References Cited

U.S. PATENT DOCUMENTS

| | | |
|---|---|---|
| 2013/0313635 A1 | 11/2013 | Nakano |
| 2017/0077299 A1* | 3/2017 | Shimizu ............ H01L 29/41766 |
| 2018/0219070 A1* | 8/2018 | Ariyoshi ............. H01L 29/1095 |

FOREIGN PATENT DOCUMENTS

| | | |
|---|---|---|
| JP | 2018-182235 A | 11/2018 |
| JP | 2019-216224 A | 12/2019 |

\* cited by examiner

SEMICONDUCTOR DEVICE, INVERTER CIRCUIT, DRIVE DEVICE, VEHICLE, AND ELEVATOR

CROSS-REFERENCE TO RELATED APPLICATION

This application is based upon and claims the benefit of priority from Japanese Patent Application No. 2020-118756, filed on Jul. 9, 2020, the entire contents of which are incorporated herein by reference.

FIELD

Embodiments described herein relate generally to a semiconductor device, an inverter circuit, a drive device, a vehicle, and an elevator.

BACKGROUND

Silicon carbide (SiC) is expected as a material for the next-generation semiconductor device. Compared with silicon, silicon carbide has excellent physical properties such as a band gap about three times, a breakdown field strength about 10 times, and a thermal conductivity about three times. Utilization of this characteristic can realize a metal oxide semiconductor field effect transistor (MOSFET) that can operate at high breakdown voltage, with low loss, and at high temperatures, for example.

A vertical MOSFET using silicon carbide has a pn junction diode as a parasitic built-in diode. For example, a MOSFET is used as a switching element connected to an inductive load. In this case, even at the time of the off operation of the MOSFET, use of a pn junction diode makes it possible to apply a reflux current.

However, when a reflux current is applied using a pn junction diode, a stacking defect grows in the silicon carbide layer due to the recombination energy of carrier, and the on-resistance of the MOSFET is liable to increase. The increase in the on-resistance of the MOSFET causes a decrease in the reliability of the MOSFET.

As a structure for reducing the on-resistance of a MOSFET using silicon carbide, there is a MOSFET of trench gate type provided with a gate electrode in a trench. In the MOSFET of trench gate type, the on-resistance is reduced by increasing the channel density per unit area.

However, in the MOSFET of trench gate type, a structurally high electric field is applied to the gate insulating layer at the bottom of the trench in particular. Therefore, the dielectric breakdown strength of the gate insulating layer is liable to decrease. The decrease in the gate dielectric breakdown strength causes a decrease in the reliability of the MOSFET.

DETAILED DESCRIPTION

Figure 1:
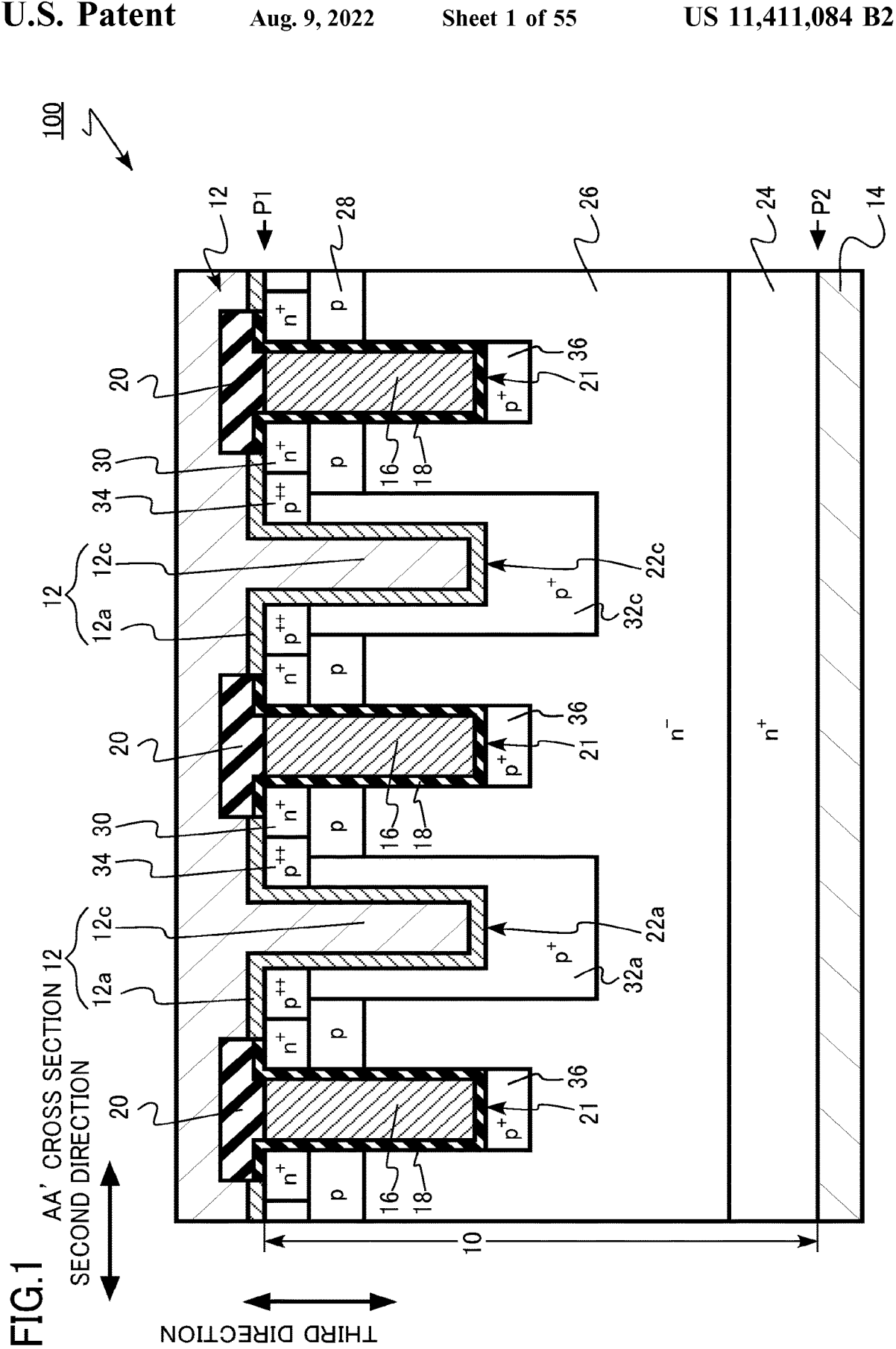
FIG. 1 is a schematic cross-sectional view of a semiconductor device of a first embodiment.

A semiconductor device of an embodiment includes: a silicon carbide layer having a first face and a second face opposite to the first face, the first face being parallel to a first direction and a second direction orthogonal to the first direction, the silicon carbide layer including a first trench located on a side of the first face and extending in the first direction, a second trench located on a side of the first face and located in the second direction with respect to the first trench, a third trench located on a side of the first face, the third trench located in the second direction with respect to the first trench, the third trench located in the first direction with respect to the second trench, a first silicon carbide region of n type, a second silicon carbide region of p type located between the first silicon carbide region and the first face, a third silicon carbide region of n type located between the second silicon carbide region and the first face, a fourth silicon carbide region of p type located between the first silicon carbide region and the second trench, and a fifth silicon carbide region of p type located between the first silicon carbide region and the third trench, and the first silicon carbide region located between the fourth silicon carbide region and the fifth silicon carbide region; a gate electrode located in the first trench; a gate insulating layer located between the gate electrode and the silicon carbide layer; a first electrode located on a side of the first face of the silicon carbide layer and including a first portion, a second portion, and a third portion, the first portion being in contact with the third silicon carbide region, the second portion being in contact with the first silicon carbide region located between the fourth silicon carbide region and the fifth silicon carbide region, and the third portion is located in the second trench; and a second electrode located on a side of the second face of the silicon carbide layer.

Embodiments of the present disclosure will be described below with reference to the drawings. In the following description, identical or similar members and the like are given identical numerals, and the description of the members and the like explained once will be omitted as appropriate.

In the following description, when the notations of $n^+$, n, $n^-$, and $p^+$, p, $p^-$ are used, these notations represent relative levels of impurity concentration in each conductivity type. That is, it is indicated that $n^+$ is relatively higher in impurity concentration of n type than n is, and $n^-$ is relatively lower in impurity concentration of n type than $n^-$ is. It is indicated that $p^+$ is relatively higher in impurity concentration of p type than p is, and $p^-$ is relatively lower in impurity concentration of p type than p is. In some cases, $n^+$ type and $n^-$ type are simply described as n type, $p^+$ type and $p^-$ type are simply described as p type.

Impurity concentration can be measured by secondary ion mass spectrometry (SIMS), for example. The relative level of the impurity concentration can also be judged from the level of the carrier concentration obtained by scanning capacitance microscopy (SCM), for example. A distance such as a width and depth of an impurity region can be obtained by SIMS, for example. A distance such as a width and depth of an impurity region can be obtained from an SCM image, for example.

The depth of the trench, the thickness of the insulating layer, and the like can be measured on an image of a transmission electron microscope (TEM), for example. For example, they can be judged from the profile of SIMS.

In this description, "p type impurity concentration" of a silicon carbide region of p type means a net p type impurity concentration obtained by subtracting the n type impurity concentration of the region from the p type impurity concentration of the region. Furthermore, "n type impurity concentration" of a silicon carbide region of n type means a net n type impurity concentration obtained by subtracting the p type impurity concentration of the region from the n type impurity concentration of the region.

Unless otherwise stated in the description, the impurity concentration in a specific region means the impurity concentration in the center of the region.

First Embodiment

A semiconductor device includes: a silicon carbide layer having a first face and a second face opposite to the first face, the first face being parallel to a first direction and a second direction orthogonal to the first direction, the silicon carbide layer including a first trench located on a side of the first face and extending in the first direction, a second trench located on a side of the first face and located in the second direction with respect to the first trench, a third trench located on a side of the first face, the third trench located in the second direction with respect to the first trench, the third trench located in the first direction with respect to the second trench, a first silicon carbide region of n type, a second silicon carbide region of p type located between the first silicon carbide region and the first face, a third silicon carbide region of n type located between the second silicon carbide region and the first face, a fourth silicon carbide region of p type located between the first silicon carbide region and the second trench, and a fifth silicon carbide region of p type located between the first silicon carbide region and the third trench, and the first silicon carbide region located between the fourth silicon carbide region and the fifth silicon carbide region; a gate electrode located in the first trench; a gate insulating layer located between the gate electrode and the silicon carbide layer; a first electrode located on a side of the first face of the silicon carbide layer and including a first portion, a second portion, and a third portion, the first portion being in contact with the third silicon carbide region, the second portion being in contact with the first silicon carbide region located between the fourth silicon carbide region and the fifth silicon carbide region, and the third portion is located in the second trench; and a second electrode located on a side of the second face of the silicon carbide layer.

The semiconductor device of the first embodiment is a vertical MOSFET 100 using silicon carbide. The MOSFET 100 is a MOSFET having a trench gate structure in which a gate electrode is provided in a trench. The MOSFET 100 is a MOSFET having a so-called double trench structure in which a source electrode is provided in the trench. The MOSFET 100 includes a Schottky barrier diode (SBD) as a built-in diode. The MOSFET 100 is a MOSFET of n channel type with electrons as carriers.

Figure 2:
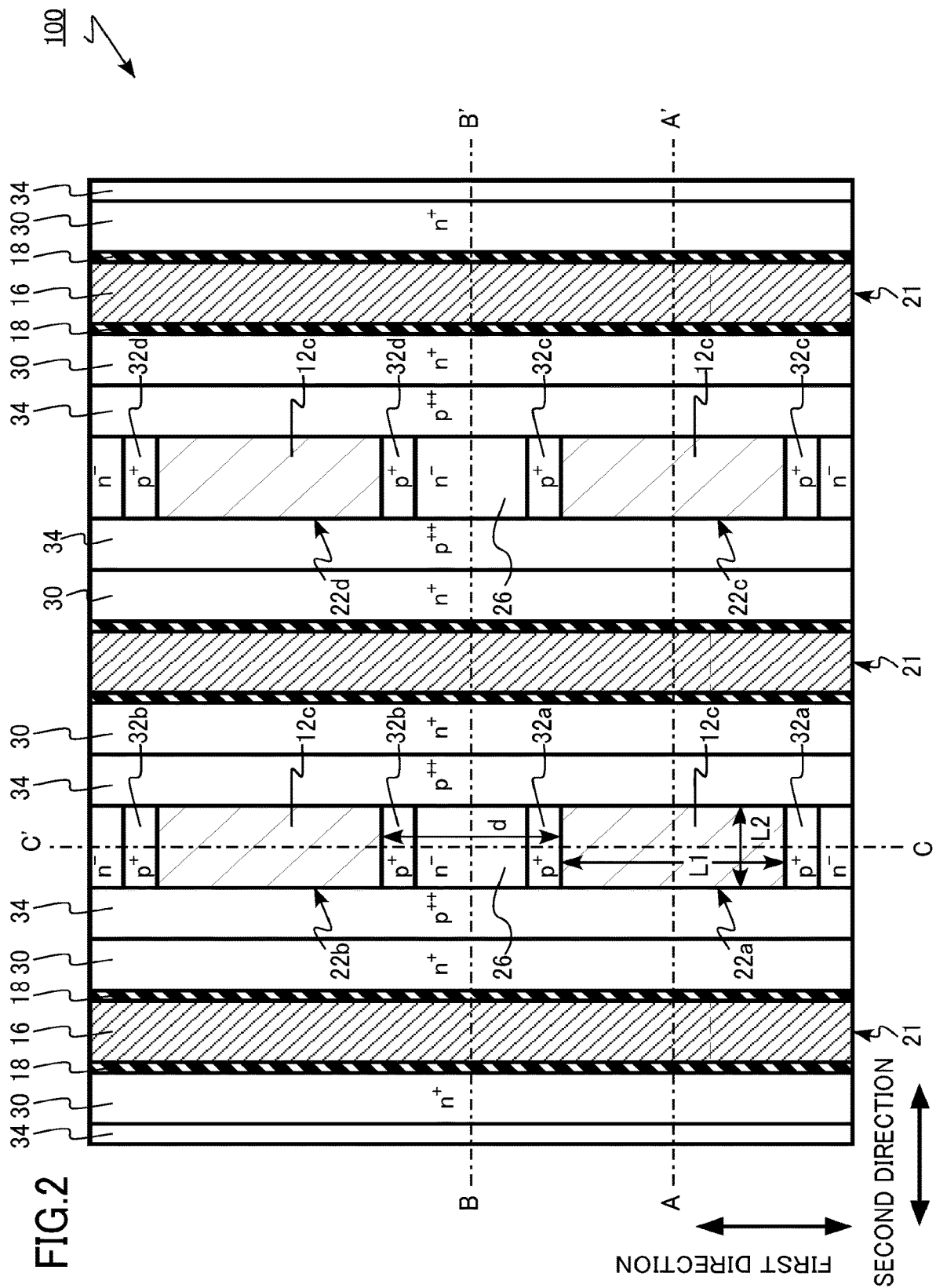
FIG. 2 is a schematic plan view of the semiconductor device of the first embodiment.
Figure 3:
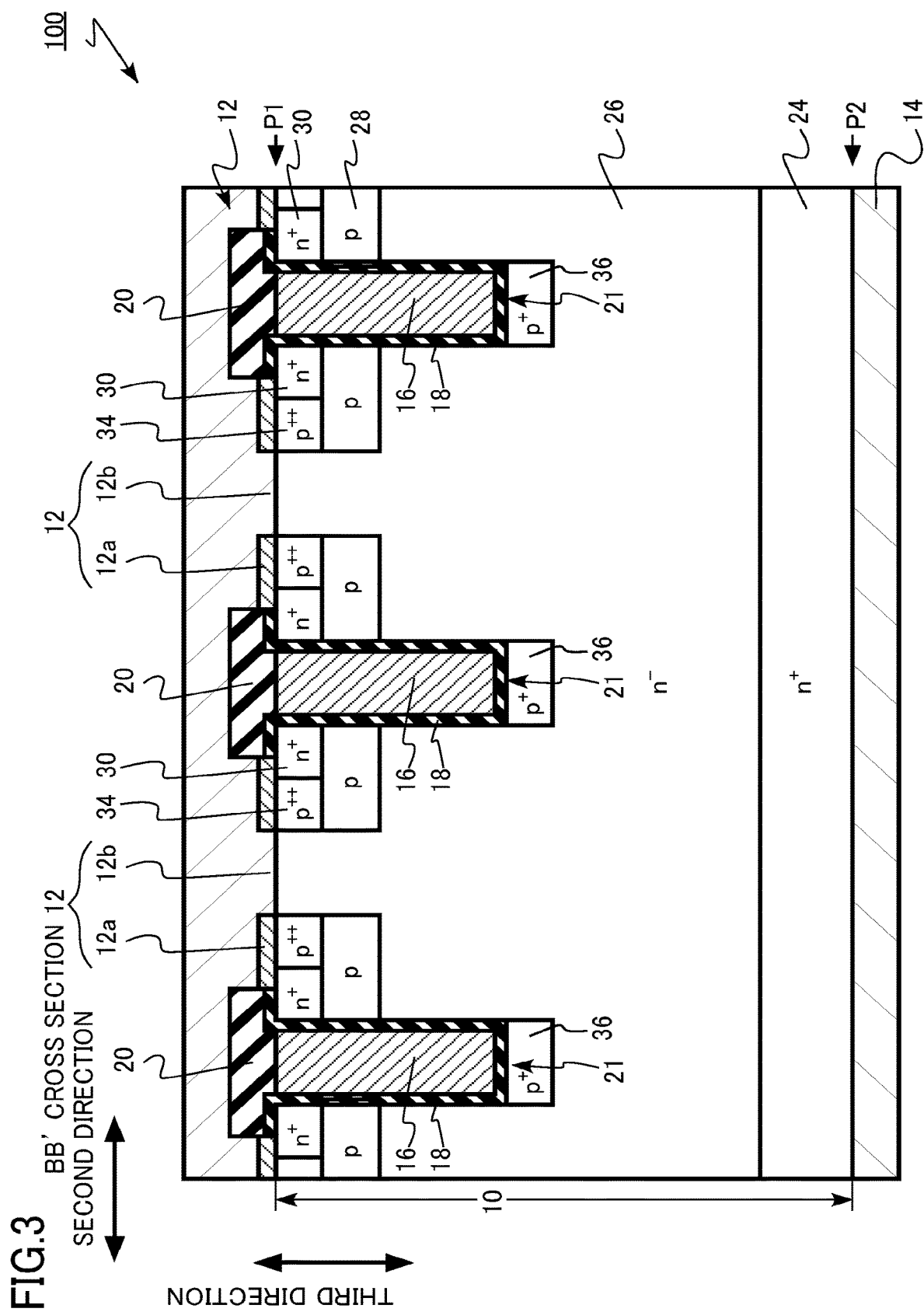
FIG. 3 is a schematic cross-sectional view of the semiconductor device of the first embodiment.
Figure 4:
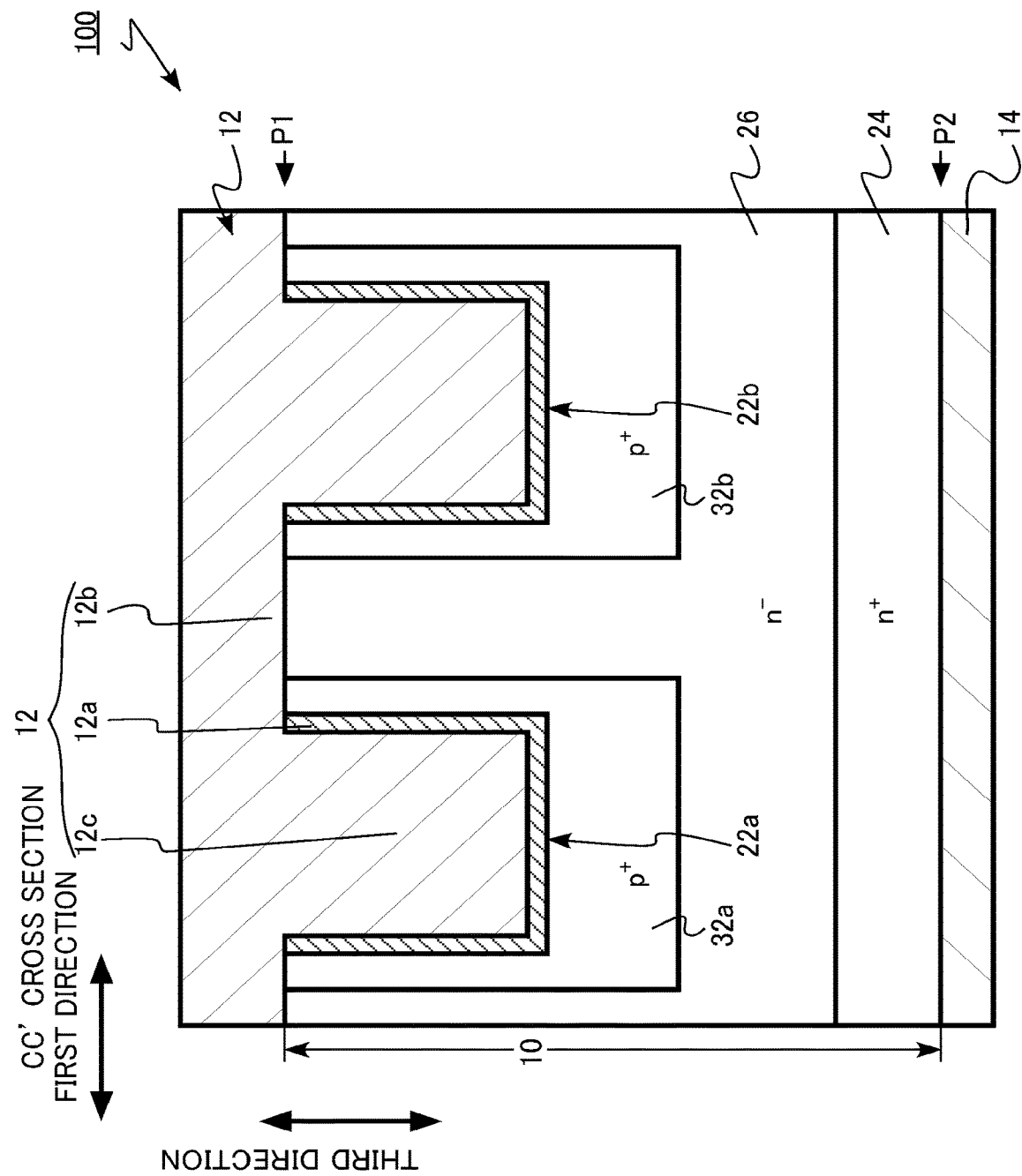
FIG. 4 is a schematic cross-sectional view of the semiconductor device of the first embodiment.

FIG. 1 is a schematic cross-sectional view of the semiconductor device of the first embodiment. FIG. 2 is a schematic plan view of the semiconductor device of the first embodiment. FIG. 3 is a schematic cross-sectional view of the semiconductor device of the first embodiment. FIG. 4 is a schematic cross-sectional view of the semiconductor device of the first embodiment.

FIG. 1 is a cross-sectional view of AA' of FIG. 2. FIG. 2 shows a pattern on a first face P1 of FIG. 1. FIG. 3 is a cross-sectional view of BB' of FIG. 2. FIG. 4 is a cross-sectional view of CC' of FIG. 2.

The MOSFET 100 includes a silicon carbide layer 10, a source electrode 12 (first electrode), a drain electrode 14 (second electrode), a gate electrode 16, a gate insulating layer 18, and an interlayer insulating layer 20. The source electrode 12 has a silicide region 12a (first portion), a Schottky region 12b (second portion), and an embedded region 12c (third portion).

The silicon carbide layer 10 has a gate trench 21 (first trench), a contact trench 22a (second trench), a contact trench 22b (third trench), a contact trench 22c, a contact trench 22d, a drain region of $n^+$ type 24, a drift region of $n^-$ type 26 (first silicon carbide region), a body region of p type 28 (second silicon carbide region), a source region of $n^+$ type 30 (third silicon carbide region), an electric field relaxation region of $p^+$ type 32a (fourth silicon carbide region), an electric field relaxation region of $p^+$ type 32b (fifth silicon carbide region), an electric field relaxation region of $p^+$ type 32c, a high concentration region of $p^{++}$ type 34 (sixth silicon carbide region), and a gate trench bottom region of $p^+$ type 36 (seventh silicon carbide region).

Hereinafter, the contact trench 22a, the contact trench 22b, the contact trench 22c, and the contact trench 22d are sometimes collectively referred to simply as the contact trench 22. The electric field relaxation region 32a, the electric field relaxation region 32b, and the electric field relaxation region 32c are sometimes collectively referred to simply as the electric field relaxation region 32.

The silicon carbide layer 10 is located between the source electrode 12 and the drain electrode 14. The silicon carbide layer 10 includes the first face ("P1" in FIG. 1) and a second face ("P2" in FIG. 1). Hereinafter, the first face P1 is referred to as a front face, and the second face P2 is referred to as a back face. The second face P2 is opposite to the first face P1.

The first direction and the second direction are directions parallel to the first face P1. The second direction is a direction orthogonal to the first direction. The third direction is a direction perpendicular to the first face P1. The third direction is a direction perpendicular to the first direction and the second direction.

Hereinafter, "depth" means a depth based on the first face P1.

The silicon carbide layer 10 is SiC of a single crystal. The silicon carbide layer 10 is 4H—SiC, for example. The thickness of the silicon carbide layer 10 is, for example, equal to or more than 5 μm and equal to or less than 500 μm.

The first face P1 is a face inclined by equal to or more than 0 degrees and equal to or less than 8 degrees with respect to a (0001) face, for example. That is, the first face P1 is a face whose normal is inclined by equal to or more than 0 degrees and equal to or less than 8 degrees with respect to a c axis in a [0001] direction. In other words, an off angle with respect to the (0001) face is equal to or more than 0 degrees and equal to or less than 8 degrees. The second face P2 is a face inclined by equal to or more than 0 degrees and equal to or less than 8 degrees with respect to a (000-1) face, for example.

The (0001) face is referred to as a silicon face. The (000-1) face is referred to as a carbon face. The inclination direction of the first face P1 and the second face P2 is a [11-20] direction, for example. The [11-20] direction is an a axis direction. In FIGS. 1 to 4, for example, the first direction or the second direction shown in the figures is the a axis direction.

The gate trench 21 exists in the silicon carbide layer 10. The gate trench 21 is located on a side of the first face P1 of the silicon carbide layer 10. The gate trench 21 is a groove formed in the silicon carbide layer 10.

The gate trench 21 extends in the first direction as shown in FIG. 2. The gate trench 21 has a stripe shape as shown in FIG. 2.

The gate trench 21 is repeatedly disposed in the second direction as shown in FIGS. 1 and 2. The length of the gate trench 21 in the second direction is equal to or more than 0.5 µm and equal to or less than 1 µm, for example.

The gate trench 21 penetrates the source region 30 and the body region 28. The depth of the gate trench 21 is, for example, equal to or more than 1 µm and equal to or less than 2 µm.

The contact trench 22 exists in the silicon carbide layer 10. The contact trench 22 is located on a side of the first face P1 of the silicon carbide layer 10. The contact trench 22 is a groove formed in the silicon carbide layer 10.

The contact trench 22 extends in the first direction, for example, as shown in FIG. 2. The contact trench 22 is repeatedly disposed in the first direction as shown in FIG. 2. The contact trench 22 is a trench divided in the first direction.

For example, the contact trench 22b is located in the first direction with respect to the contact trench 22a. The contact trench 22b is provided to be spaced apart from the contact trench 22a in the first direction.

The contact trench 22 is located in the second direction with respect to the gate trench 21. For example, the contact trench 22a is located in the second direction with respect to the gate trench 21. For example, the contact trench 22b is located in the second direction with respect to the gate trench 21. The contact trench 22 is provided between the two gate trenches 21. The contact trench 22 is repeatedly disposed in the second direction with the gate trench 21 in between.

The length of the contact trench 22 in the first direction is larger than the length of the contact trench 22 in the second direction, for example. For example, the length of the contact trench 22a in the first direction (L1 in FIG. 2) is larger than the length of the contact trench 22a in the second direction (L2 in FIG. 2).

The length of the contact trench 22 in the first direction is, for example, equal to or more than 1 µm and equal to or less than 5 µm. The length of the contact trench 22 in the second direction is, for example, equal to or more than 0.5 µm and equal to or less than 2 µm.

The distance between the two contact trenches 22 adjacent to each other in the first direction is larger than the length of the contact trench 22 in the first direction, for example. For example, the distance between the contact trench 22a and the contact trench 22b (d in FIG. 2) is larger than the length of the contact trench 22a in the first direction (L1 in FIG. 2). The distance between the two contact trenches 22 adjacent to each other in the first direction is equal to or more than 1.2 times and equal to or less than 3 times the length of the contact trench 22 in the first direction, for example. The distance between the two contact trenches 22 adjacent to each other in the first direction is larger than the length of the contact trench 22 in the second direction, for example. For example, the distance between the contact trench 22a and the contact trench 22b (d in FIG. 2) is larger than the length of the contact trench 22a in the second direction (L2 in FIG. 2). The distance between the two contact trenches 22 adjacent to each other in the first direction is equal to or more than 1.2 times and equal to or less than 3 times the length of the contact trench 22 in the second direction, for example.

The length of the contact trench 22 in the second direction is larger than the length of the gate trench 21 in the second direction, for example. The length of the contact trench 22 in the second direction is the same as the length of the gate trench 21 in the second direction, for example.

The distance between the gate trench 21 and the contact trench 22 is, for example, equal to or more than 0.5 µm and equal to or less than 1 µm. The distance between the two contact trenches 22 adjacent to each other in the first direction is, for example, equal to or more than 0.6 µm and equal to or less than 1.5 µm.

The contact trench 22 penetrates the source region 30 and the body region 28. The depth of the contact trench 22 is, for example, equal to or more than 1 µm and equal to or less than 2 µm.

The depth of the contact trench 22 and the depth of the gate trench 21 are, for example, the same. In other words, the distance from the second face P2 to the gate trench 21 and the distance from the second face P2 to the contact trench 22 are the same. The depth of the contact trench 22 and the depth of the gate trench 21 may be different.

The gate electrode 16 is located in the gate trench 21. The gate electrode 16 is provided between the source electrode 12 and the drain electrode 14. The gate electrode 16 extends in the first direction.

The gate electrode 16 is a conductive layer. The gate electrode 16 is, for example, polycrystalline silicon containing a p type impurity or an n type impurity.

The gate insulating layer 18 is located between the gate electrode 16 and the silicon carbide layer 10. The gate insulating layer 18 is provided between the source region 30, the body region 28, the drift region 26 and the gate trench bottom region 36, and the gate electrode 16.

The gate insulating layer 18 is, for example, a silicon oxide film. For example, a high dielectric constant insulating film can be applied to the gate insulating layer 18. For example, a stacked film of a silicon oxide film and a high dielectric constant insulating film can be applied to the gate insulating layer 18.

The interlayer insulating layer 20 is provided on the gate electrode 16. The interlayer insulating layer 20 is provided between the gate electrode 16 and the source electrode 12.

The thickness of the interlayer insulating layer 20 is larger than the thickness of the gate insulating layer 18, for example. The interlayer insulating layer 20 is, for example, a silicon oxide film. The interlayer insulating layer 20 electrically separates the gate electrode 16 from the source electrode 12.

The source electrode 12 is located on the first face P1 side of the silicon carbide layer 10. The source electrode 12 is provided on the first face P1 of the silicon carbide layer 10.

The source electrode 12 includes metal. The source electrode 12 includes, for example, aluminum (Al) or titanium (Ti).

The source electrode 12 is electrically connected to the source region 30, the body region 28, the electric field relaxation region 32, and the high concentration region 34.

The source electrode 12 has a silicide region 12a (first portion), a Schottky region 12b (second portion), and an embedded region 12c (third portion).

The silicide region 12a is in contact with the source region 30, the electric field relaxation region 32, and the high concentration region 34. The source electrode 12 is in contact with the source region 30 on the first face P1 of the silicon carbide layer 10. The source electrode 12 is in contact with the high concentration region 34 on the first face P1 of the silicon carbide layer 10. The silicide region 12a is an example of the first portion.

The silicide region 12a includes a metal silicide, for example. The metal silicide is, for example, a nickel silicide or a titanium silicide.

By providing the silicide region 12a, contact resistance between the source electrode 12 and the source region 30 and contact resistance between the source electrode 12 and the high concentration region 34 are reduced. Connection between the source electrode 12 and the source region 30, and connection between the source electrode 12 and the high concentration region 34 are, for example, an ohmic connection.

The Schottky region 12b is in contact with the drift region 26 between the electric field relaxation region 32a and the electric field relaxation region 32b. The Schottky region 12b is in contact with the drift region 26 between the two contact trenches 22 adjacent to each other in the first direction.

The Schottky region 12b is in contact with the drift region 26 at a position shallower than the bottom of the contact trench 22. The Schottky region 12b is in contact with the drift region 26 on the first face P1. The Schottky region 12b is an example of the second portion.

The chemical composition of the Schottky region 12b is different from the chemical composition of the silicide region 12a. The Schottky region 12b includes, for example, polycrystalline silicon, aluminum (Al), titanium (Ti), tungsten (W), molybdenum (Mo), or nickel (Ni).

By providing the Schottky region 12b, a Schottky barrier is formed between the source electrode 12 and the drift region 26. The connection between the Schottky region 12b and the drift region 26 is a Schottky connection.

The embedded region 12c is located in the contact trench 22. The embedded region 12c is located in the contact trench 22a, for example. The embedded region 12c is located in the contact trench 22b, for example.

The drain electrode 14 is located on the second face P2 side of the silicon carbide layer 10. The drain electrode 14 is provided on the second face P2 of the silicon carbide layer 10. The drain electrode 14 is in contact with the drain region 24.

The drain electrode 14 is, for example, a metal or a metal semiconductor compound. The drain electrode 14 includes at least one material selected from the group consisting of a nickel silicide, titanium (Ti), nickel (Ni), silver (Ag), and gold (Au), for example.

The drain region of $n^+$ type 24 is provided on the second face P2 side of the silicon carbide layer 10. The drain region 24 includes, for example, nitrogen (N) as an n type impurity. The n type impurity concentration of the drain region 24 is, for example, equal to or more than $1\times10^{18}$ cm$^{-3}$ and equal to or less than $1\times10^{21}$ cm$^{-3}$.

The drift region of $n^-$ type 26 is provided on the drain region 24. The drift region 26 is located between the drain region 24 and the first face P1.

A part of the drift region 26 is located between the two contact trenches 22 adjacent to each other in the first direction. A part of the drift region 26 is interposed between the two contact trenches 22 adjacent to each other in the first direction. A part of the drift region 26 is located between the contact trench 22a and the contact trench 22b, for example.

A part of the drift region 26 is located between the two electric field relaxation regions 32 adjacent to each other in the first direction. A part of the drift region 26 is located between the electric field relaxation region 32a and the electric field relaxation region 32b, for example.

A part of the drift region 26 is in contact with the first face P1. A part of the drift region 26 is in contact with the Schottky region 12b.

The drift region 26 includes, for example, nitrogen (N) as an n type impurity. The n type impurity concentration of the drift region 26 is lower than the n type impurity concentration of the drain region 24. The n type impurity concentration of the drift region 26 is, for example, equal to or more than $4\times10^{14}$ cm$^{-3}$ and equal to or less than $1\times10^{18}$ cm$^{-3}$.

The body region of p type 28 is located between the drift region 26 and the first face P1. The body region 28 is located between the gate trench 21 and the contact trench 22.

The body region 28 functions as a channel forming region of the MOSFET 100. For example, when the MOSFET 100 is turned on, a channel through which electrons flow is formed in a region of the body region 28 in contact with the gate insulating layer 18. The region of the body region 28 in contact with the gate insulating layer 18 becomes a channel forming region.

The body region 28 includes, for example, aluminum (Al) as a p type impurity. The p type impurity concentration of the body region 28 is, for example, equal to or more than $5\times10^{16}$ cm$^{-3}$ and equal to or less than $5\times10^{17}$ cm$^{-3}$.

The depth of the body region 28 is smaller than the depth of the gate trench 21. The depth of the body region 28 is, for example, equal to or more than 0.4 µm and equal to or less than 1.0 µm.

The thickness of the body region 28 in the depth direction (third direction) is, for example, equal to or more than 0.1 µm and equal to or less than 0.3 µm.

The source region of $n^+$ type 30 is located between the body region 28 and the first face P1. The source region 30 is located between the gate trench 21 and the contact trench 22. The source region 30 extends in the first direction.

The source region 30 is in contact with the source electrode 12. The source region 30 is in contact with the silicide region 12a. The source region 30 is in contact with the gate insulating layer 18.

The source region 30 includes, for example, phosphorus (P) as an n type impurity. The n type impurity concentration of the source region 30 is higher than the n type impurity concentration of the drift region 26. The n type impurity concentration of the source region 30 is, for example, equal to or more than $1\times10^{19}$ cm$^{-3}$ and equal to or less than $1\times10^{21}$ cm$^{-3}$.

The depth of the source region 30 is smaller than the depth of the body region 28. The depth of the source region 30 is, for example, equal to or more than 0.1 µm and equal to or less than 0.4 µm.

The electric field relaxation region of $p^+$ type 32 is located between the drift region 26 and the contact trench 22. The electric field relaxation region 32 is located between the drift region 26 and the contact trench 22a, for example. The electric field relaxation region 32 is located between the drift region 26 and the contact trench 22b, for example.

The electric field relaxation region 32 is in contact with a side face of the contact trench 22. The electric field relaxation region 32 is in contact with the silicide region 12a of the source electrode 12.

The electric field relaxation region 32 is provided between the drift region 26 and the bottom face of the contact trench 22. The electric field relaxation region 32 is located between the contact trench 22 and the body region 28.

The electric field relaxation regions 32 are adjacent to each other in the first direction. For example, the electric field relaxation region 32a and the electric field relaxation region 32b are adjacent to each other in the first direction. For example, the electric field relaxation region 32c and the electric field relaxation region 32d are adjacent to each other in the first direction.

The two electric field relaxation regions 32 adjacent to each other in the first direction interpose the drift region 26 in between. For example, the electric field relaxation region 32a and the electric field relaxation region 32b interpose the drift region 26 in between. For example, the electric field relaxation region 32c and the electric field relaxation region 32d interpose the drift regions 26 in between.

The depth of the electric field relaxation region 32 is larger than the depth of the gate trench 21.

The electric field relaxation region 32 has a function of relaxing an electric field strength applied to the gate insulating layer 18 at the time of the off operation of the MOSFET 100. The electric field relaxation region 32 is fixed at the same electric potential as the source electrode 12, for example.

The electric field relaxation region 32 includes, for example, aluminum (Al) as a p type impurity. The p type impurity concentration of the electric field relaxation region 32 is higher than the p type impurity concentration of the body region 28. The p type impurity concentration of the electric field relaxation region 32 is, for example, equal to or more than 10 times the p type impurity concentration of the body region 28. The p type impurity concentration of the electric field relaxation region 32 is, for example, equal to or more than $5 \times 10^{17}$ cm$^{-3}$ and equal to or less than $5 \times 10^{20}$ cm$^{-3}$.

The high concentration region of p$^{++}$ type 34 is located between the source region 30 and the contact trench 22. The high concentration region 34 is located between a portion of the drift region 26 in contact with the Schottky region 12b and the source region 30.

The depth of the high concentration region 34 is smaller than the depth of the body region 28, for example. The high concentration region 34 is in contact with the first face P1, for example.

The high concentration region 34 has a function of reducing the contact resistance of the source electrode 12. By providing the high concentration region 34, the electric resistance between the source electrode 12 and the electric field relaxation region 32 is reduced. By providing the high concentration region 34, the electric resistance between the source electrode 12 and the body region 28 is reduced.

The high concentration region 34 has a function of suppressing punch-through between the drift region 26 in a portion in contact with the Schottky region 12b and the source region 30 at the time of the off operation of the MOSFET 100.

The high concentration region 34 includes, for example, aluminum (Al) as a p type impurity. The p type impurity concentration of the high concentration region 34 is higher than the p type impurity concentration of the body region 28. The p type impurity concentration of the high concentration region 34 is, for example, equal to or more than 10 times and equal to or less than 1000 times the p type impurity concentration of the body region 28.

The p type impurity concentration of the high concentration region 34 is, for example, equal to or more than $1 \times 10^{19}$ cm$^{-3}$ and equal to or less than $1 \times 10^{21}$ cm$^{-3}$. The p type impurity concentration of the portion of the high concentration region 34 in contact with the source electrode 12 is, for example, equal to or more than $1 \times 10^{19}$ cm$^{-3}$ and equal to or less than $1 \times 10^{21}$ cm$^{-3}$.

The gate trench bottom region of p$^+$ type 36 is provided between the drift region 26 and the bottom face of the gate trench 21. The gate trench bottom region 36 is in contact with the bottom face of the gate trench 21.

The gate trench bottom region 36 has a function of relaxing an electric field strength applied to the gate insulating layer 18 at the time of the off operation of the MOSFET 100. The gate trench bottom region 36 is fixed at the same electric potential as the source electrode 12, for example.

The gate trench bottom region 36 includes, for example, aluminum (Al) as a p type impurity. The p type impurity concentration of the gate trench bottom region 36 is higher than the p type impurity concentration of the body region 28.

The p type impurity concentration of the gate trench bottom region 36 is, for example, equal to or more than 10 times the p type impurity concentration of the body region 28. The p type impurity concentration of the gate trench bottom region 36 is, for example, equal to or more than $5 \times 10^{17}$ cm$^{-3}$ and equal to or less than $5 \times 10^{21}$ cm$^{-3}$.

Next, an example of the manufacturing method of the semiconductor device of the first embodiment will be described.

FIG. 5 to FIG. 34 are schematic cross-sectional views showing examples of the manufacturing method of the semiconductor device of the first embodiment. FIG. 5, FIG. 6, FIG. 7, FIG. 9, FIG. 11, FIG. 13, FIG. 15, FIG. 17, FIG. 19, FIG. 21, FIG. 23, FIG. 25, FIG. 27, FIG. 29, FIG. 31, and FIG. 33 are cross-sectional views corresponding to FIG. 1. FIG. 8, FIG. 10, FIG. 12, FIG. 14, FIG. 16, FIG. 18, FIG. 20, FIG. 22, FIG. 24, FIG. 26, FIG. 28, FIG. 30, FIG. 32, and FIG. 34 are cross-sectional views corresponding to FIG. 4.

Figure 5:
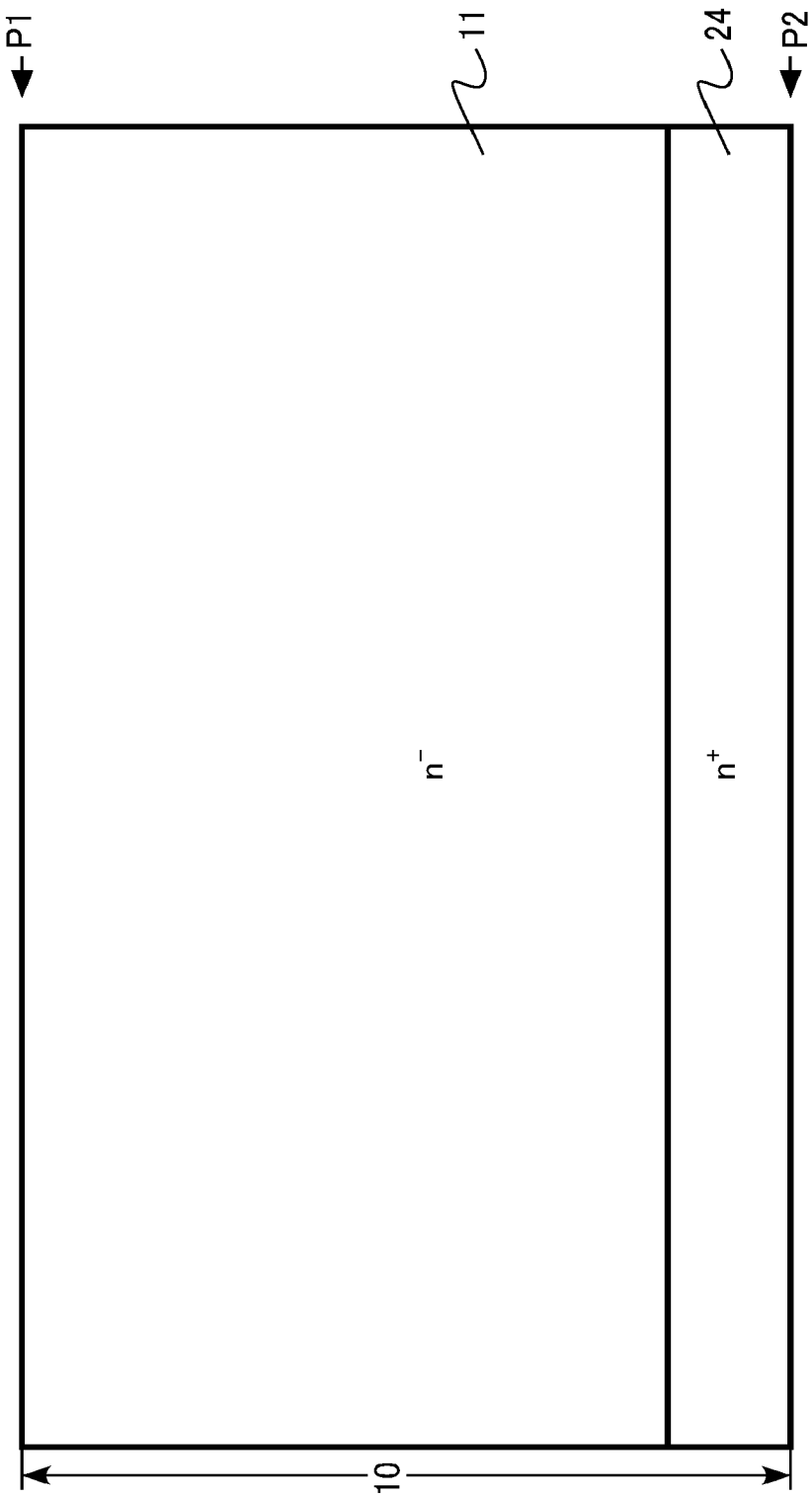
FIG. 5 is a schematic cross-sectional view showing an example of a manufacturing method of the semiconductor device of the first embodiment.

First, on the drain region of n$^+$ type 24 and the drain region 24, the silicon carbide layer 10 having an epitaxial layer of n$^-$ type 11 formed by epitaxial growth is prepared (FIG. 5). A portion of the epitaxial layer 11 eventually becomes the drift region 26.

The silicon carbide layer 10 includes the first face ("P1" in FIG. 5) and a second face ("P2" in FIG. 5). Hereinafter, the first face P1 is referred to as a front face, and the second face P2 is referred to as a back face.

Figure 6:
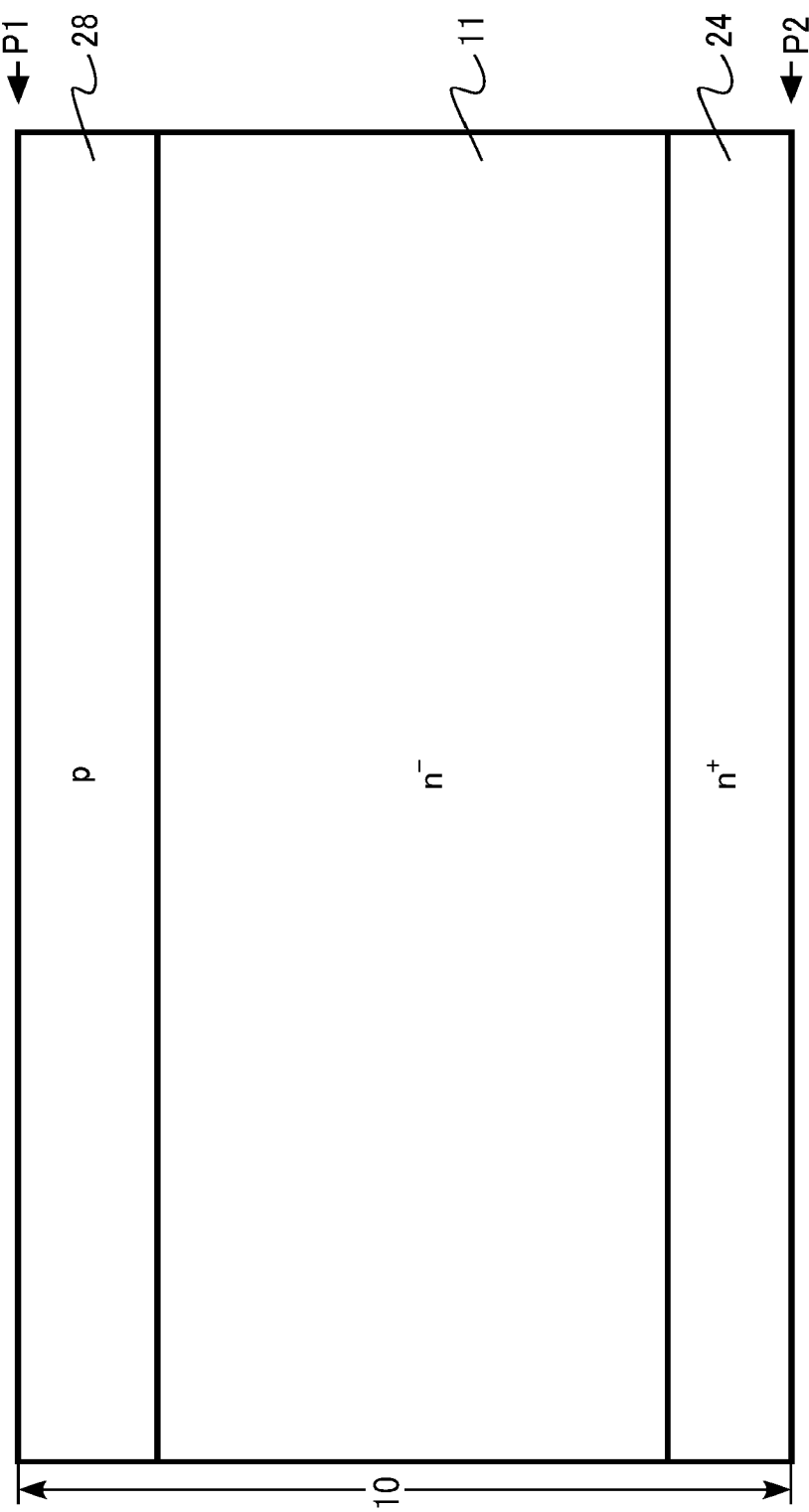
FIG. 6 is a schematic cross-sectional view showing an example of the manufacturing method of the semiconductor device of the first embodiment.

Next, the body region of p type 28 is formed in the epitaxial layer 11 by ion implantation method (FIG. 6).

Figure 7:
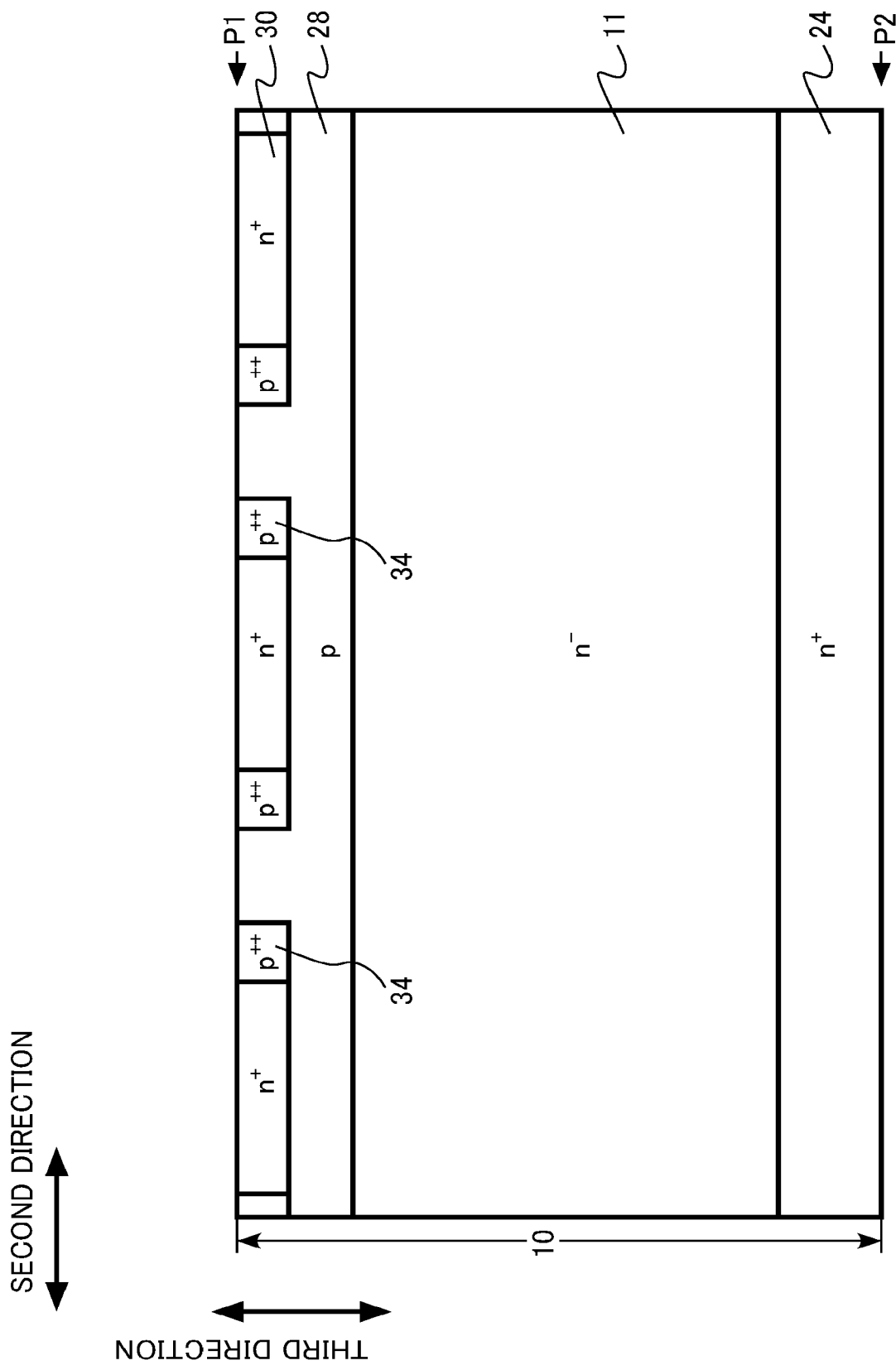
FIG. 7 is a schematic cross-sectional view showing an example of the manufacturing method of the semiconductor device of the first embodiment.
Figure 8:
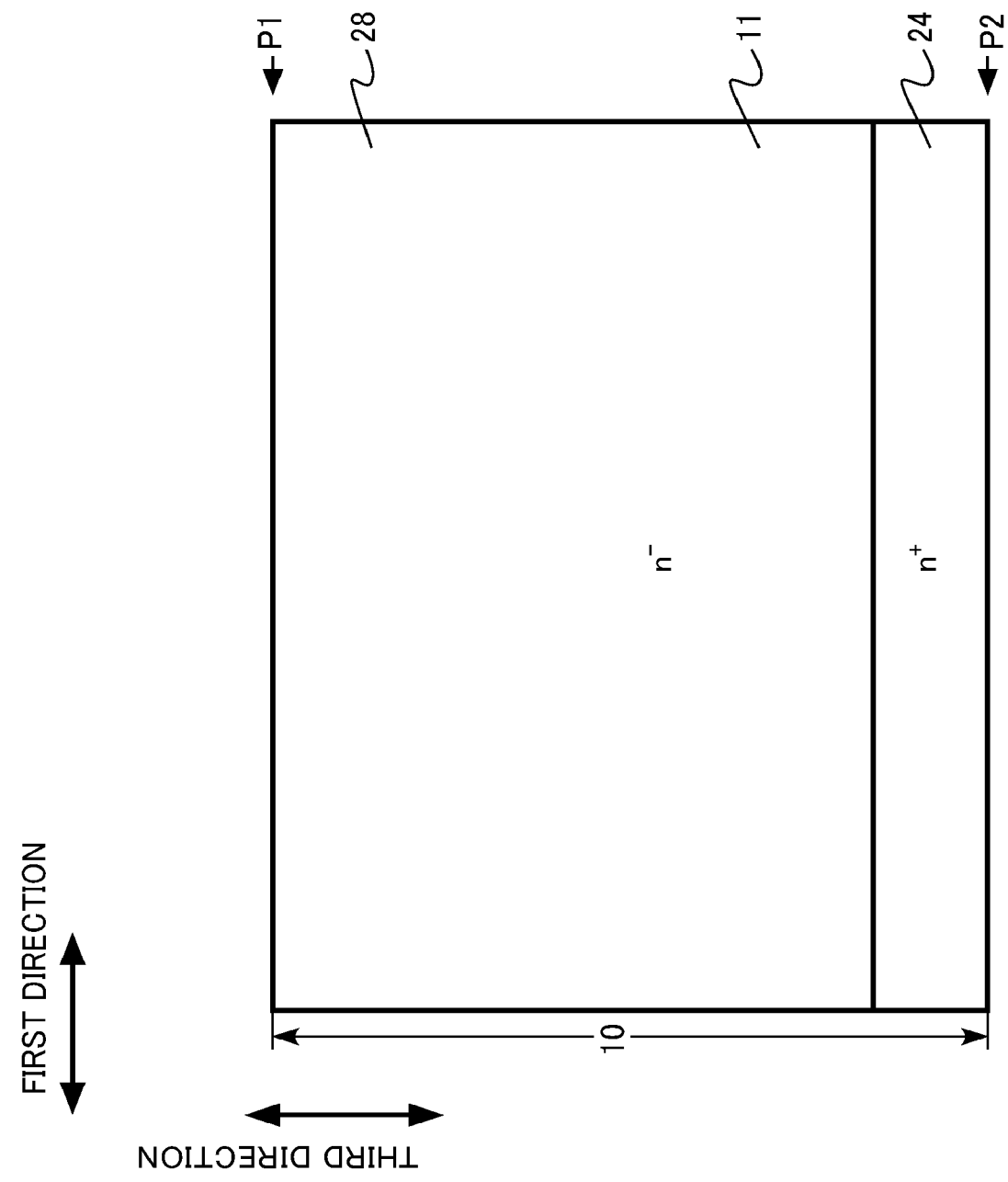
FIG. 8 is a schematic cross-sectional view showing an example of the manufacturing method of the semiconductor device of the first embodiment.

Next, the source region of n$^+$ type 30 and the high concentration region of p$^{++}$ type 34 are formed in the epitaxial layer 11 by ion implantation method (FIGS. 7 and 8). The source region 30 is formed between the body region 28 and the first face P1. The high concentration region 34 is formed between the body region 28 and the first face P1.

Figure 9:
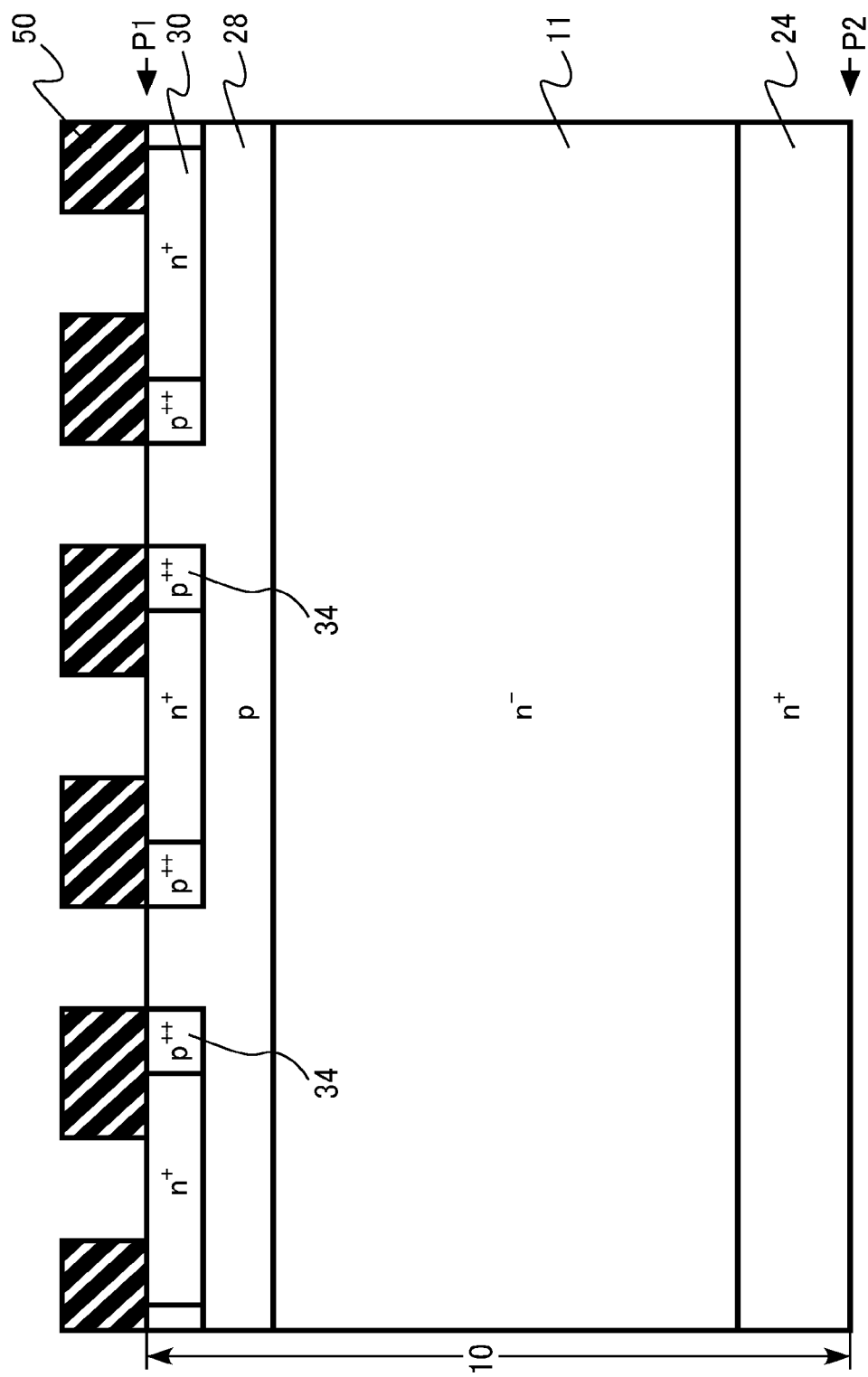
FIG. 9 is a schematic cross-sectional view showing an example of the manufacturing method of the semiconductor device of the first embodiment.
Figure 10:
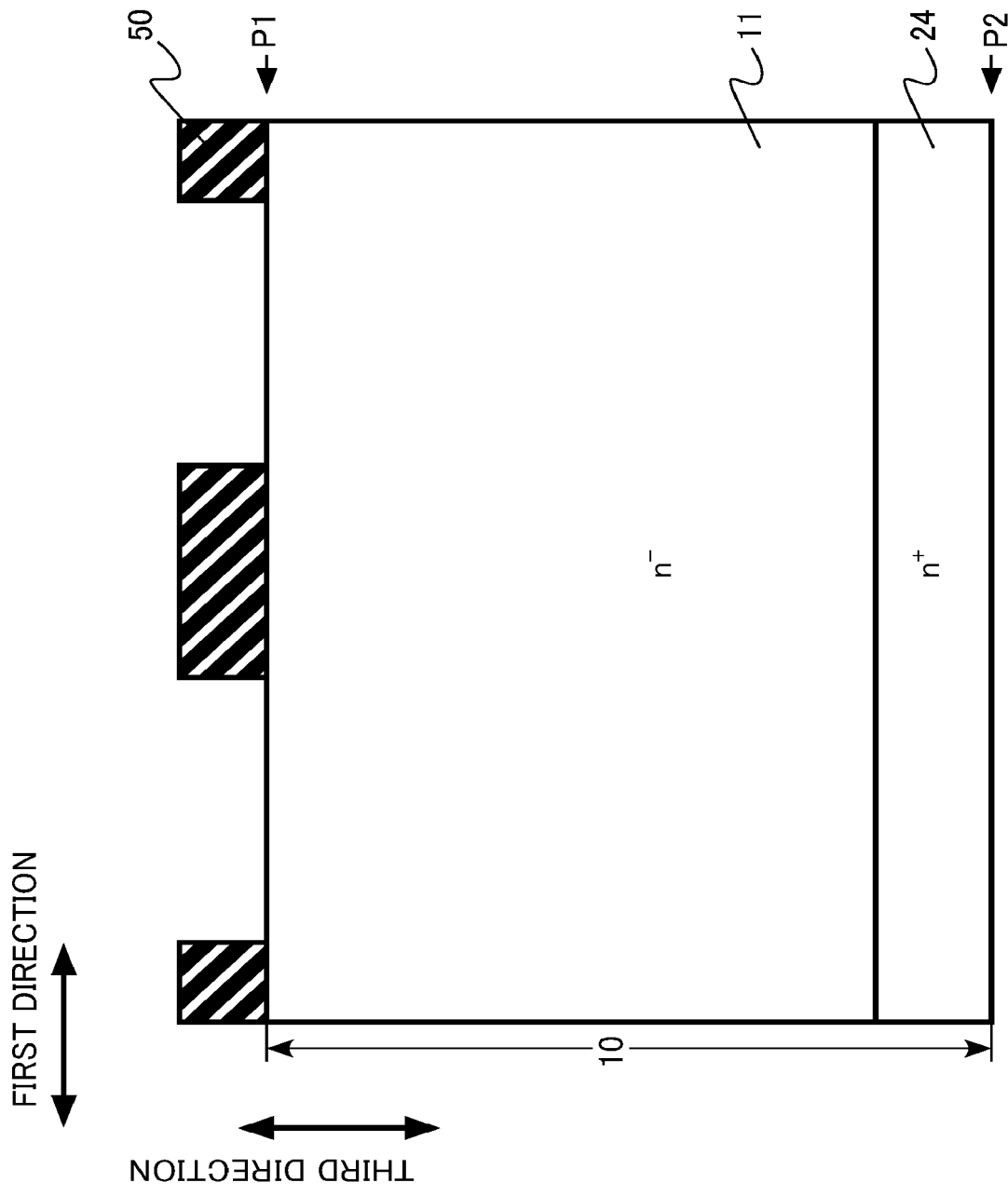
FIG. 10 is a schematic cross-sectional view showing an example of the manufacturing method of the semiconductor device of the first embodiment.

Next, a mask material 50 is formed on the face of the silicon carbide layer 10 (FIGS. 9 and 10). The mask material 50 has an opening 70. The mask material 50 is formed by, for example, depositing a film by a chemical vapor deposition method (CVD method), a lithography method, and patterning a film using a reactive ion etching method (RIE method). The mask material 50 is, for example, a silicon oxide film.

Figure 11:
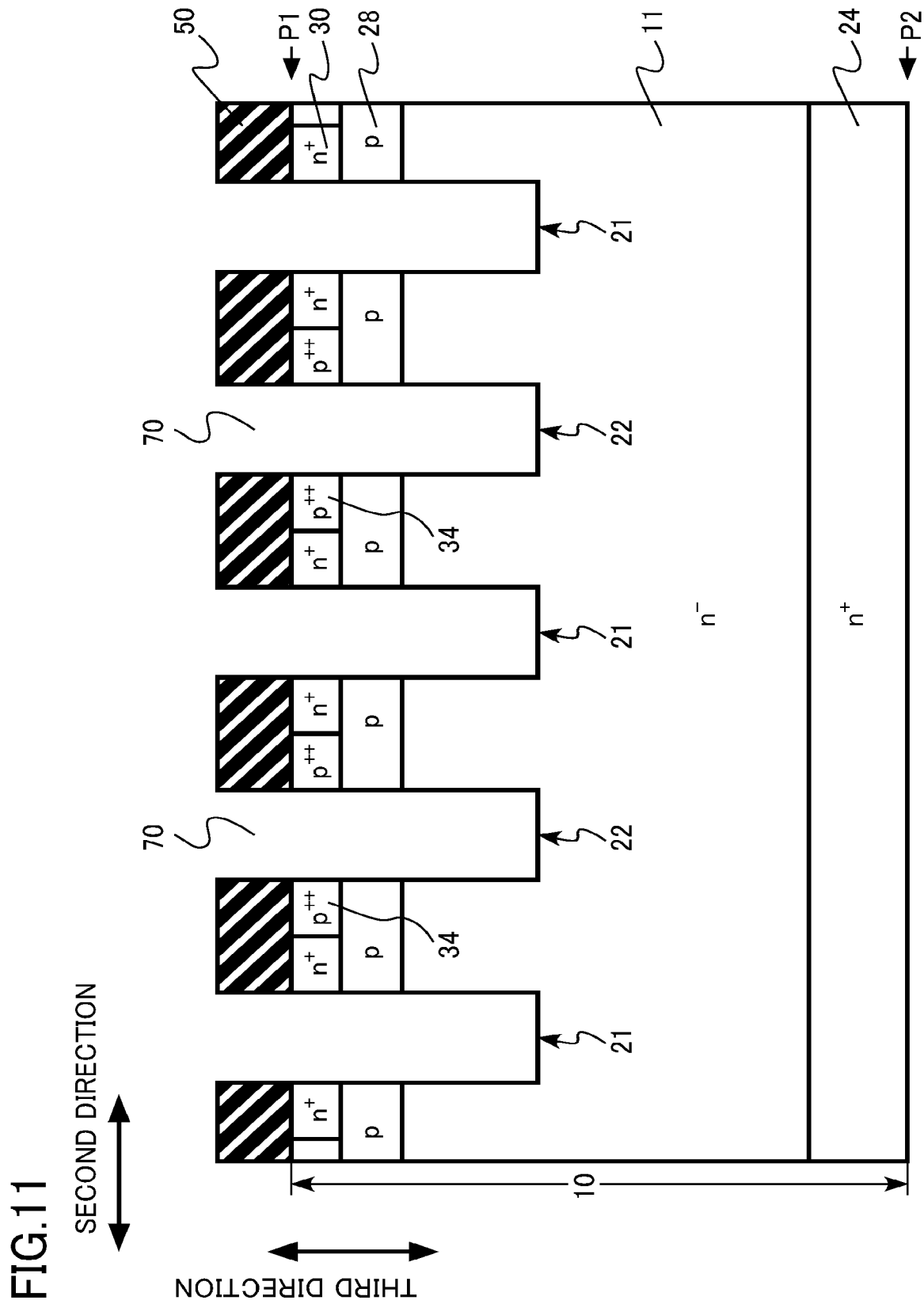
FIG. 11 is a schematic cross-sectional view showing an example of the manufacturing method of the semiconductor device of the first embodiment.
Figure 12:
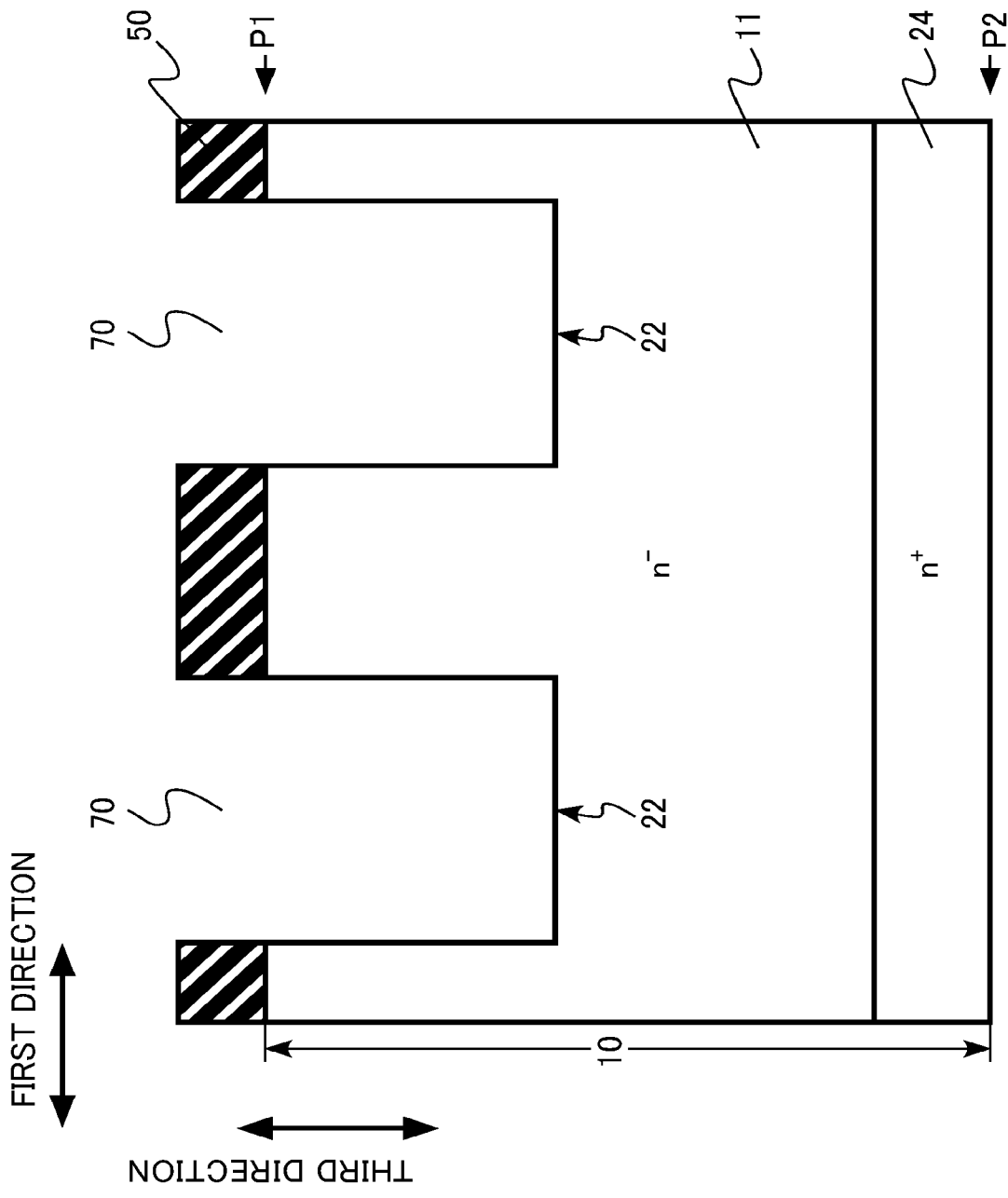
FIG. 12 is a schematic cross-sectional view showing an example of the manufacturing method of the semiconductor device of the first embodiment.

Next, using the mask material 50 as a mask, the gate trench 21 and the contact trench 22 are formed (FIGS. 11 and 12). The gate trench 21 and the contact trench 22 are formed by using the RIE method. The gate trench 21 and the contact trench 22 are formed so as to penetrate the source region 30 and the body region 28. The gate trench 21 and the contact trench 22 are formed in the silicon carbide layer 10 under the opening 70 of the mask material 50.

Figure 13:
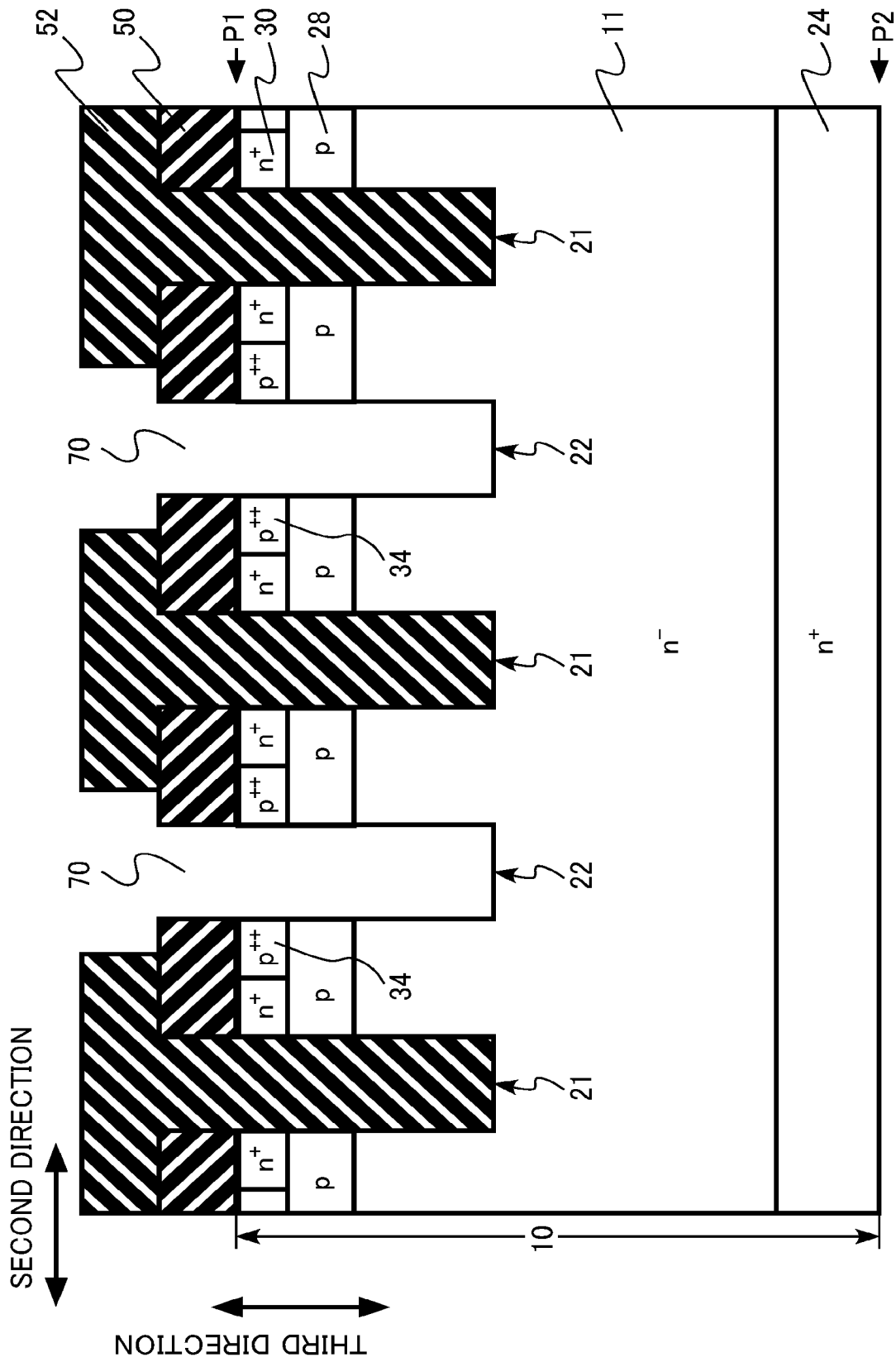
FIG. 13 is a schematic cross-sectional view showing an example of the manufacturing method of the semiconductor device of the first embodiment.
Figure 14:
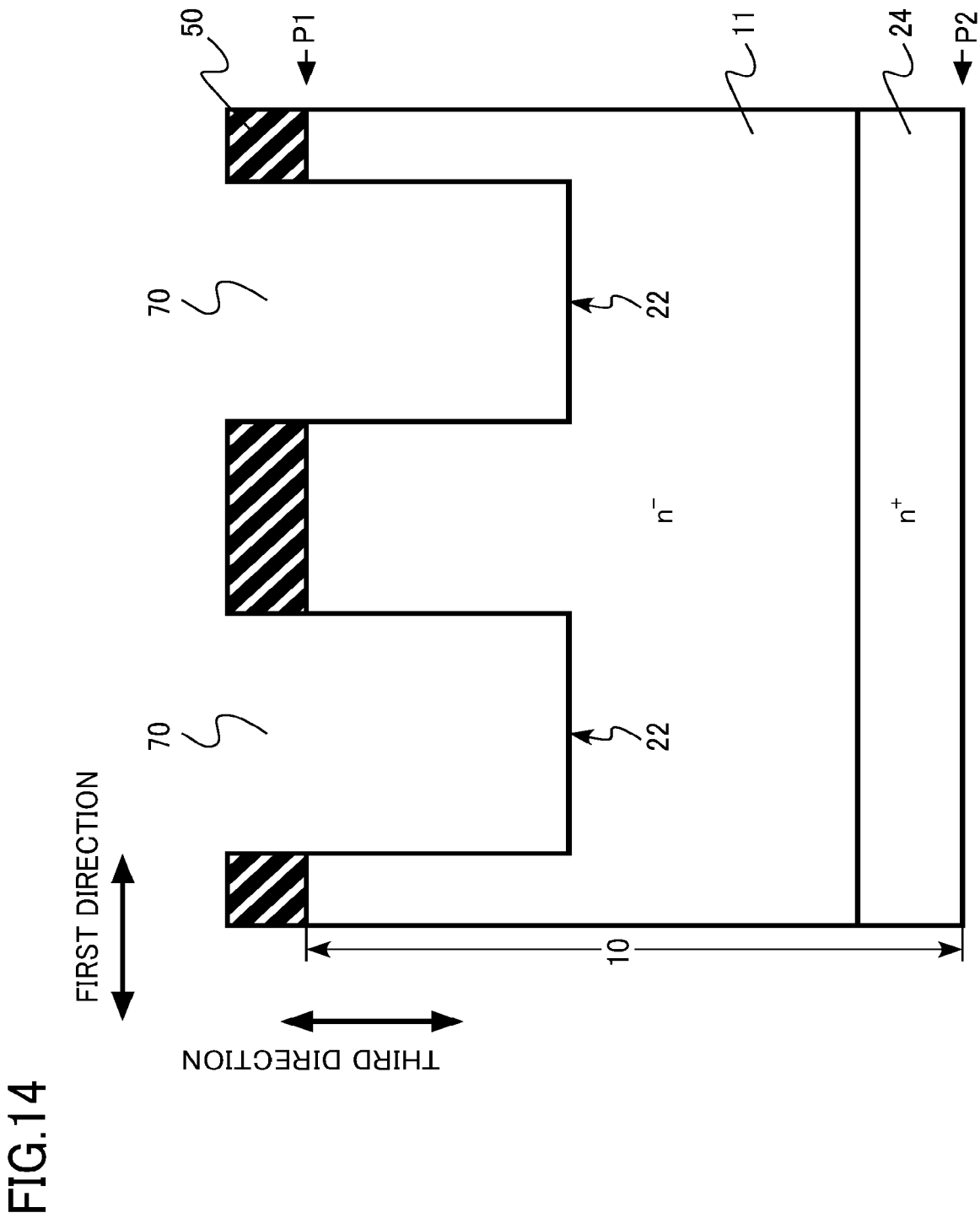
FIG. 14 is a schematic cross-sectional view showing an example of the manufacturing method of the semiconductor device of the first embodiment.

Next, a mask material 52 is formed on the silicon carbide layer 10 (FIGS. 13 and 14). The mask material 52 covers the mask material 50 and the gate trench 21. The mask material 52 does not cover the contact trench 22. The mask material 52 is a photoresist, for example.

Figure 15:
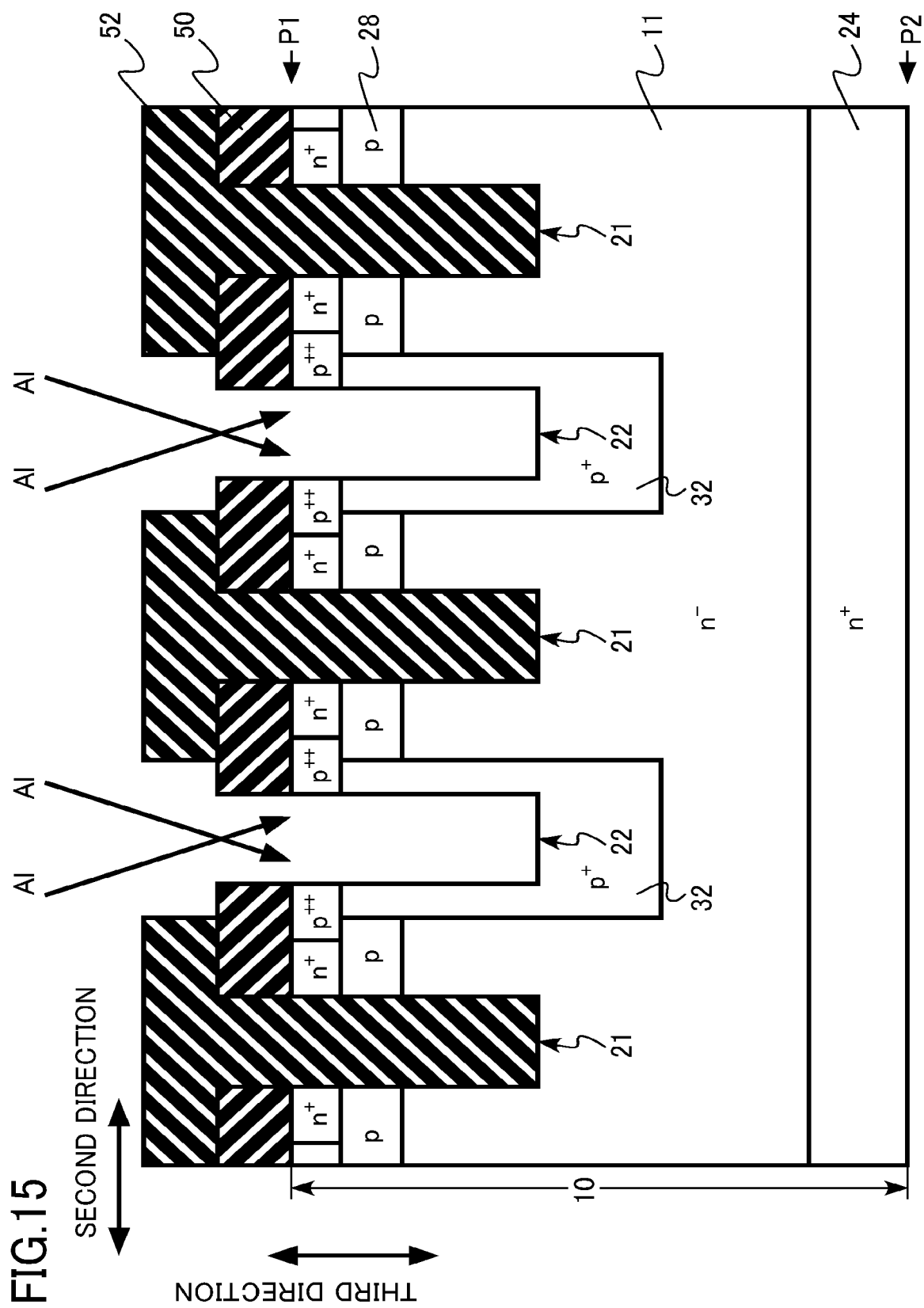
FIG. 15 is a schematic cross-sectional view showing an example of the manufacturing method of the semiconductor device of the first embodiment.
Figure 16:
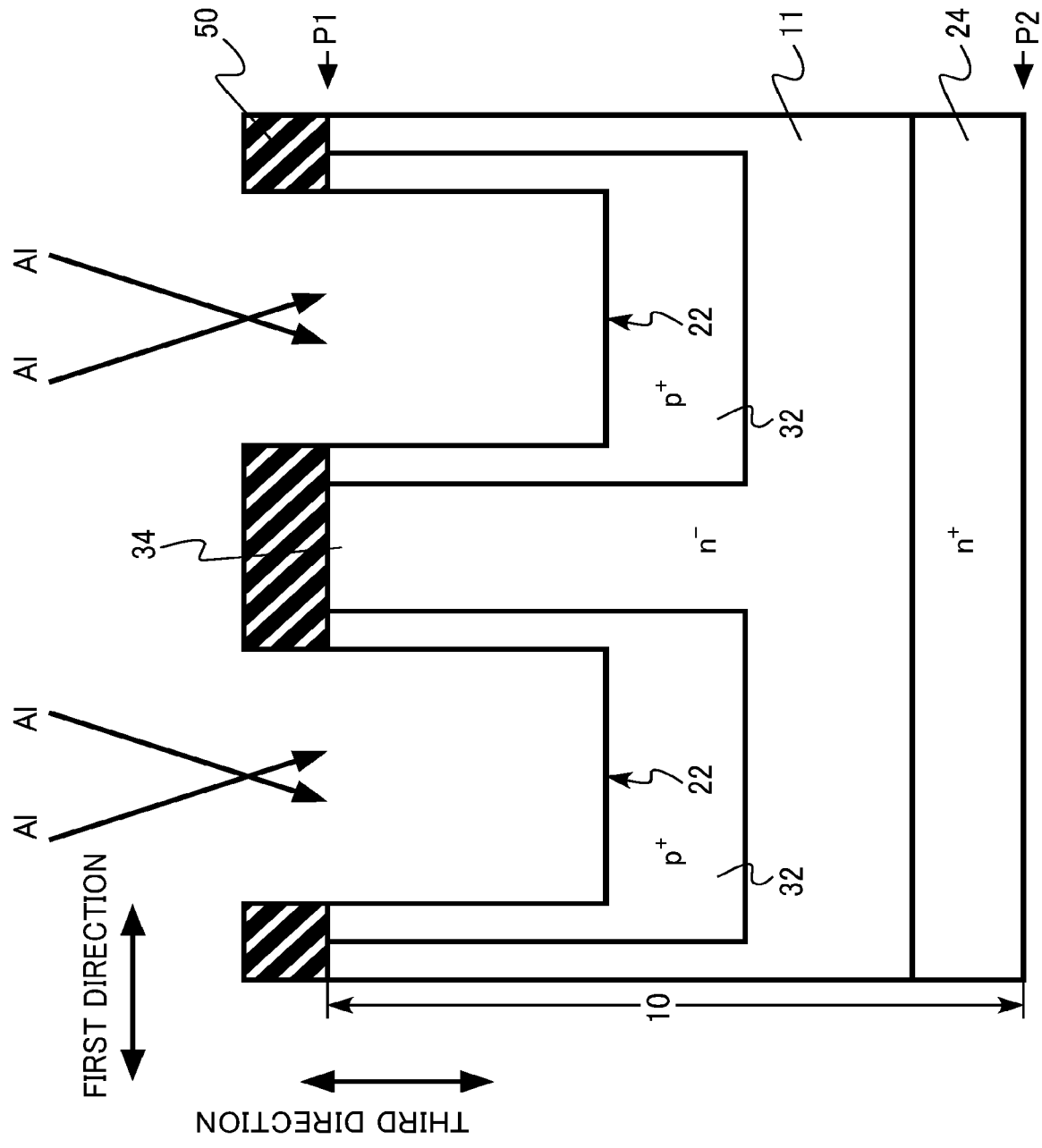
FIG. 16 is a schematic cross-sectional view showing an example of the manufacturing method of the semiconductor device of the first embodiment.

Next, the electric field relaxation region of p$^+$ type 32 is formed (FIGS. 15 and 16). The electric field relaxation region 32 is formed by injecting a p type impurity into the contact trench 22 by the oblique ion implantation method using the mask material 52 and the mask material 50 as a mask. The p type impurity is an aluminum ion, for example. The electric field relaxation region 32 is formed in the vicinity of the side face and the bottom face of the contact trench 22 of the silicon carbide layer 10.

Next, the mask material 52 is peeled off. Next, a mask material 53 is formed on the silicon carbide layer 10. The mask material 53 covers the mask material 50 and the contact trench 22. The mask material 53 does not cover the gate trench 21. The mask material 53 is a photoresist, for example.

Figure 17:
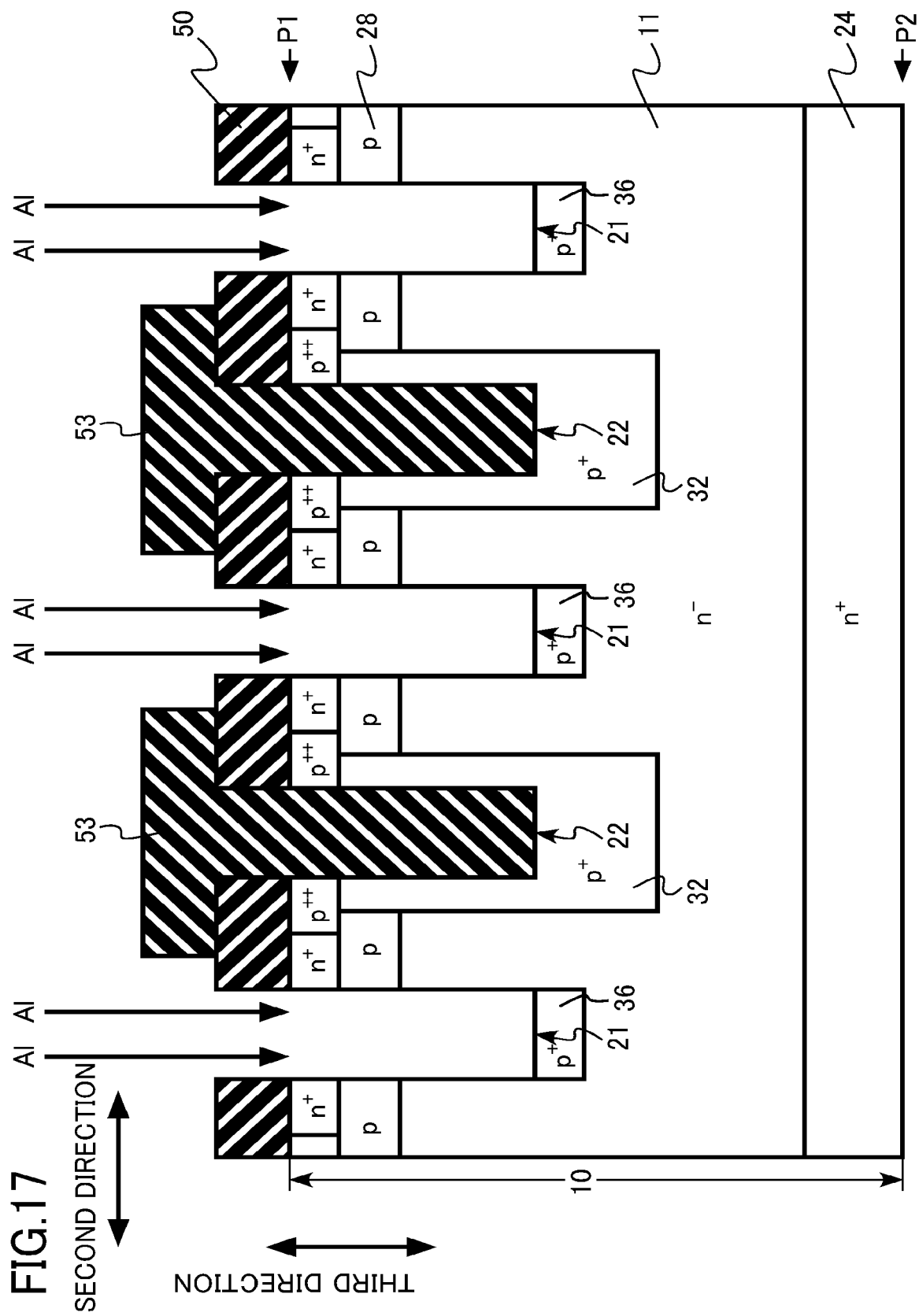
FIG. 17 is a schematic cross-sectional view showing an example of the manufacturing method of the semiconductor device of the first embodiment.
Figure 18:
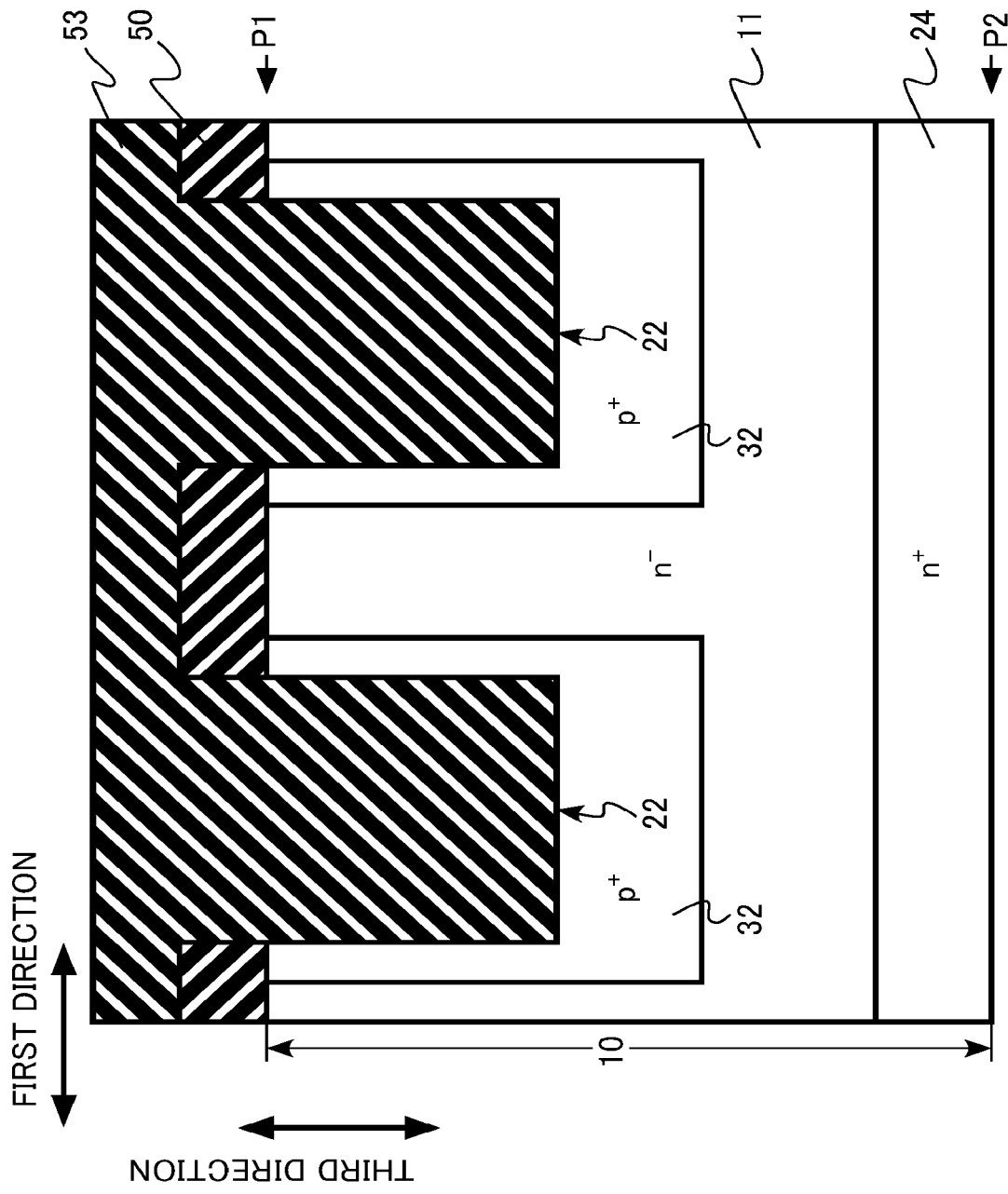
FIG. 18 is a schematic cross-sectional view showing an example of the manufacturing method of the semiconductor device of the first embodiment.

Next, the gate trench bottom region of $p^+$ type 36 is formed (FIGS. 17 and 18). The gate trench bottom region 36 is formed by injecting a p type impurity into the bottom of the gate trench 21 by the ion implantation method using the mask material 53 and the mask material 50 as a mask. The p type impurity is an aluminum ion, for example.

Figure 19:
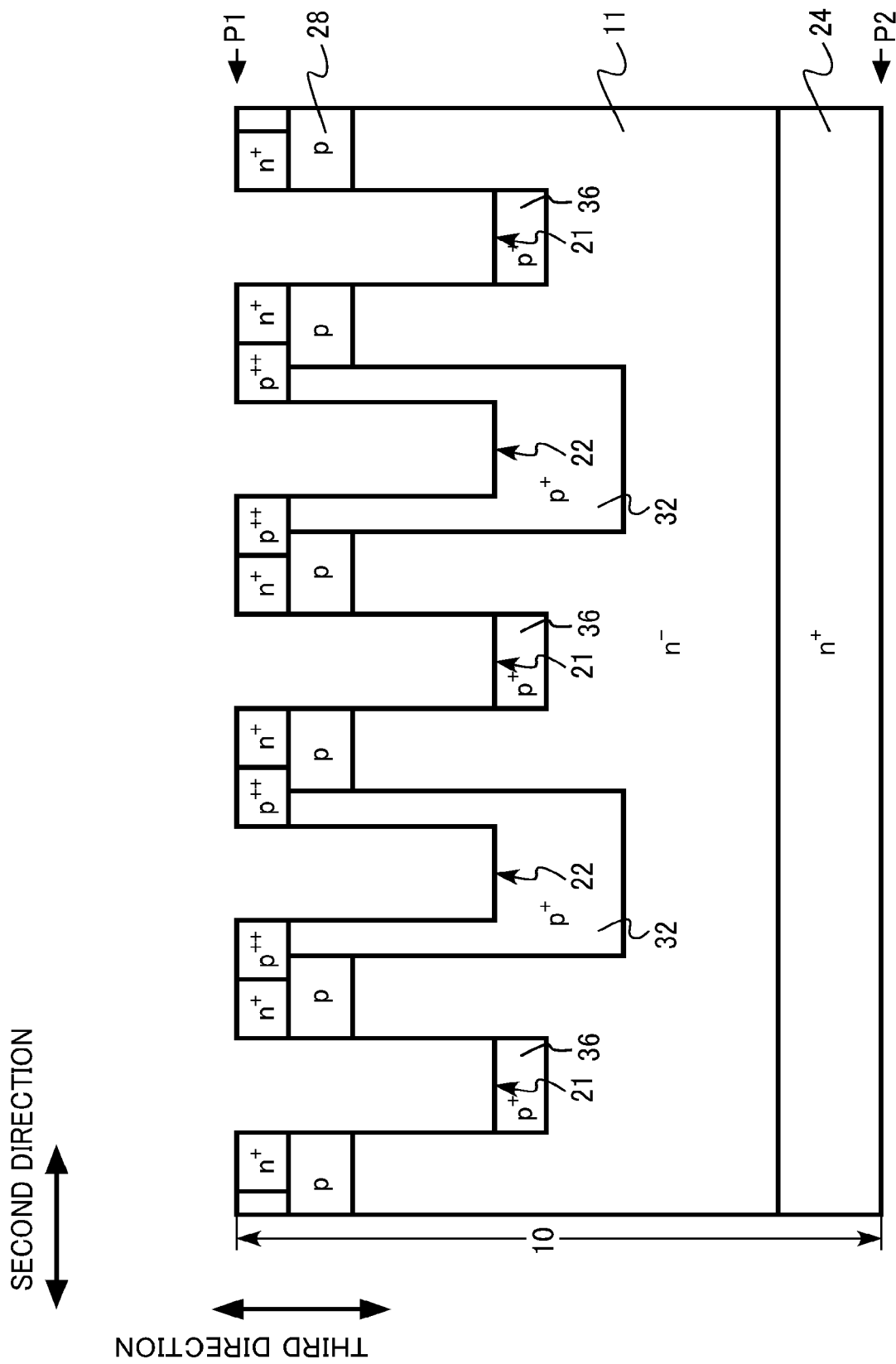
FIG. 19 is a schematic cross-sectional view showing an example of the manufacturing method of the semiconductor device of the first embodiment.
Figure 20:
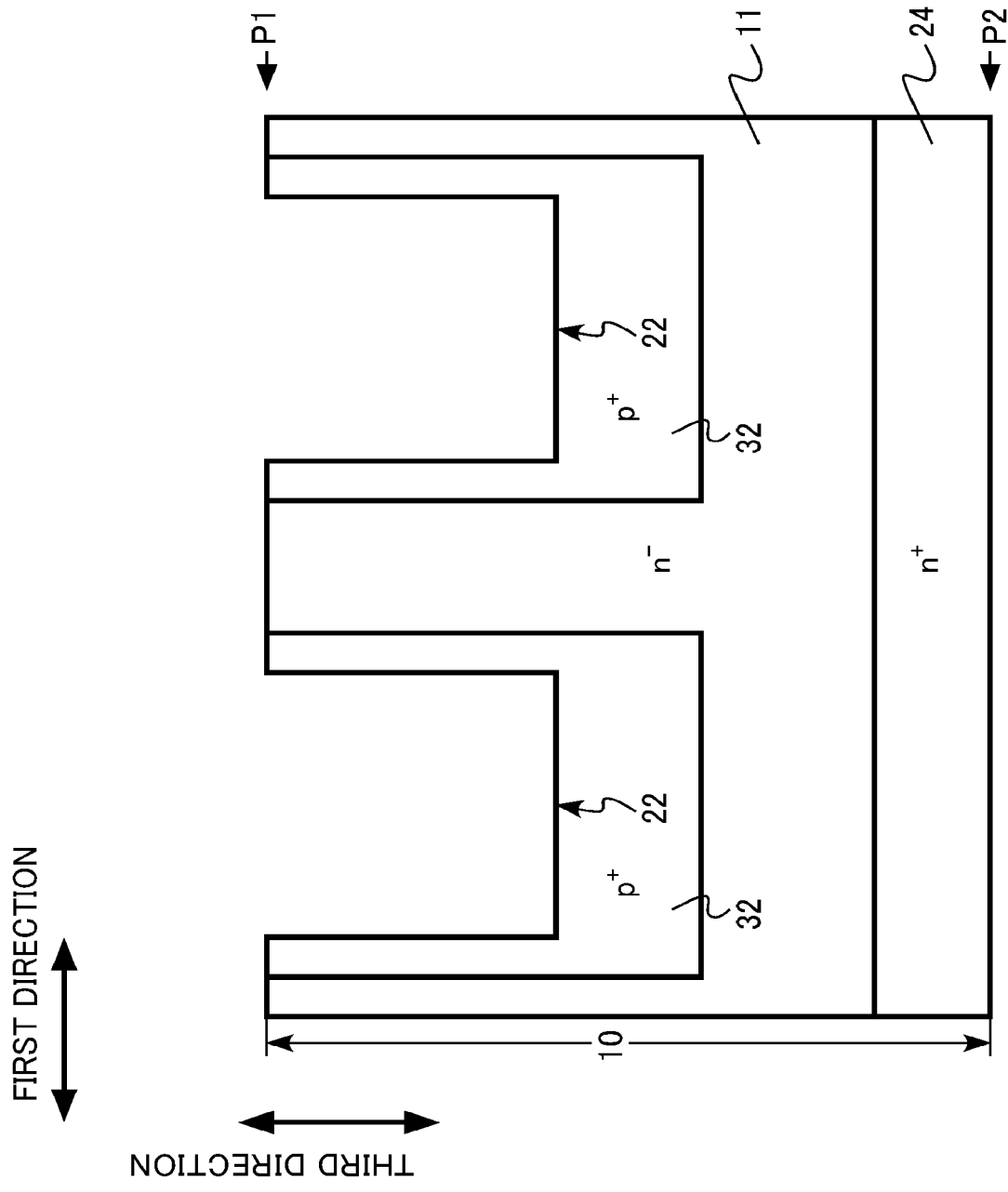
FIG. 20 is a schematic cross-sectional view showing an example of the manufacturing method of the semiconductor device of the first embodiment.

Next, the mask material 53 and the mask material 50 are peeled off (FIGS. 19 and 20). Next, activation annealing of the n type impurity and the p type impurity is performed.

Figure 21:
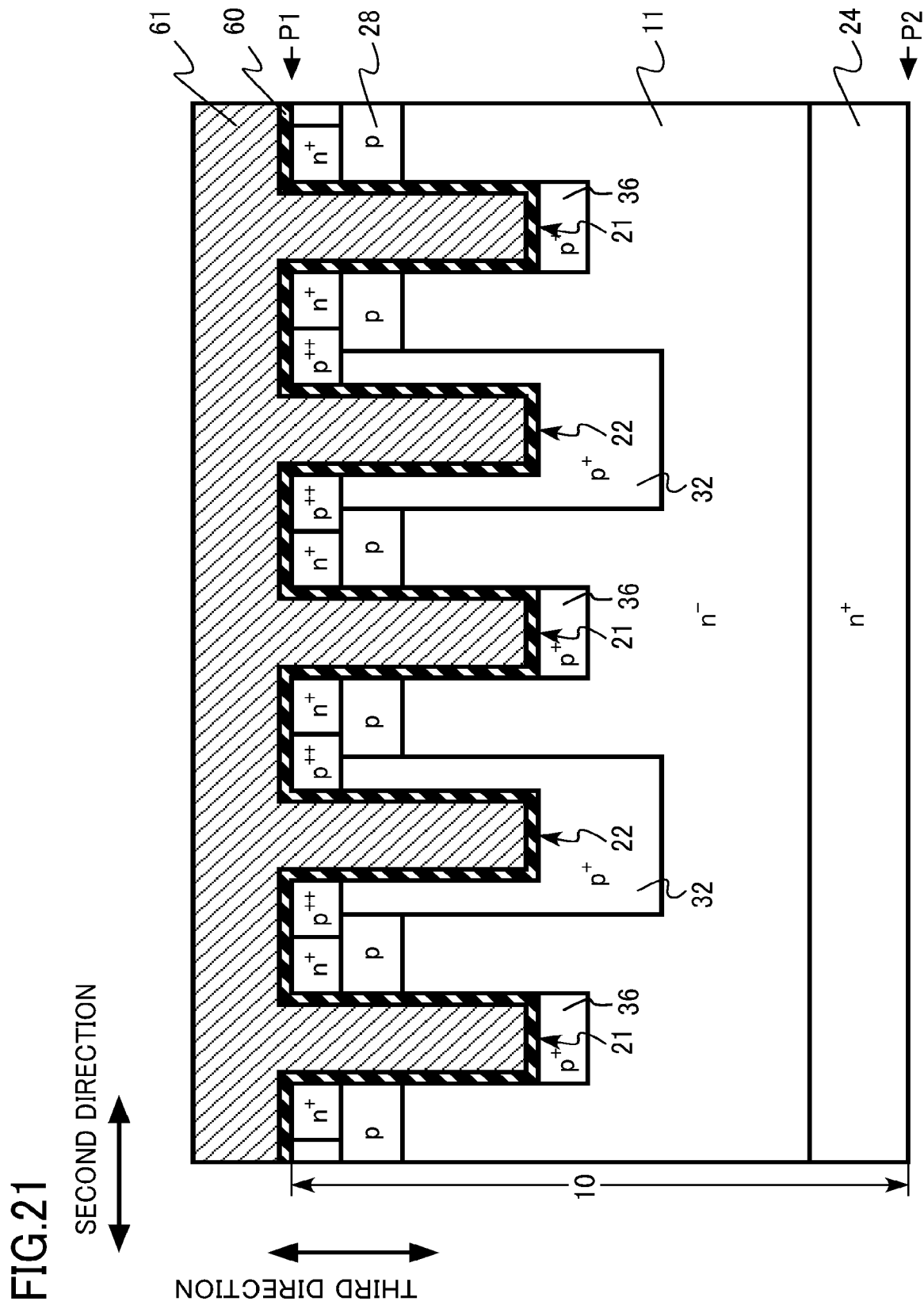
FIG. 21 is a schematic cross-sectional view showing an example of the manufacturing method of the semiconductor device of the first embodiment.
Figure 22:
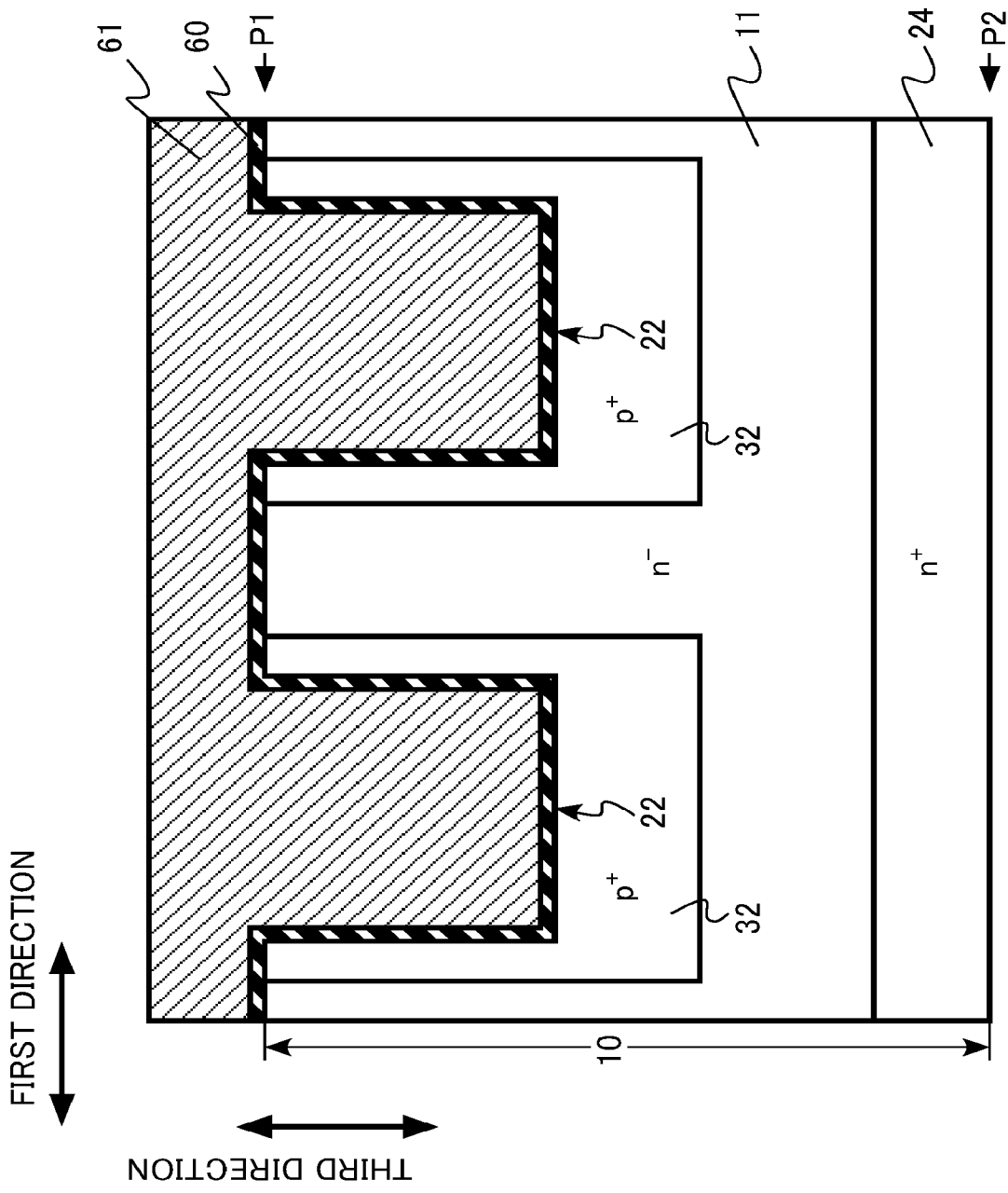
FIG. 22 is a schematic cross-sectional view showing an example of the manufacturing method of the semiconductor device of the first embodiment.

Next, a first silicon oxide film 60 and a polycrystalline silicon film 61 are formed in the gate trench 21 and the contact trench 22 (FIGS. 21 and 22).

The first silicon oxide film 60 and the polycrystalline silicon film 61 are formed by the CVD method, for example. A part of the first silicon oxide film 60 becomes the gate insulating layer 18. A part of the polycrystalline silicon film 61 becomes the gate electrode 16.

Figure 23:
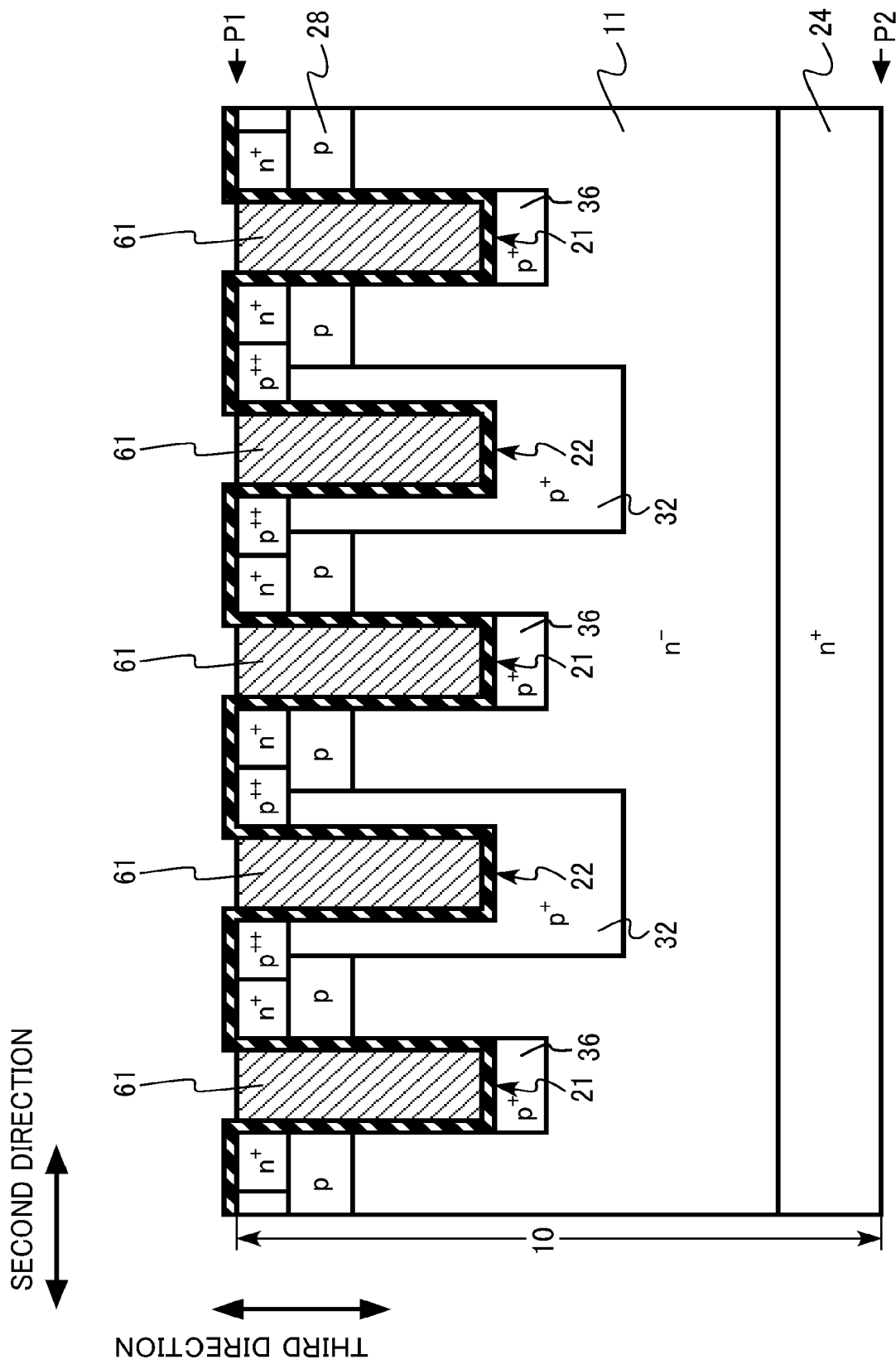
FIG. 23 is a schematic cross-sectional view showing an example of the manufacturing method of the semiconductor device of the first embodiment.
Figure 24:
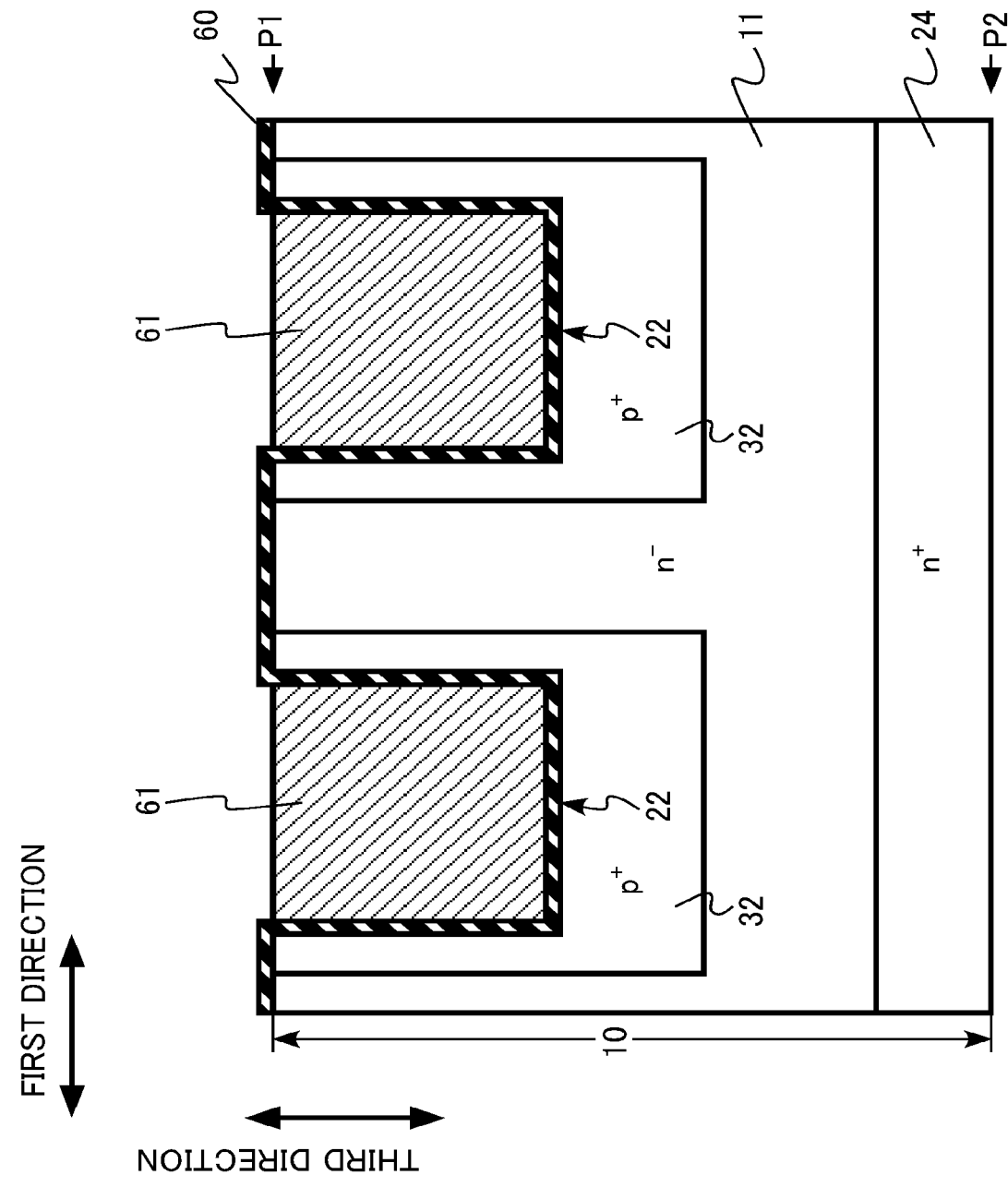
FIG. 24 is a schematic cross-sectional view showing an example of the manufacturing method of the semiconductor device of the first embodiment.

Next, the polycrystalline silicon film 61 on the face of the silicon carbide layer 10 is removed (FIGS. 23 and 24). The polycrystalline silicon film 61 on the face of the silicon carbide layer 10 is removed by a dry etching method, for example. A part of the polycrystalline silicon film 61 remains in the gate trench 21 and the contact trench 22.

Next, a mask material 54 is formed on the face of the silicon carbide layer 10. The mask material 54 is a photoresist, for example.

The mask material 54 covers the gate trench 21. The mask material 54 covers the polycrystalline silicon film 61 in the gate trench 21.

Figure 25:
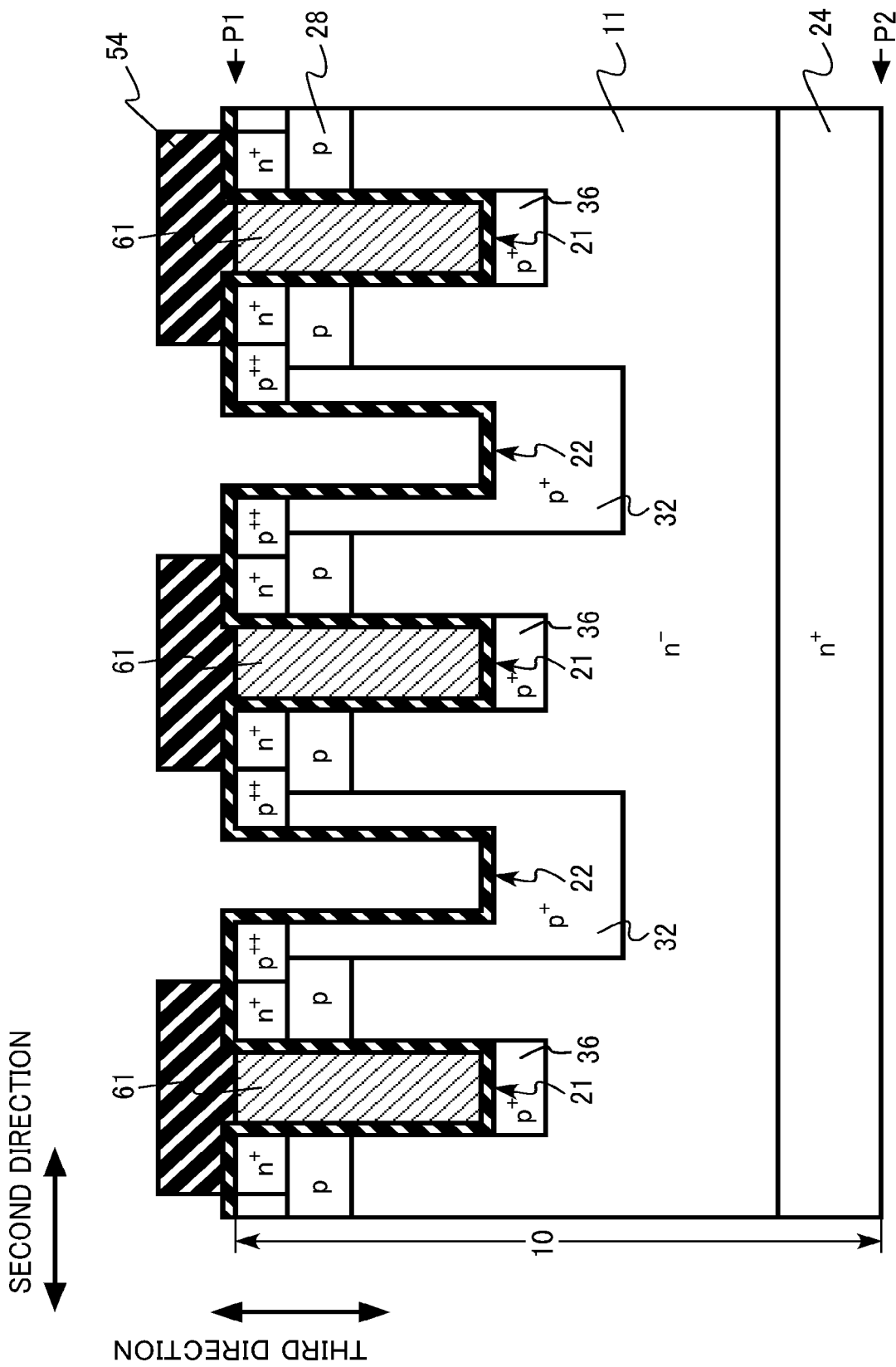
FIG. 25 is a schematic cross-sectional view showing an example of the manufacturing method of the semiconductor device of the first embodiment.
Figure 26:
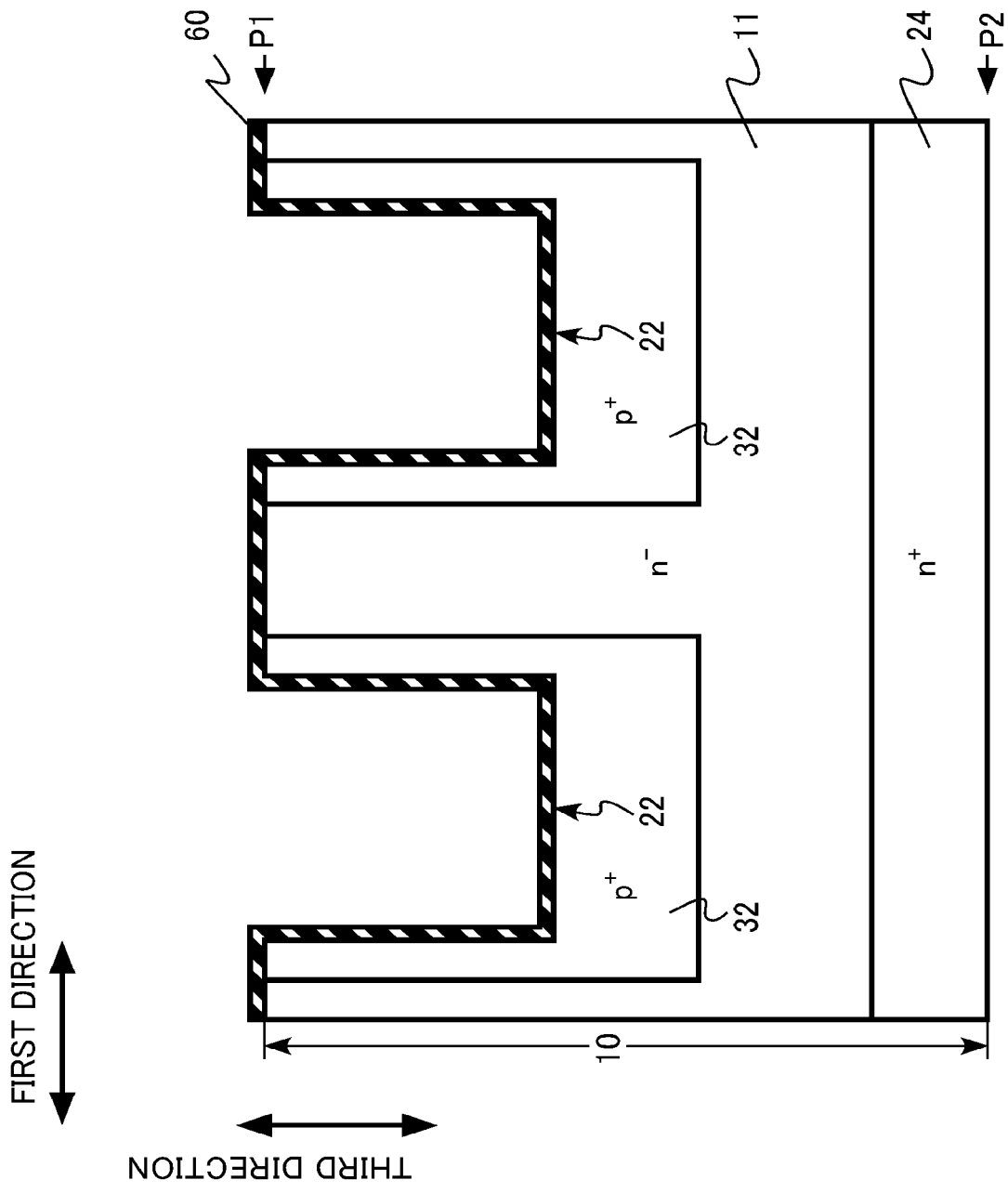
FIG. 26 is a schematic cross-sectional view showing an example of the manufacturing method of the semiconductor device of the first embodiment.

Next, using the mask material 54 as a mask, the polycrystalline silicon film 61 in the contact trench 22 is removed (FIGS. 25 and 26). The polycrystalline silicon film 61 is removed by a dry etching method, for example.

Figure 27:
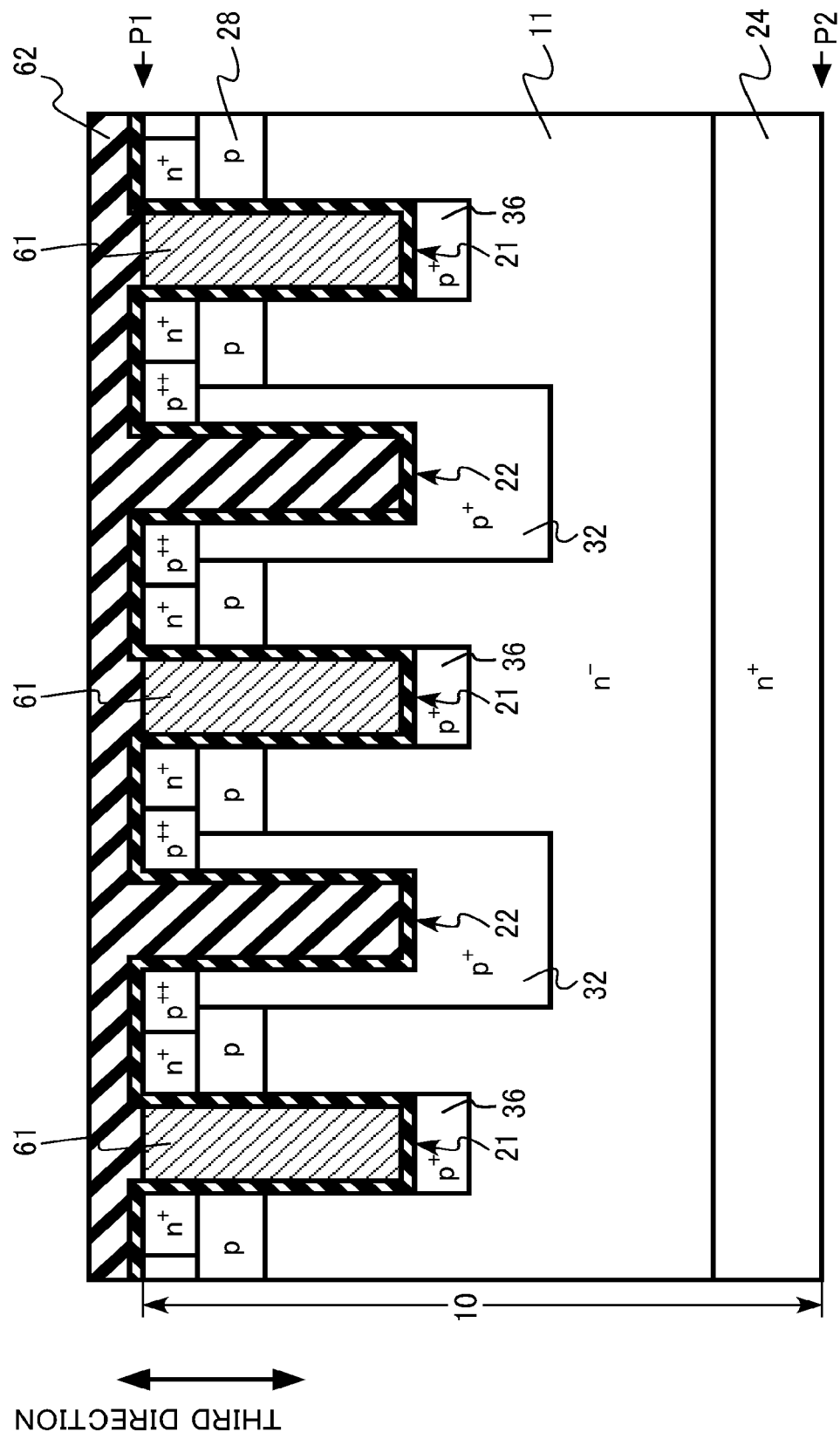
FIG. 27 is a schematic cross-sectional view showing an example of the manufacturing method of the semiconductor device of the first embodiment.
Figure 28:
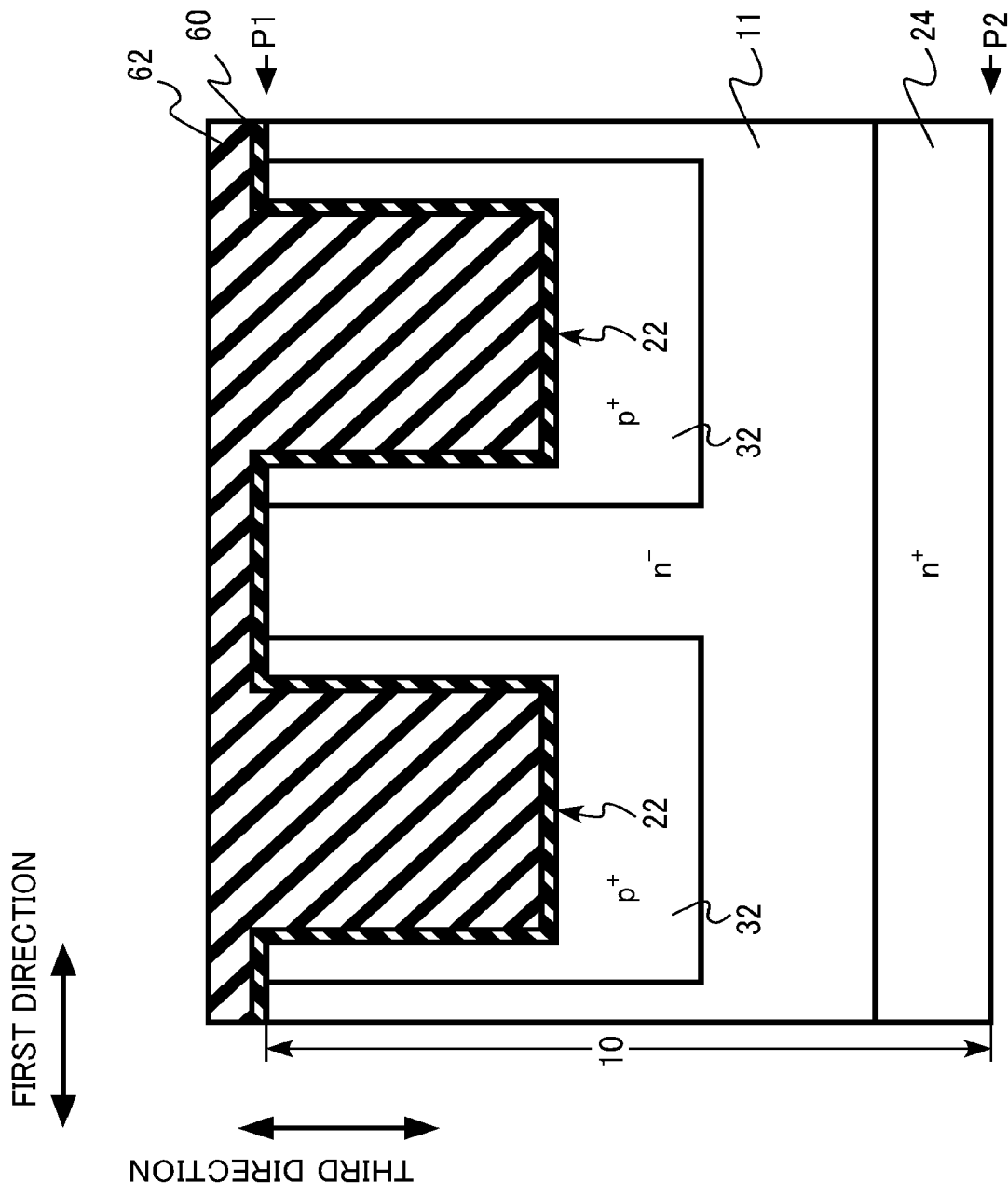
FIG. 28 is a schematic cross-sectional view showing an example of the manufacturing method of the semiconductor device of the first embodiment.

Next, the mask material 54 is removed. Next, a second silicon oxide film 62 is formed on the first silicon oxide film 60 and the polycrystalline silicon film 61 (FIG. 27 and FIG. 28). The second silicon oxide film 62 is formed by the CVD method, for example. A part of the second silicon oxide film 62 becomes the interlayer insulating layer 20.

Next, a mask material 56 is formed on the second silicon oxide film 62. The mask material 56 is a photoresist, for example.

The mask material 56 covers the second silicon oxide film 62 on the gate trench 21. The mask material 56 covers the second silicon oxide film 62 between the contact trenches 22 adjacent to each other in the first direction.

Figure 29:
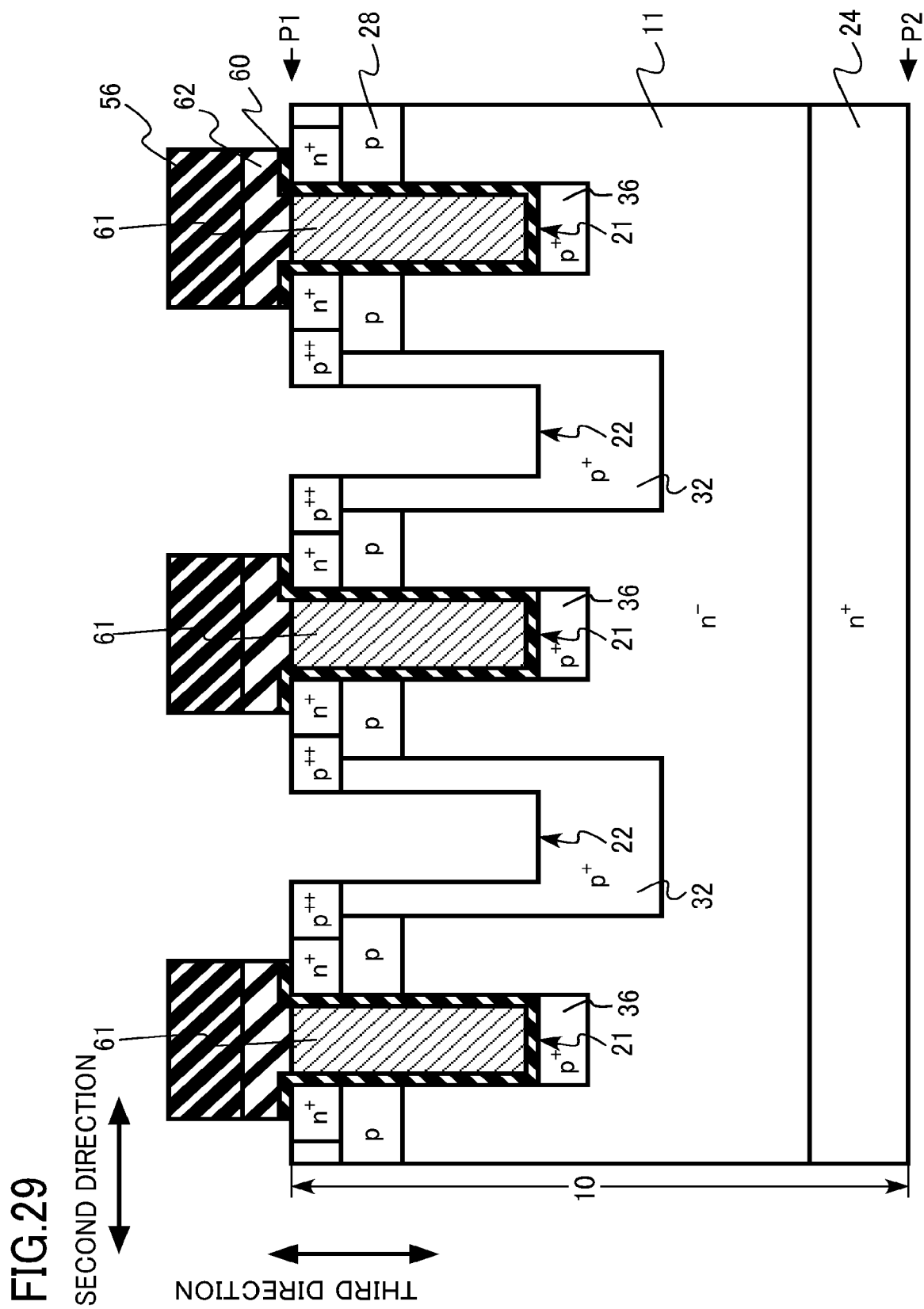
FIG. 29 is a schematic cross-sectional view showing an example of the manufacturing method of the semiconductor device of the first embodiment.
Figure 30:
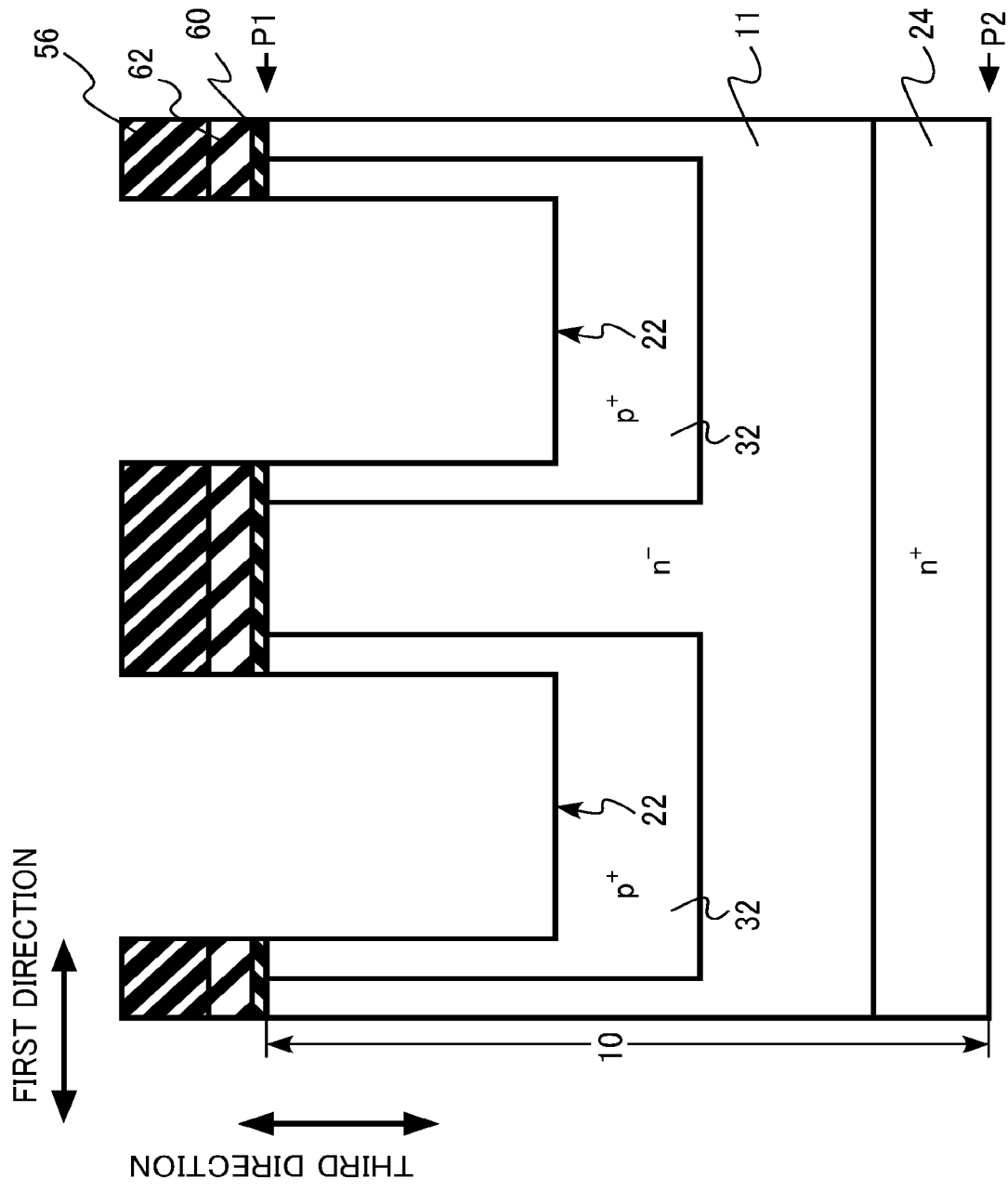
FIG. 30 is a schematic cross-sectional view showing an example of the manufacturing method of the semiconductor device of the first embodiment.

Next, using the mask material 56 as a mask, the first silicon oxide film 60 and the second silicon oxide film 62 in the contact trench 22 are removed (FIGS. 29 and 30). The first silicon oxide film 60 and the second silicon oxide film 62 are removed by a wet etching method, for example.

Figure 31:
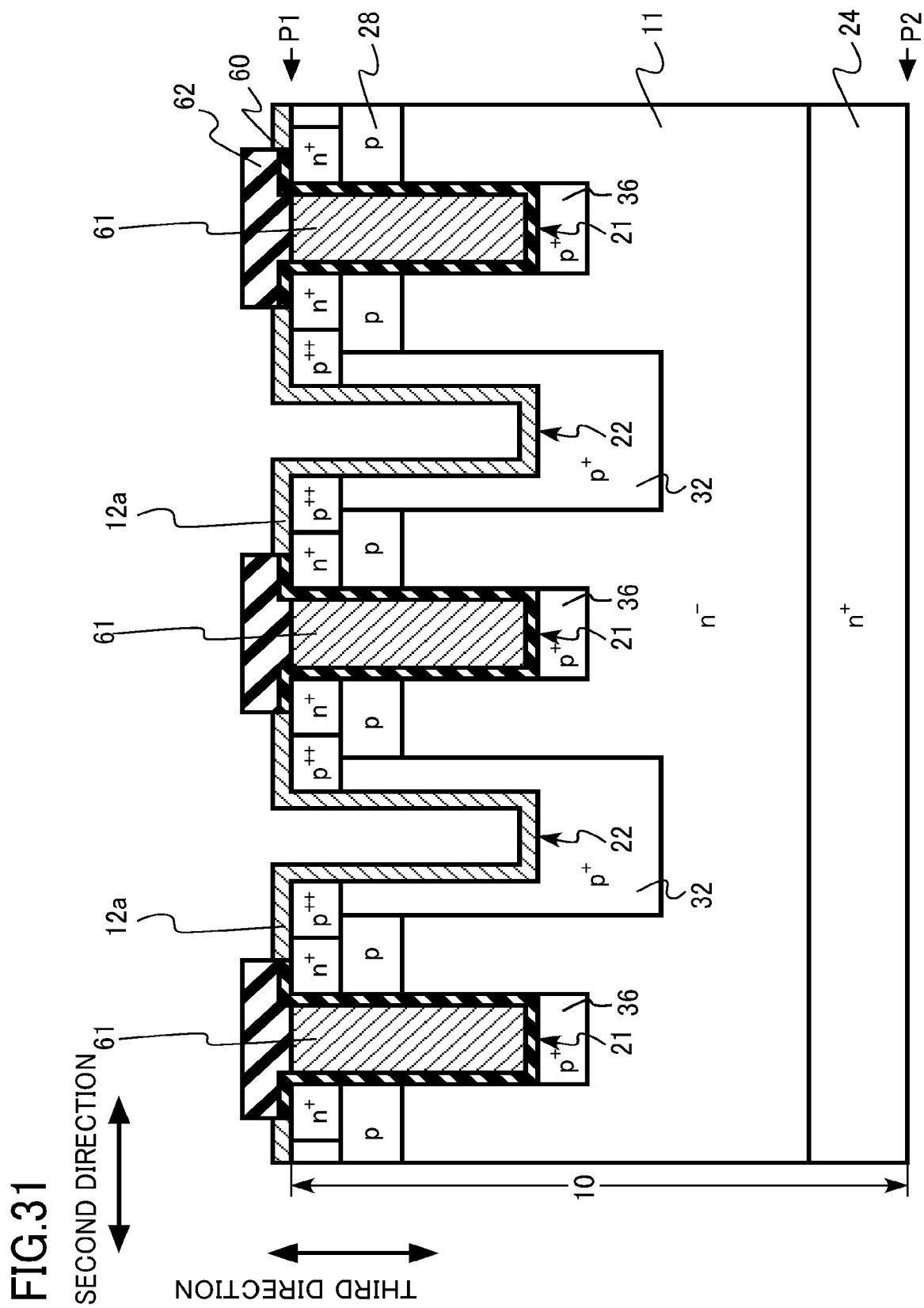
FIG. 31 is a schematic cross-sectional view showing an example of the manufacturing method of the semiconductor device of the first embodiment.
Figure 32:
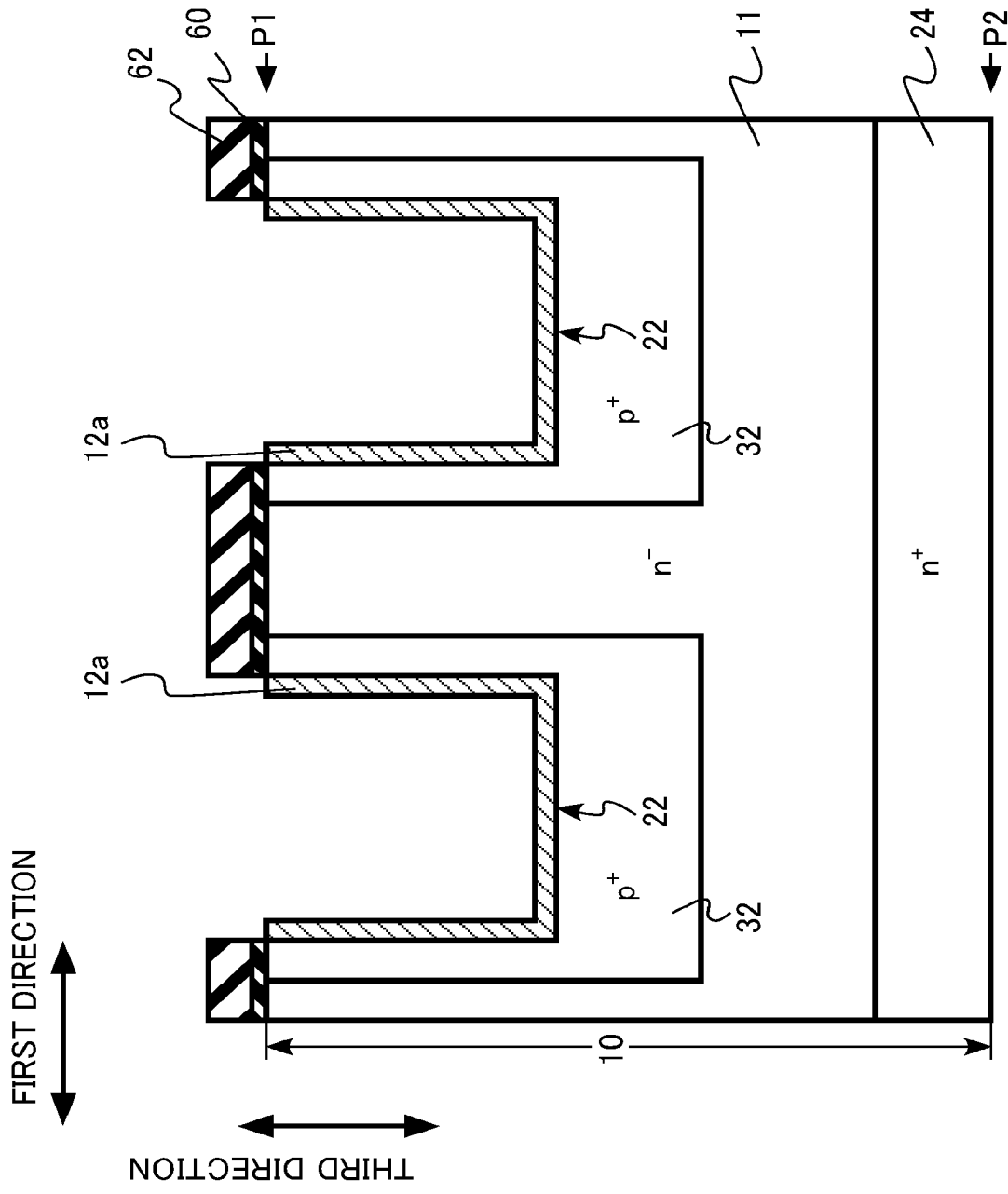
FIG. 32 is a schematic cross-sectional view showing an example of the manufacturing method of the semiconductor device of the first embodiment.

Next, the mask material 56 is removed. The silicide region 12a is formed on the first face P1 and in the contact trench 22 (FIGS. 31 and 32). For example, the silicide region 12a is formed by deposition of a metal film by the CVD method and heat treatment for forming a metal silicide by causing the metal film with the silicon carbide layer 10 to react.

Figure 33:
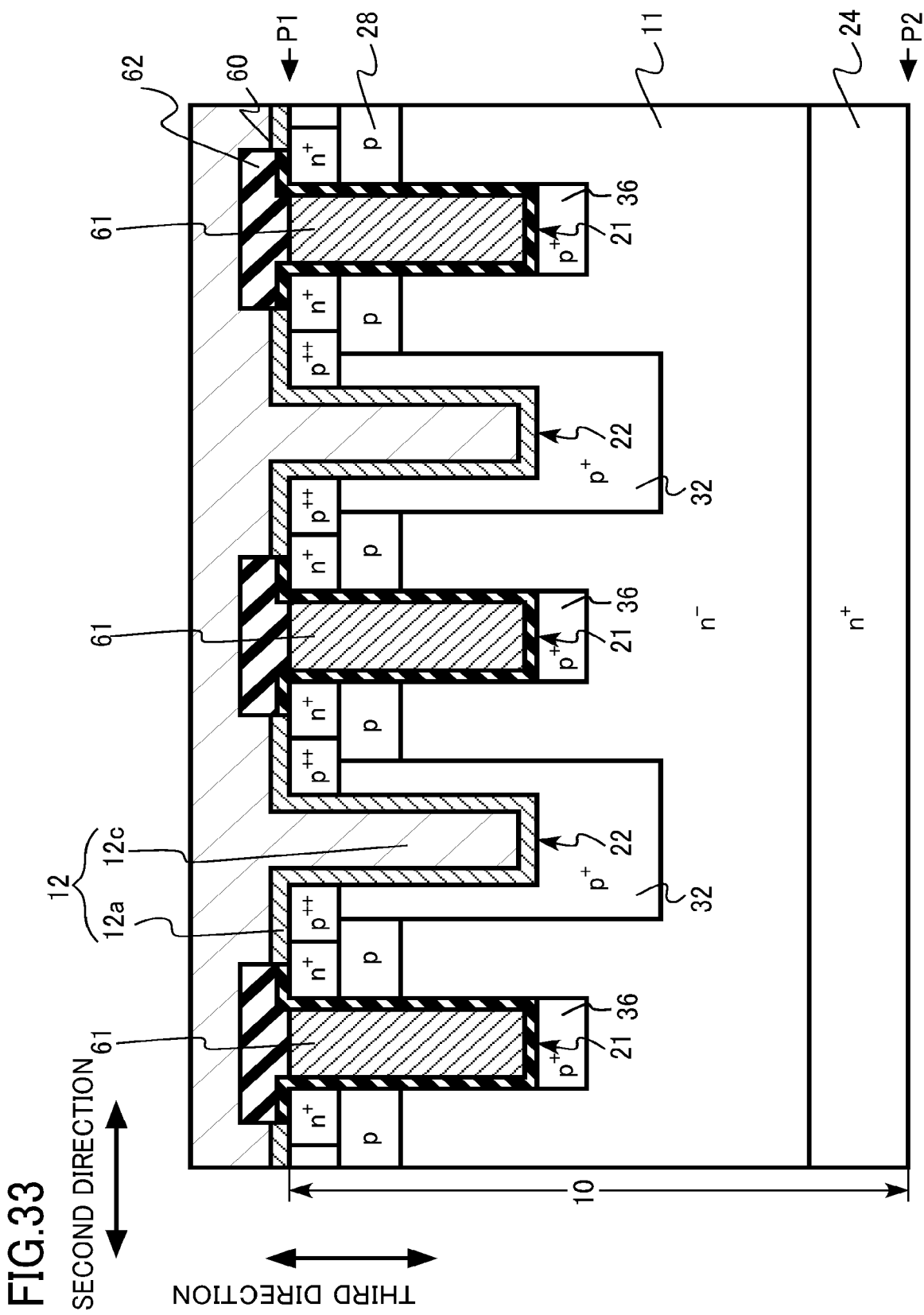
FIG. 33 is a schematic cross-sectional view showing an example of the manufacturing method of the semiconductor device of the first embodiment.
Figure 34:
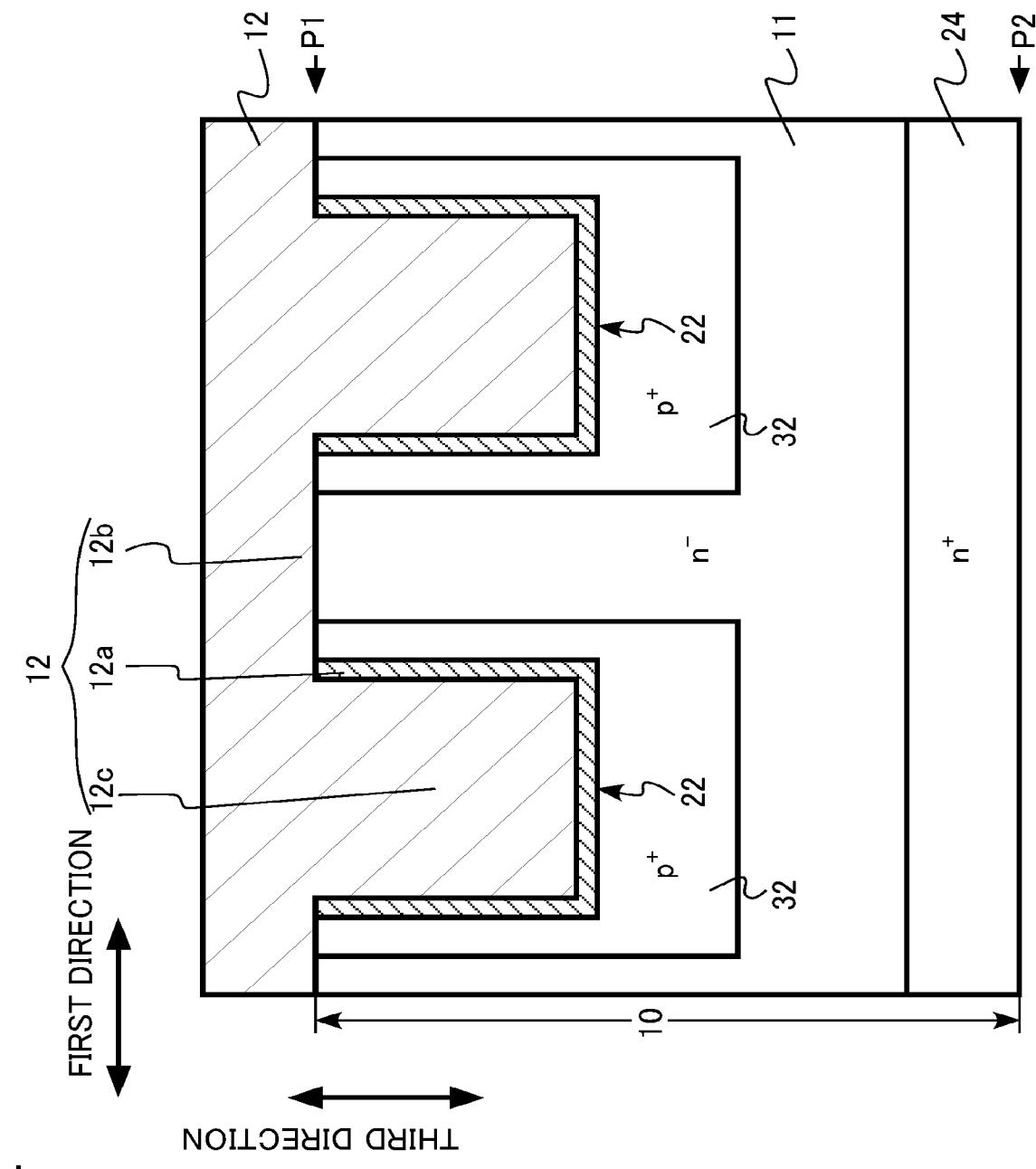
FIG. 34 is a schematic cross-sectional view showing an example of the manufacturing method of the semiconductor device of the first embodiment.

Next, the first silicon oxide film 60 and the second silicon oxide film 62 between the two contact trenches 22 are removed. Next, a metal film is deposited in the contact trench 22, on the silicide region 12a, on the epitaxial layer 11, and on the second silicon oxide film 62. The source electrode 12 is formed by deposition of the metal film (FIGS. 33 and 34). The metal film is formed by the CVD method, for example.

Thereafter, the drain electrode 14 is formed on the back face of the silicon carbide layer 10 using a known process technique.

By the above-described manufacturing method, the MOSFET 100 shown in FIGS. 1 to 4 is manufactured.

Next, the functions and effects of the semiconductor device of the first embodiment will be described.

A trench gate structure in which the gate electrode 16 is provided in the gate trench 21 is applied to the MOSFET 100. By applying the trench gate structure, the channel area per unit area increases, and the on-resistance of the MOSFET 100 is reduced.

In the MOSFET 100, the embedded region 12c, which is a part of the source electrode 12, is provided in the contact trench 22. The MOSFET 100 is a MOSFET having a so-called double trench structure.

By providing the embedded region 12c in the contact trench 22, electrical connection to the body region 28 can be made on the side face of the contact trench 22. This can reduce the connection area of the source electrode 12 on the face of the silicon carbide layer 10. Therefore, the channel area per unit area increases, and the on-resistance of the MOSFET 100 is reduced.

The MOSFET 100 includes the electric field relaxation region 32 around the bottom face and the side face of the contact trench 22. Therefore, the electric field strength applied to the gate insulating layer 18 is relaxed at the time of the off operation of the MOSFET 100. This improves the reliability of the gate insulating layer 18.

The MOSFET 100 includes the gate trench bottom region 36 on the bottom face of the gate trench 21. Therefore, the electric field strength applied to the gate insulating layer 18 is relaxed at the time of the off operation of the MOSFET 100. This improves the reliability of the gate insulating layer 18.

A vertical MOSFET has a pn junction diode as a parasitic built-in diode. For example, the MOSFET 100 of the first embodiment has a parasitic built-in diode including a pn junction between the body region 28 and the drift region 26, and a pn junction between the electric field relaxation region 32 and the drift region 26.

The MOSFET is used as a switching device connected to an inductive load. In this case, even at the time of the off operation of the MOSFET, use of a pn junction diode makes it possible to apply a reflux current.

However, when a reflux current is applied using a pn junction diode, a stacking defect grows in the silicon carbide layer due to the recombination energy of carrier. Therefore, the on-resistance of the MOSFET is liable to increase. The increase in the on-resistance of the MOSFET causes a decrease in the reliability of the MOSFET.

The MOSFET 100 of the first embodiment includes, as a built-in diode, an SBD in which the source electrode 12 is connected to the drift region 26 by Schottky contact. The Schottky region 12b serves as an anode of the SBD, and the drift region 26 serves as a cathode of the SBD.

The forward voltage at which current starts to flow through the SBD at the time of forward bias is lower than the forward voltage at which current starts to flow through the pn junction diode at the time of forward bias. Therefore, in the MOSFET 100, if forward bias is applied to the SBD and the pn junction diode, current starts to flow through the SBD first.

Thereafter, as the forward bias voltage is increased, current starts to also flow through the pn junction diode. The voltage at which the current starts to flow through the pn junction diode is hereinafter referred to as the clamp voltage.

The SBD performs a unipolar operation. Therefore, even if a reflux current is applied, a stacking defect does not grow in the silicon carbide layer 10 due to the recombination energy of carrier. This improves the reliability of the MOSFET 100.

The SBD has a higher leakage current at the time of reverse bias than the pn junction diode has. Therefore, the MOSFET having a built-in SBD is liable to have an occurrence of an increase in power consumption.

In the MOSFET 100 of the first embodiment, the drift region 26 in the portion in contact with the Schottky region 12b is interposed between the two electric field relaxation regions 32 adjacent to each other in the first direction. At the time of reverse bias of the SBD, a depletion layer extends to the drift region 26 from the two electric field relaxation regions 32 interposing the drift region 26. For example, the depletion layer extends from the electric field relaxation region 32a and the electric field relaxation region 32b to the drift region 26. Then, for example, the interface between the Schottky region 12b and the drift region 26 is covered with the depletion layer.

This relaxes the electric field strength applied to the Schottky interface of the SBD at the time of reverse bias of the SBD. Therefore, the leakage current at the time of reverse bias of the SBD is suppressed. Therefore, an increase in power consumption of the MOSFET 100 is suppressed.

The distance between the two contact trenches 22 adjacent to each other in the first direction is preferably larger than, for example, the length of the contact trench 22 in the first direction. For example, the distance between the contact trench 22a and the contact trench 22b (d in FIG. 2) is preferably larger than the length of the contact trench 22a in the first direction (L1 in FIG. 2). The distance between the two contact trenches 22 adjacent to each other in the first direction is preferably equal to or more than 1.2 times the length of the contact trench 22 in the first direction. The distance between the two contact trenches 22 adjacent to each other in the first direction is preferably larger than, for example, the length of the contact trench 22 in the second direction. For example, the distance between the contact trench 22a and the contact trench 22b (d in FIG. 2) is preferably larger than the length of the contact trench 22a in the second direction (L2 in FIG. 2). The distance between the two contact trenches 22 adjacent to each other in the first direction is preferably equal to or more than 1.2 times the length of the contact trench 22 in the second direction.

As the distance between the two contact trenches 22 increases, the proportion of SBD in the MOSFET 100 increases. Therefore, the current flowing at the time of forward bias of the SBD increases, and the clamp voltage of the pn junction diode becomes high. Hence, the current flowing through the pn junction diode is suppressed, and the reliability of the MOSFET 100 is further improved.

The distance between the two contact trenches 22 adjacent to each other in the first direction is preferably equal to or less than 3 times the length of the contact trench 22 in the first direction. As the distance between the two contact trenches 22 increases, the electric field strength applied to the Schottky interface of the SBD is liable to increase. Therefore, the leakage current at the time of reverse bias of SBD is liable to increase. As the distance between the two contact trenches 22 increases, the electric field strength applied to the gate insulating layer 18 is liable to increase at the time of the off operation of the MOSFET 100. The distance between the two contact trenches 22 adjacent to each other in the first direction is preferably equal to or less than 3 times the length of the contact trench 22 in the second direction. As the distance between the two contact trenches 22 increases, the electric field strength applied to the Schottky interface of the SBD is liable to increase. Therefore, the leakage current at the time of reverse bias of SBD is liable to increase. As the distance between the two contact trenches 22 increases, the electric field strength applied to the gate insulating layer 18 is liable to increase at the time of the off operation of the MOSFET 100.

The length of the contact trench 22 in the first direction is preferably equal to or less than 2 times the length of the contact trench 22 in the second direction. The length of the contact trench 22a in the first direction (L1 in FIG. 2) is preferably equal to or less than 2 times the length of the contact trench 22a in the second direction (L2 in FIG. 2).

As the length of the contact trench 22 in the first direction becomes smaller, the proportion of SBD in the MOSFET 100 increases. Therefore, the current flowing at the time of forward bias of the SBD increases, and the clamp voltage of the pn junction diode becomes high. Hence, the current flowing through the pn junction diode is suppressed, and the reliability of the MOSFET 100 is further improved.

The MOSFET 100 includes the high concentration region 34 located between the drift region 26 in the portion in contact with the Schottky region 12b and the source region 30. The p type impurity concentration of the high concentration region 34 is higher than that in the p type impurity region of the body region 28. By providing the high concentration region 34, the punch-through between the drift region 26 in the portion in contact with the Schottky region 12b and the source region 30 is suppressed at the time of the off operation.

Figure 35:
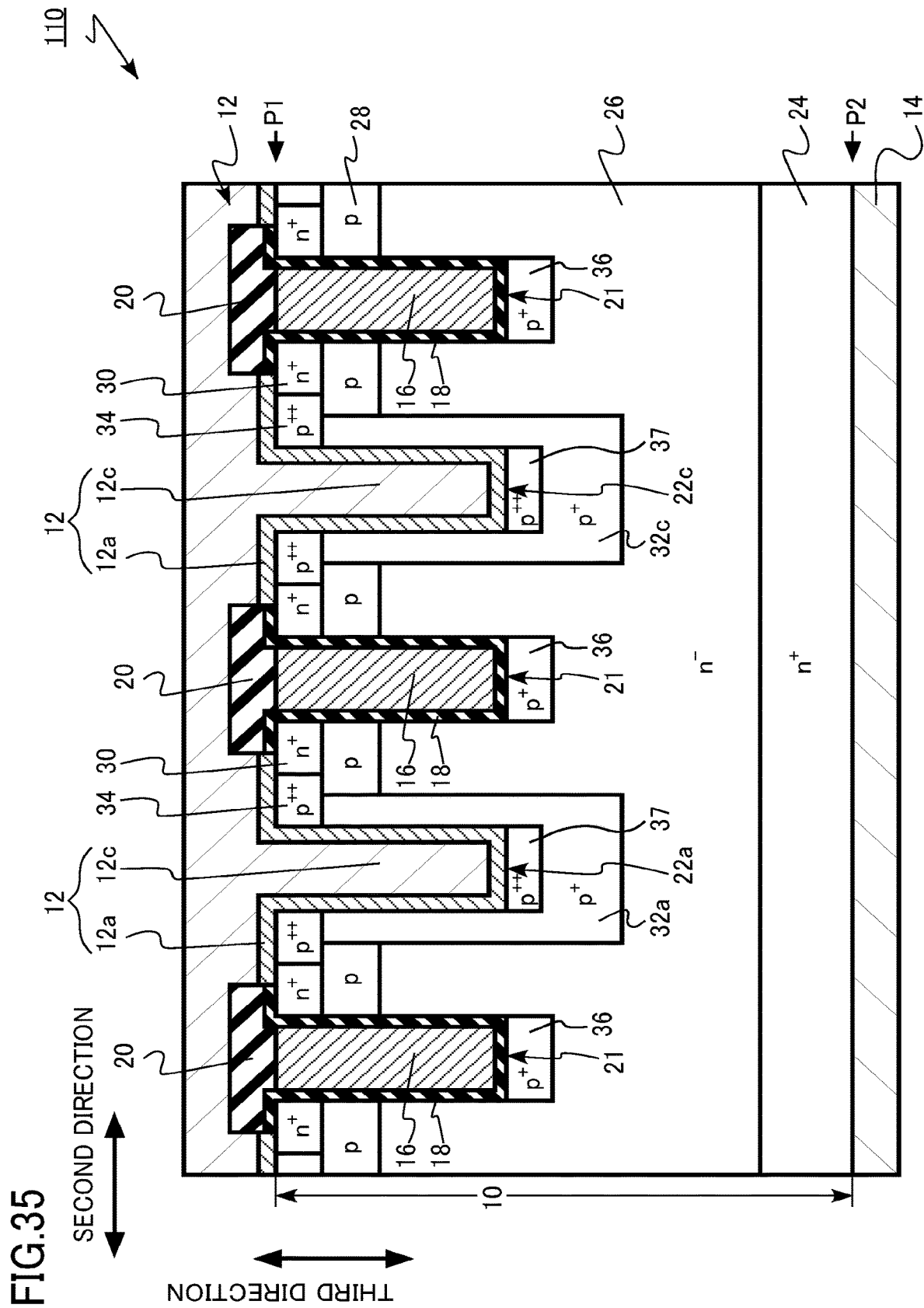
FIG. 35 is a schematic cross-sectional view of a semiconductor device of a variation of the first embodiment.

FIG. 35 is a schematic cross-sectional view of a semiconductor device of a variation of the first embodiment. FIG. 35 is a view corresponding to FIG. 1 of the first embodiment.

A MOSFET 110 of the variation of the first embodiment is different from the MOSFET 100 of the first embodiment in that the silicon carbide layer 10 has a contact region of $p^{++}$ type 37.

The contact region of $p^{++}$ type 37 is located between the electric field relaxation region of $p^+$ type 32 and the contact trench 22. The contact region 37 has a function of reducing the contact resistance of the source electrode 12. By providing the contact region 37, the electric resistance between the source electrode 12 and the electric field relaxation region 32 is reduced.

The contact region 37 includes, for example, aluminum (Al) as a p type impurity. The p type impurity concentration of the contact region 37 is higher than the p type impurity concentration of the body region 28. The p type impurity concentration of the contact region 37 is higher than the p type impurity concentration of the electric field relaxation region 32.

As described above, according to the first embodiment, it is possible to realize a MOSFET capable of improving reliability. Furthermore, it is possible to realize a MOSFET in which the leakage current of the built-in SBD is suppressed.

Second Embodiment

A semiconductor device of the second embodiment is different from that of the first embodiment in that the first silicon carbide region includes a first region and a second region, the second region is located between the first region and the second silicon carbide region, the second region is located between the first trench and the second trench, and the second region is located between the fourth silicon carbide region and the fifth silicon carbide region, and the n type impurity concentration of the second region is higher than the n type impurity concentration of the first region. A part of description will be omitted regarding the contents overlapping with the description of the first embodiment.

The semiconductor device of the second embodiment is a vertical MOSFET 200 using silicon carbide.

Figure 36:
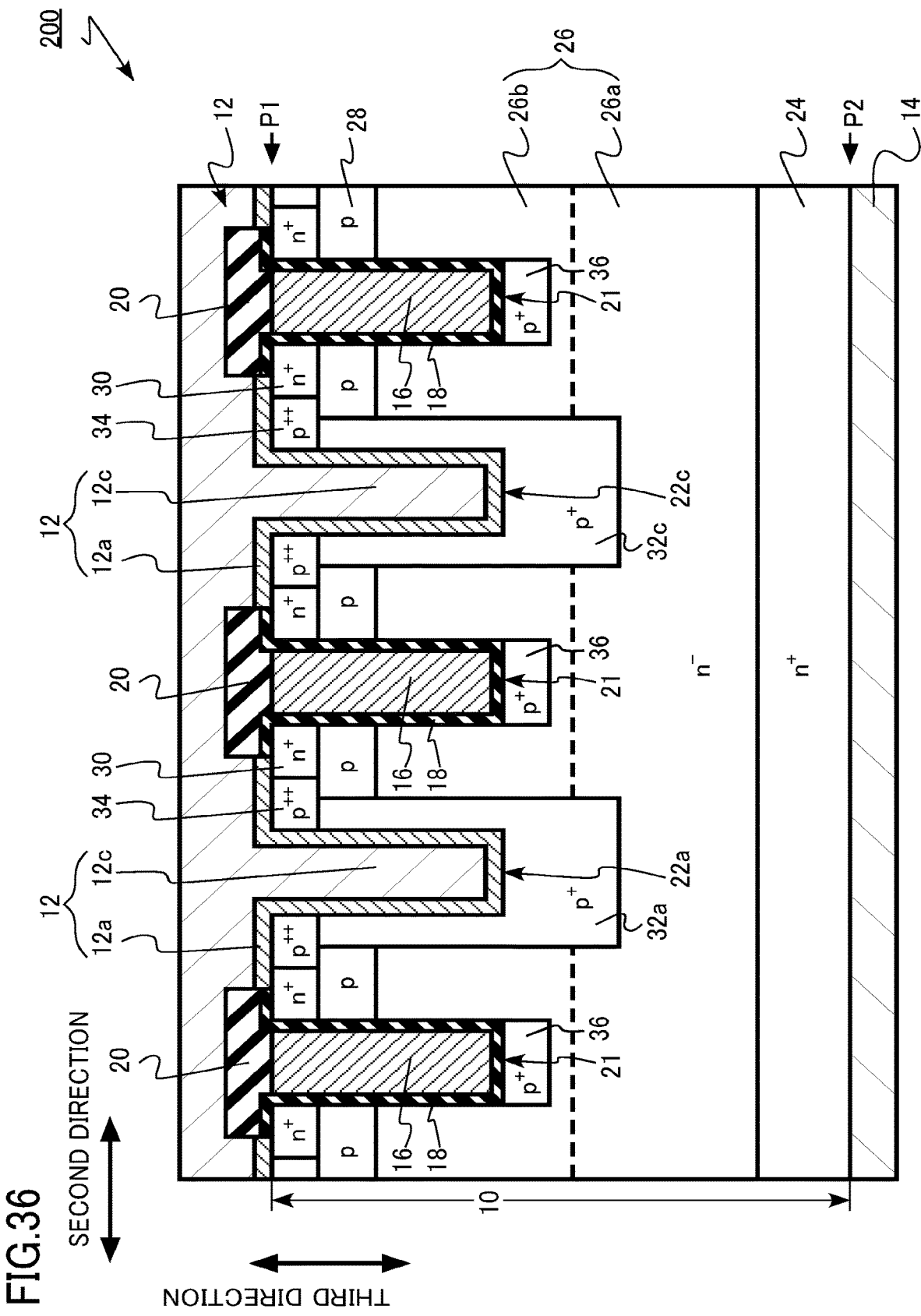
FIG. 36 is a schematic cross-sectional view of a semiconductor device of a second embodiment.
Figure 37:
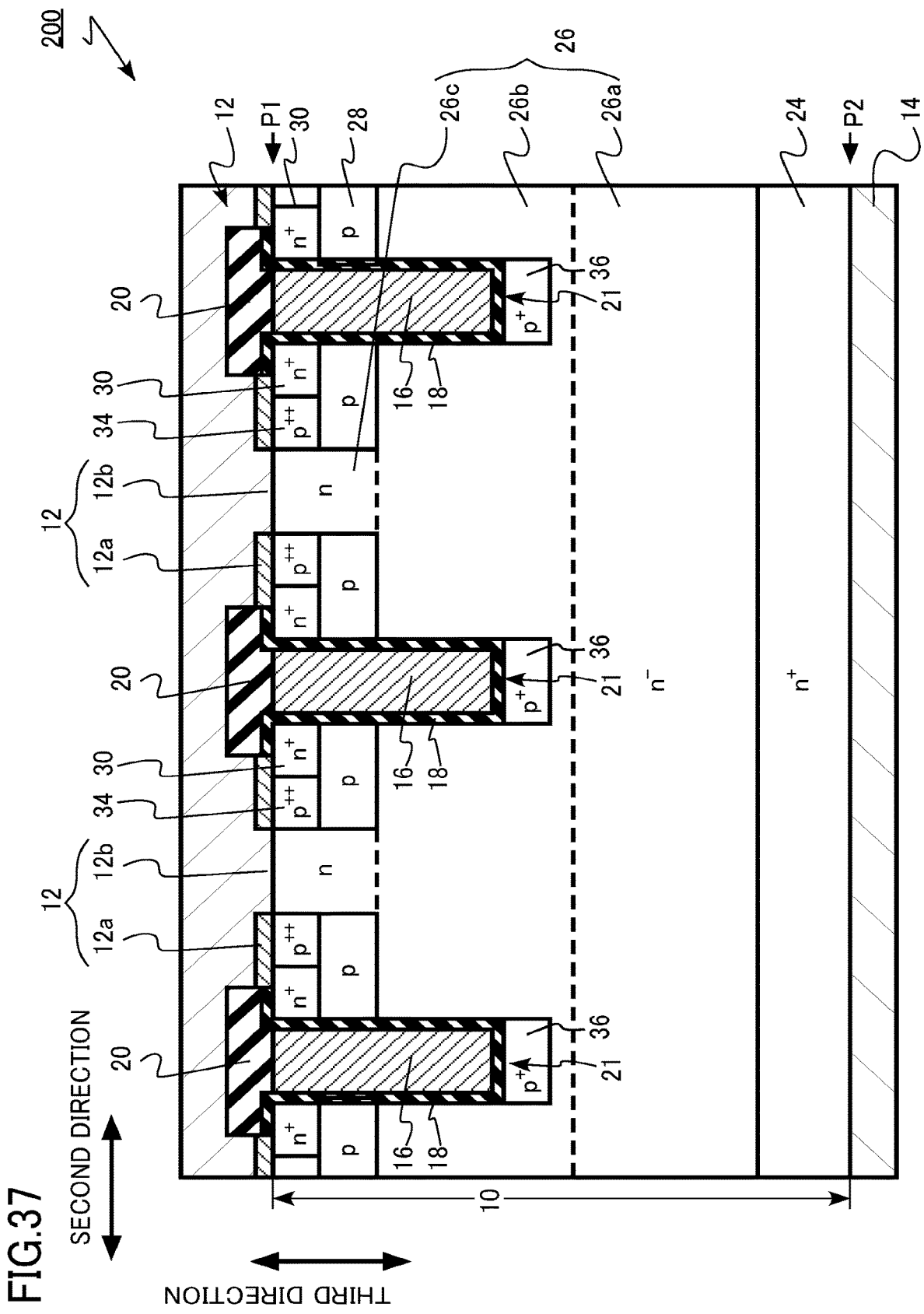
FIG. 37 is a schematic cross-sectional view of the semiconductor device of the second embodiment.
Figure 38:
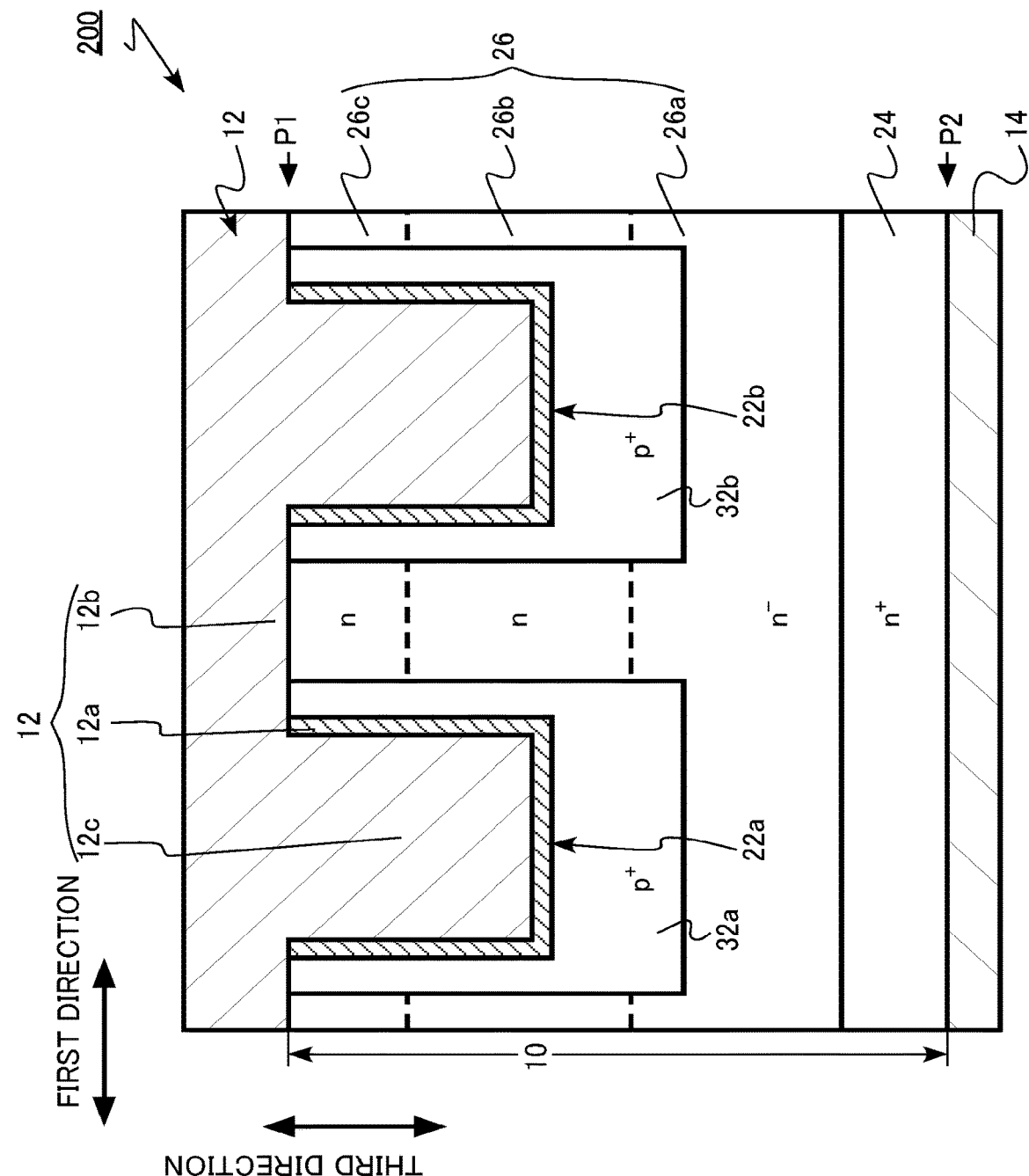
FIG. 38 is a schematic cross-sectional view of the semiconductor device of the second embodiment.

FIGS. 36 to 38 are schematic cross-sectional views of the semiconductor device of the second embodiment. FIGS. 36, 37, and 38 correspond to FIGS. 1, 2, and 4, respectively, of the first embodiment.

The MOSFET 200 includes the silicon carbide layer 10, the source electrode 12 (first electrode), the drain electrode 14 (second electrode), the gate electrode 16, the gate insulating layer 18, and the interlayer insulating layer 20. The source electrode 12 has a silicide region 12a (first portion), a Schottky region 12b (second portion), and an embedded region 12c (third portion).

The silicon carbide layer 10 has the gate trench 21 (first trench), the contact trench 22a (second trench), the contact trench 22b (third trench), the contact trench 22c, the contact trench 22d, the drain region of $n^+$ type 24, the drift region of n type 26 (first silicon carbide region), the body region of p type 28 (second silicon carbide region), the source region of $n^+$ type 30 (third silicon carbide region), the electric field relaxation region of $p^+$ type 32a (fourth silicon carbide region), the electric field relaxation region of $p^+$ type 32b (fifth silicon carbide region), the electric field relaxation region of $p^+$ type 32c, the high concentration region of $p^{++}$ type 34 (sixth silicon carbide region), and the gate trench bottom region of $p^+$ type 36 (seventh silicon carbide region).

Hereinafter, the contact trench 22a, the contact trench 22b, the contact trench 22c, and the contact trench 22d are sometimes collectively referred to simply as the contact trench 22. The electric field relaxation region 32a, the electric field relaxation region 32b, and the electric field relaxation region 32c are sometimes collectively referred to simply as the electric field relaxation region 32.

The drift region 26 has a first region of $n^−$ type 26a, a second region of n type 26b, and a third region of n type 26c.

The first region of $n^−$ type 26a is located between the drain region 24 and the body region 28.

The first region 26a includes, for example, nitrogen (N) as an n type impurity. The n type impurity concentration of the first region 26a is, for example, equal to or more than $4\times10^{14}$ cm$^{-3}$ and equal to or less than $1\times10^{17}$ cm$^{-3}$.

The second region of n type 26b is located between the first region 26a and the body region 28. The second region 26b is located between the gate trench 21 and the contact trench 22. For example, the second region 26b is located between the gate trench 21 and the contact trench 22a. For example, the second region 26b is located between the gate trench 21 and the contact trench 22b. For example, the second region 26b is located between the gate trench 21 and the contact trench 22c.

The second region 26b is located between the two contact trenches 22 adjacent to each other in the first direction. The second region 26b is located between the contact trench 22a and the contact trench 22b, for example.

The second region 26b is located between the two electric field relaxation regions 32 adjacent to each other in the first direction. The second region 26b is located between the electric field relaxation region 32a and the electric field relaxation region 32b, for example.

The second region 26b includes, for example, nitrogen (N) as an n type impurity. The n type impurity concentration of the second region 26b is higher than the n type impurity concentration of the first region 26a.

The n type impurity concentration of the second region 26b is, for example, equal to or more than 1.2 times and equal to or less than 5 times the n type impurity concentration of the first region 26a. The n type impurity concentration of the second region 26b is, for example, equal to or more than $1\times10^{15}$ cm$^{-3}$ and equal to or less than $5\times10^{17}$ cm$^{-3}$.

The depth of the second region 26b is larger than the depth of the gate trench 21, for example. The depth of the second region 26b is larger than the depth of the gate trench bottom region 36, for example. The depth of the second region 26b is larger than the depth of the electric field relaxation region 32, for example.

The third region 26c is located between the second region 26b and the Schottky region 12b. The third region 26c is located between the second region 26b and the first face P1.

The third region 26c is located between the two contact trenches 22 adjacent to each other in the first direction. For example, the third region 26c is located between, for example, the contact trench 22a and the contact trench 22b.

The third region 26c is located between the two electric field relaxation regions 32 adjacent to each other in the first direction. The third region 26c is located between the electric field relaxation region 32a and the electric field relaxation region 32b, for example.

The third region 26c includes, for example, nitrogen (N) as an n type impurity. The n type impurity concentration of the third region 26c is higher than the n type impurity concentration of the second region 26b.

The n type impurity concentration of the third region 26c is, for example, equal to or more than 1.5 times and equal to or less than 5 times the n type impurity concentration of the second region 26b.

The n type impurity concentration of the third region 26c is, for example, equal to or more than $1\times10^{16}$ cm$^{-3}$ and equal to or less than $1\times10^{18}$ cm$^{-3}$.

The depth of the third region 26c is, for example, smaller than the depths of the gate trench 21 and the contact trench 22.

In the MOSFET 200 of the second embodiment, by having the second region 26b having a high n type impurity concentration, it becomes possible to reduce the on-resistance of the MOSFET 200.

In the MOSFET 200 of the second embodiment, by having the third region 26c having a high n type impurity concentration, the current flowing at the time of forward bias of the SBD built in the MOSFET 200 increases. Therefore, the clamp voltage of the pn junction diode becomes high. Hence, the current flowing through the pn junction diode is suppressed, and the reliability of the MOSFET 200 is further improved.

The n type impurity concentration of the third region 26c is preferably equal to or more than 1.5 times, more preferably equal to or more than 2 times, the n type impurity concentration of the second region 26b. As the n type impurity concentration in the third region 26c becomes high, it becomes possible to increase the clamping voltage of the pn junction diode.

The n type impurity concentration of the third region 26c is preferably equal to or less than 5 times, more preferably equal to or less than 4 times, the n type impurity concentration of the second region 26b. As the n type impurity concentration in the third region 26c becomes low, the leakage current of SBD is reduced.

As described above, according to the second embodiment, it is possible to realize a MOSFET capable of improving reliability. Furthermore, it is possible to realize a MOSFET in which the leakage current of the built-in SBD is suppressed.

Third Embodiment

A semiconductor device of the third embodiment is different from that of the first embodiment in that the third silicon carbide region and the sixth silicon carbide region are alternately formed in the first direction on the first face. A part of description will be omitted regarding the contents overlapping with the description of the first embodiment.

The semiconductor device of the third embodiment is a vertical MOSFET 300 using silicon carbide.

Figure 39:
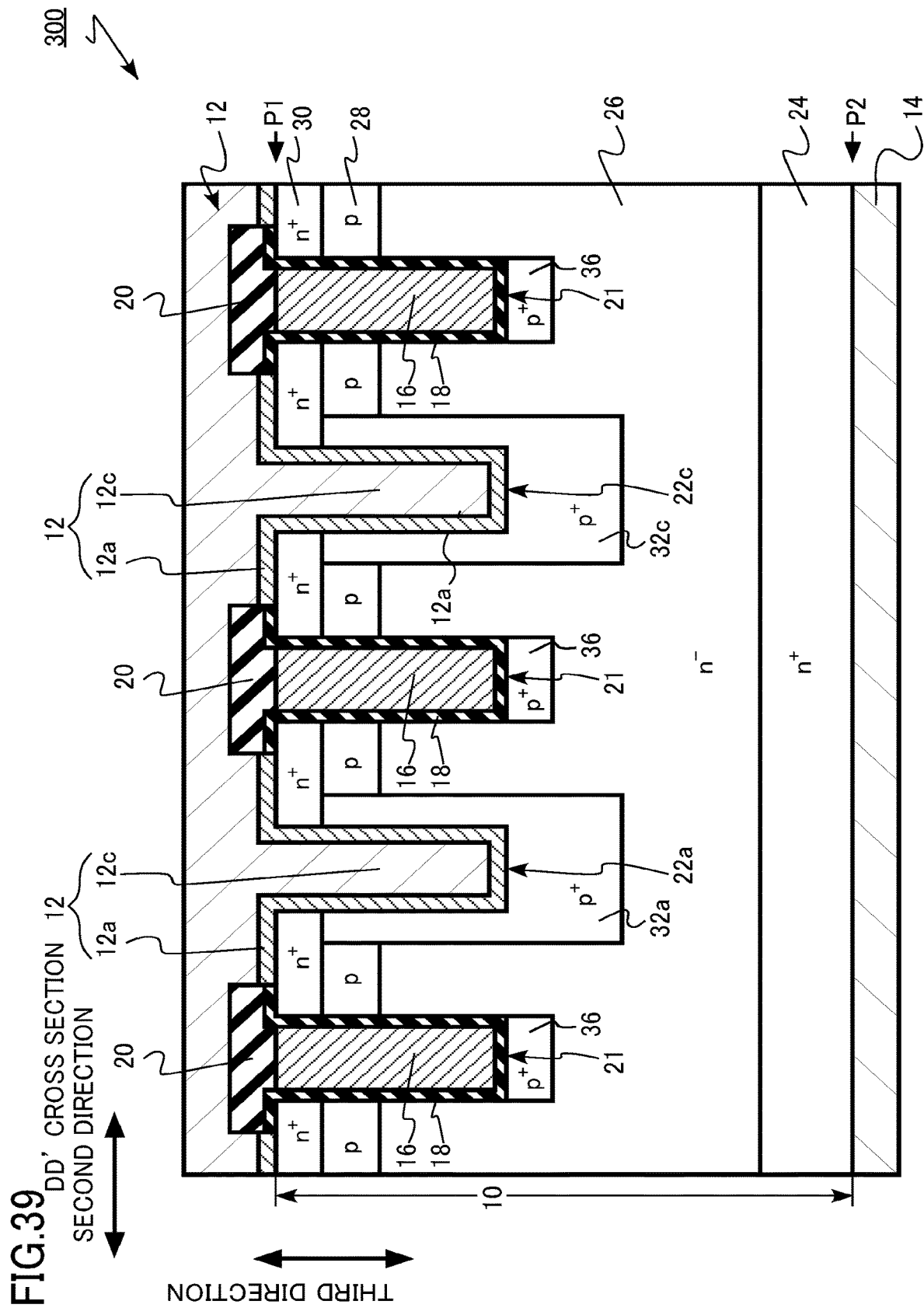
FIG. 39 is a schematic cross-sectional view of a semiconductor device of a third embodiment.
Figure 40:
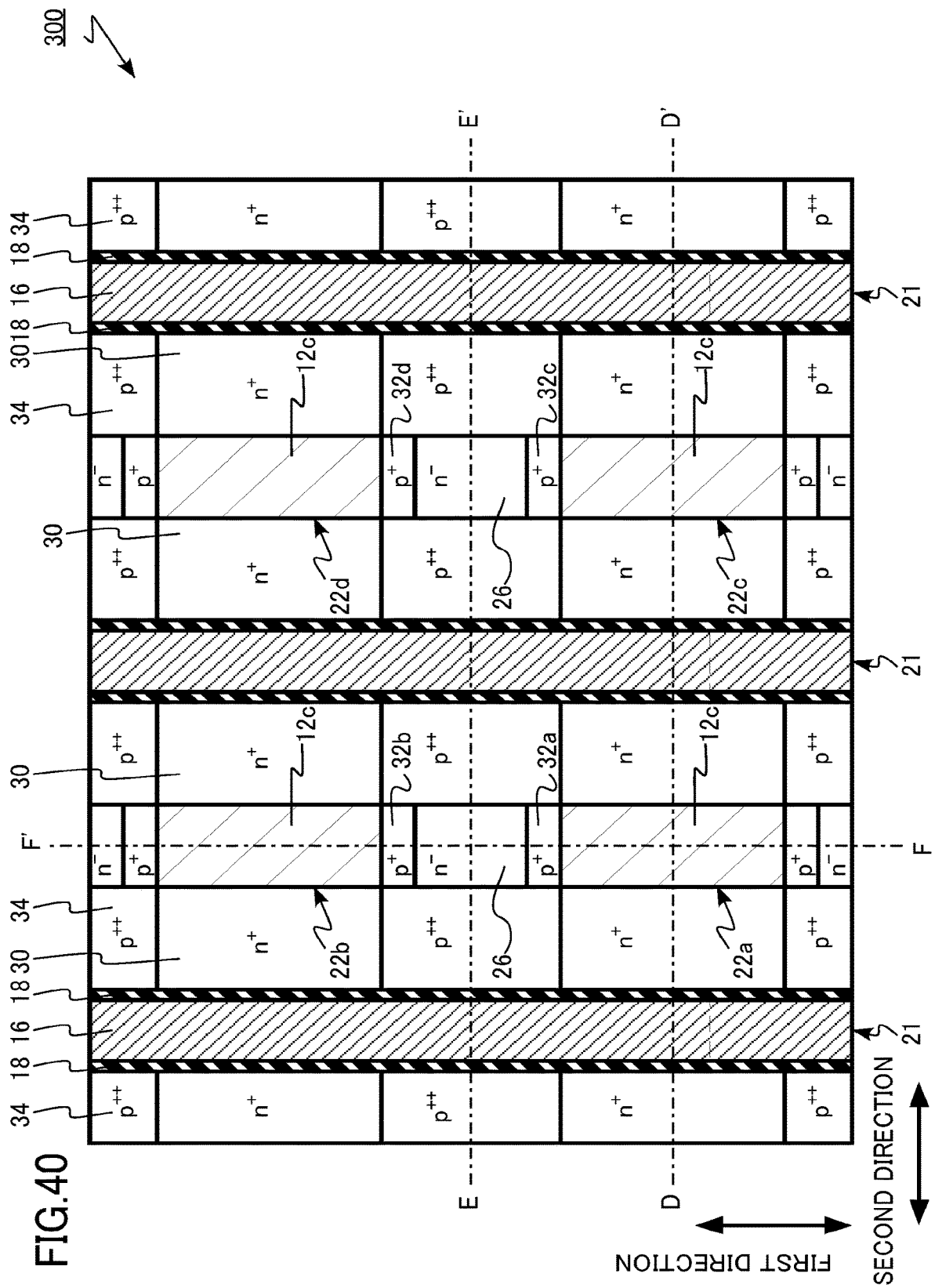
FIG. 40 is a schematic plan view of the semiconductor device of the third embodiment.
Figure 41:
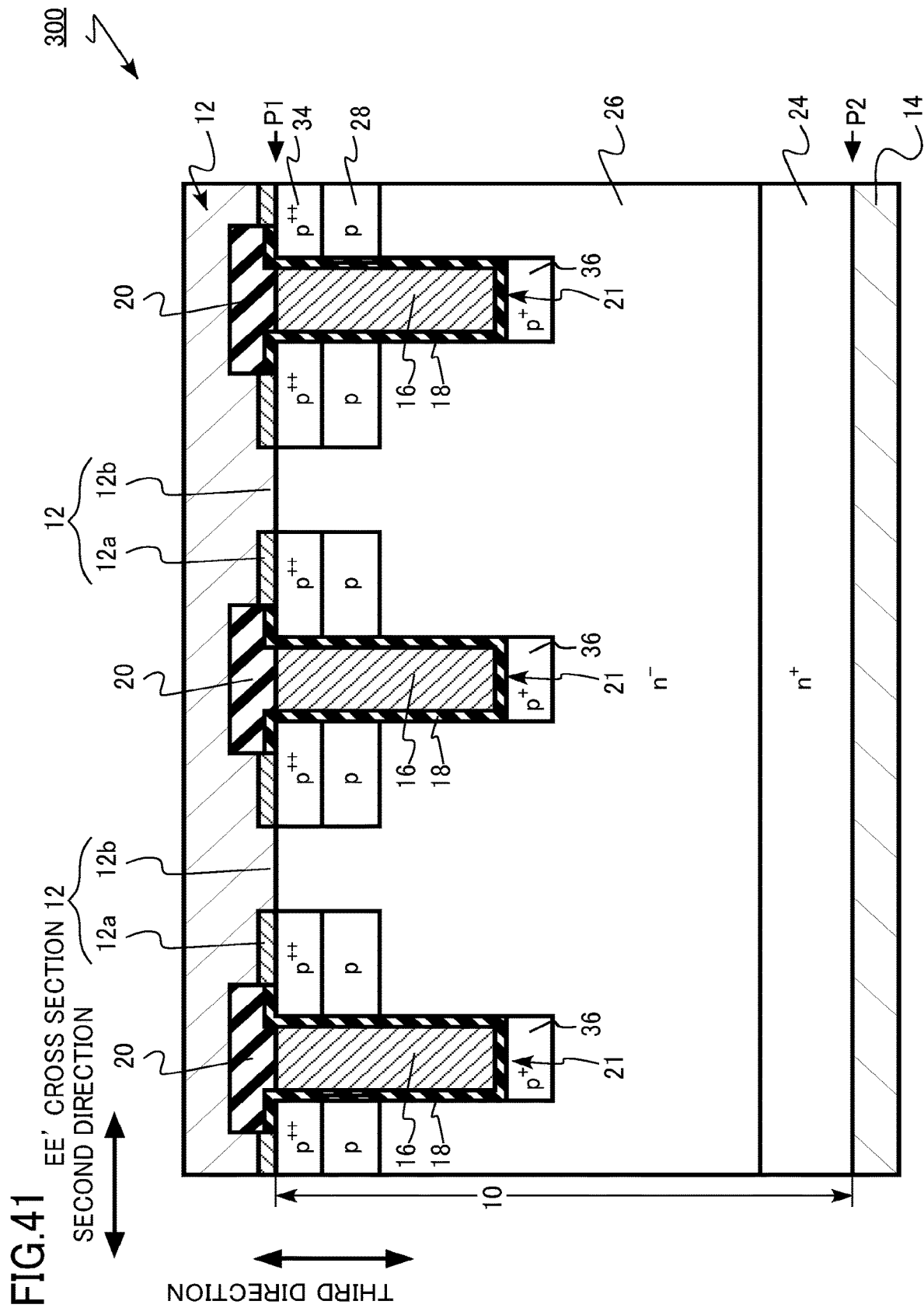
FIG. 41 is a schematic cross-sectional view of the semiconductor device of the third embodiment.
Figure 42:
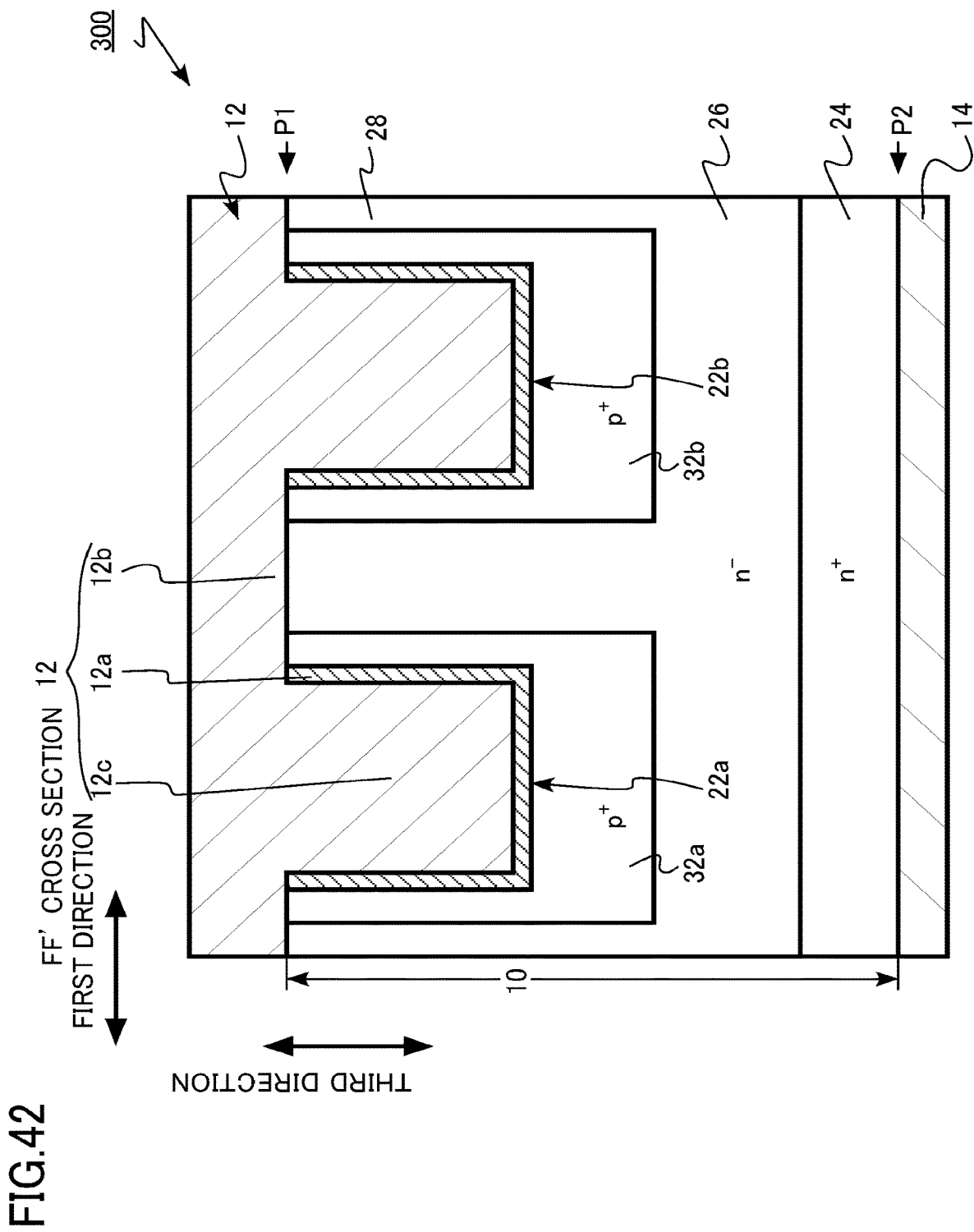
FIG. 42 is a schematic cross-sectional view of the semiconductor device of the third embodiment.

FIG. 39 is a schematic cross-sectional view of the semiconductor device of the third embodiment. FIG. 40 is a schematic plan view of the semiconductor device of the third embodiment. FIG. 41 is a schematic cross-sectional view of the semiconductor device of the third embodiment. FIG. 42 is a schematic cross-sectional view of the semiconductor device of the third embodiment.

FIG. 39 is a cross-sectional view of DD' of FIG. 40. FIG. 40 shows a pattern on the first face P1 of FIG. 39. FIG. 41 is a cross-sectional view of EE' of FIG. 40. FIG. 42 is a cross-sectional view of FF' of FIG. 40.

The MOSFET 300 includes the silicon carbide layer 10, the source electrode 12 (first electrode), the drain electrode 14 (second electrode), the gate electrode 16, the gate insulating layer 18, and the interlayer insulating layer 20. The source electrode 12 has a silicide region 12a (first portion), a Schottky region 12b (second portion), and an embedded region 12c (third portion).

The silicon carbide layer 10 has a gate trench 21 (first trench), a contact trench 22a (second trench), a contact trench 22b (third trench), a contact trench 22c, a contact trench 22d, a drain region of $n^+$ type 24, a drift region of $n^-$ type 26 (first silicon carbide region), a body region of p type 28 (second silicon carbide region), a source region of $n^+$ type 30 (third silicon carbide region), an electric field relaxation region of $p^+$ type 32a (fourth silicon carbide region), an electric field relaxation region of $p^+$ type 32b (fifth silicon carbide region), an electric field relaxation region of $p^+$ type 32c, a high concentration region of $p^{++}$ type 34 (sixth silicon carbide region), and a gate trench bottom region of $p^+$ type 36 (seventh silicon carbide region).

Hereinafter, the contact trench 22a, the contact trench 22b, the contact trench 22c, and the contact trench 22d are sometimes collectively referred to simply as the contact trench 22. The electric field relaxation region 32a, the electric field relaxation region 32b, and the electric field relaxation region 32c are sometimes collectively referred to simply as the electric field relaxation region 32.

The source region of $n^+$ type 30 is located between the body region 28 and the first face P1. The source region 30 is located between the gate trench 21 and the contact trench 22.

The source region 30 is in contact with the source electrode 12. The source region 30 is in contact with the silicide region 12a. The source region 30 is in contact with the gate insulating layer 18.

The source region 30 includes, for example, phosphorus (P) as an n type impurity. The n type impurity concentration of the source region 30 is higher than the n type impurity concentration of the drift region 26. The n type impurity concentration of the source region 30 is, for example, equal to or more than $1\times10^{19}$ cm$^{-3}$ and equal to or less than $1\times10^{21}$ cm$^{-3}$.

The depth of the source region 30 is smaller than the depth of the body region 28. The depth of the source region 30 is, for example, equal to or more than 0.1 μm and equal to or less than 0.4 μm.

The high concentration region of $p^{++}$ type 34 is located between the drift region 26 in the portion in contact with the Schottky region 12b and the gate trench 21. The high concentration region 34 is located between the drift region 26 in a portion in contact with the Schottky region 12b and the source region 30.

The depth of the high concentration region 34 is smaller than the depth of the body region 28, for example. The high concentration region 34 is in contact with the first face P1, for example.

The high concentration region 34 has a function of reducing the contact resistance of the source electrode 12. By providing the high concentration region 34, the electric resistance between the source electrode 12 and the electric field relaxation region 32 is reduced. By providing the high concentration region 34, the electric resistance between the source electrode 12 and the body region 28 is reduced.

The high concentration region 34 has a function of suppressing punch-through between the drift region 26 in a portion in contact with the Schottky region 12b and the source region 30 at the time of the off operation of the MOSFET 300.

The high concentration region 34 includes, for example, aluminum (Al) as a p type impurity. The p type impurity concentration of the high concentration region 34 is higher than the p type impurity concentration of the body region 28. The p type impurity concentration of the high concentration region 34 is, for example, equal to or more than 10 times and equal to or less than 1000 times the p type impurity concentration of the body region 28.

The p type impurity concentration of the high concentration region 34 is, for example, equal to or more than $1\times10^{19}$ cm$^{-3}$ and equal to or less than $1\times10^{21}$ cm$^{-3}$. The p type impurity concentration of the portion of the high concentration region 34 in contact with the source electrode 12 is, for example, equal to or more than $1\times10^{19}$ cm$^{-3}$ and equal to or less than $1\times10^{21}$ cm$^{-3}$.

The source region 30 and the high concentration region 34 are alternately disposed in the first direction on the first face P1.

In the MOSFET 300 of the third embodiment, the area of the source region 30 in contact with the source electrode 12 increases as compared with that in the MOSFET 100 of the first embodiment. Therefore, the contact resistance between the source electrode 12 and the source region 30 is reduced. Therefore, it becomes possible to reduce the on-resistance of the MOSFET 300.

As described above, according to the third embodiment, it is possible to realize a MOSFET capable of improving reliability. Furthermore, it is possible to realize a MOSFET in which the leakage current of the built-in SBD is suppressed. Furthermore, it is possible to realize a MOSFET in which the on-resistance is reduced.

Fourth Embodiment

A semiconductor device of the fourth embodiment is different from that of the first embodiment in that the silicon carbide layer includes a fourth trench provided between the second trench and the third trench. A part of description will be omitted regarding the contents overlapping with the description of the first embodiment.

The semiconductor device of the fourth embodiment is a vertical MOSFET 400 using silicon carbide.

Figure 43:
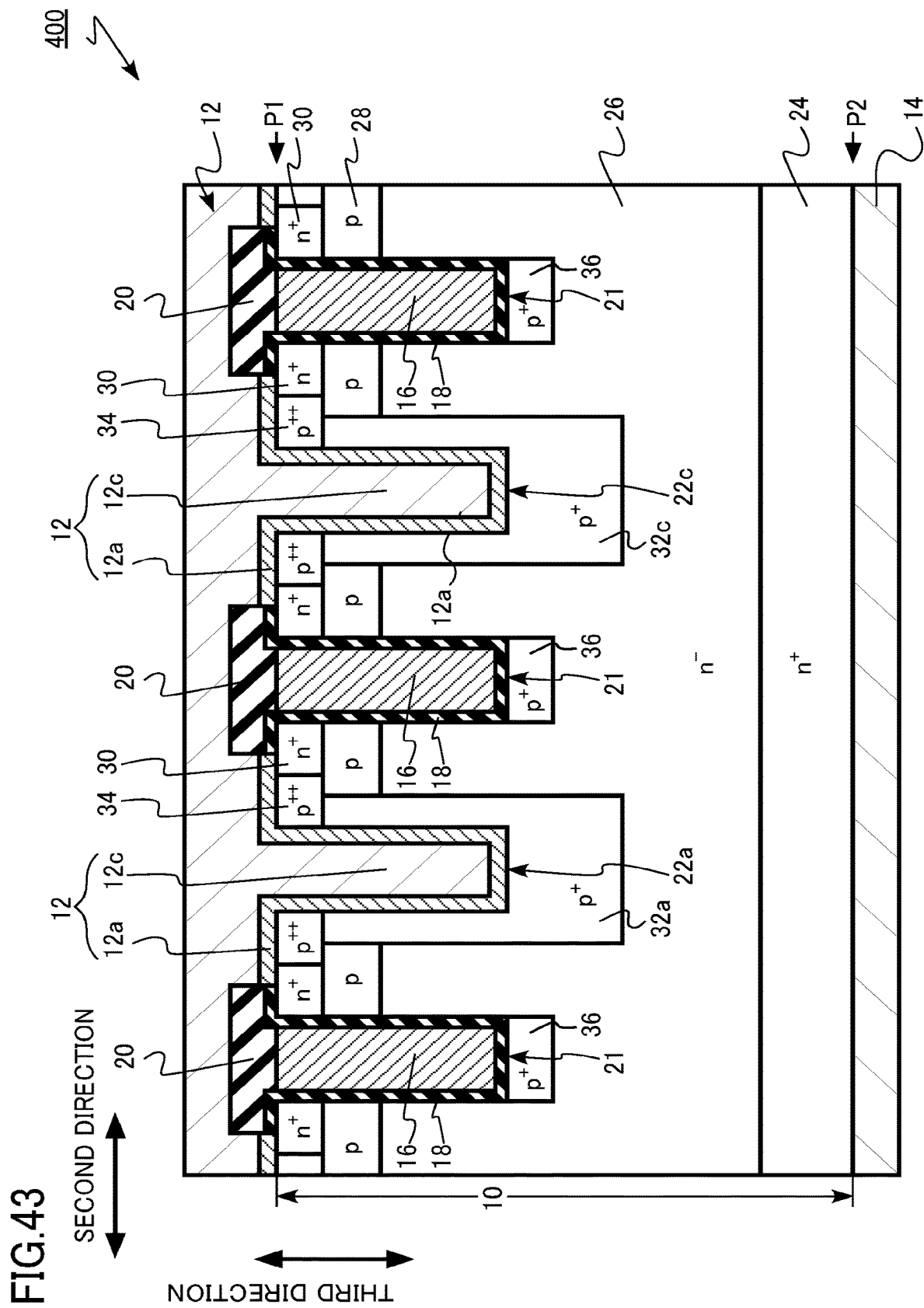
FIG. 43 is a schematic cross-sectional view of a semiconductor device of a fourth embodiment.
Figure 44:
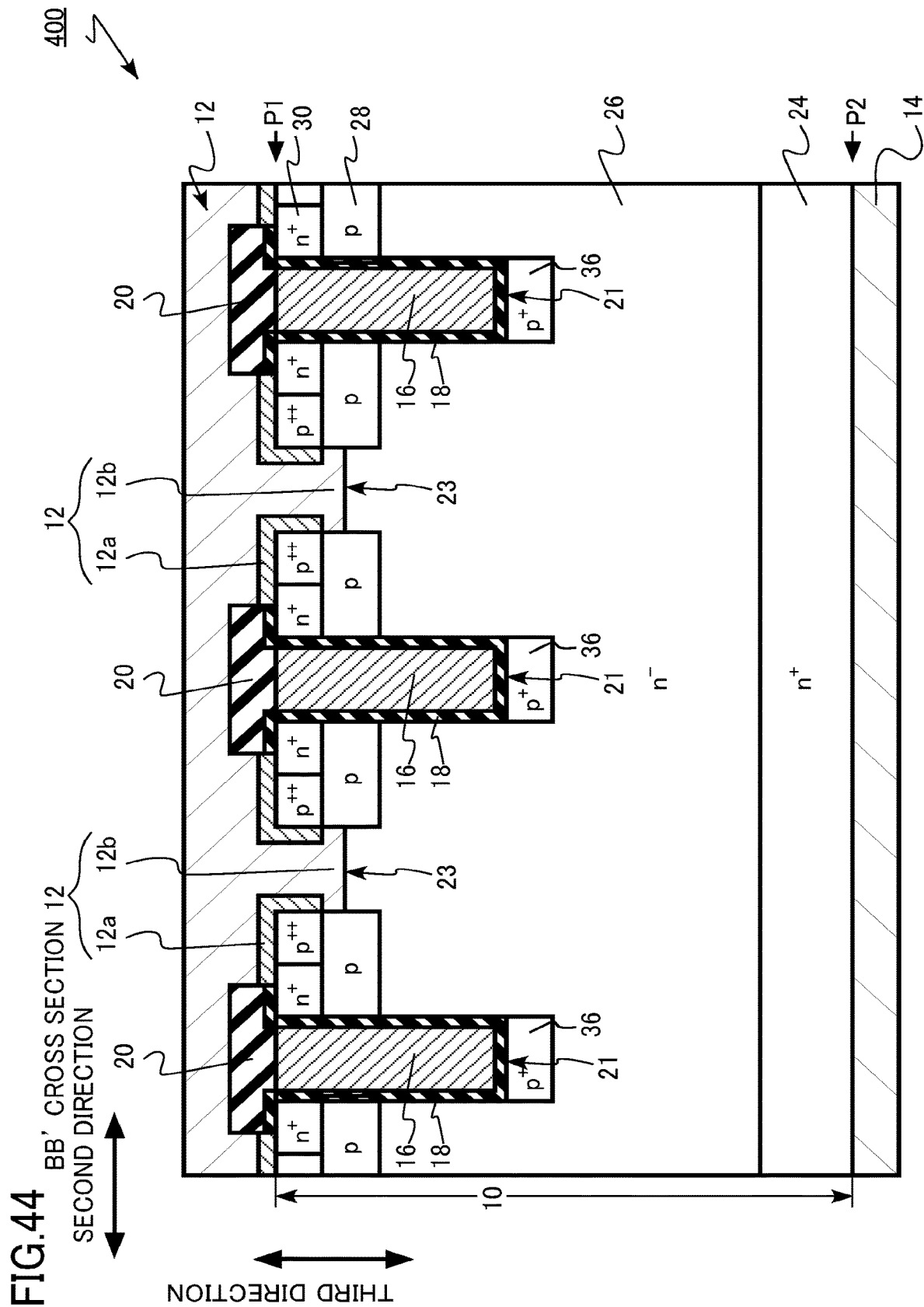
FIG. 44 is a schematic cross-sectional view of the semiconductor device of the fourth embodiment.
Figure 45:
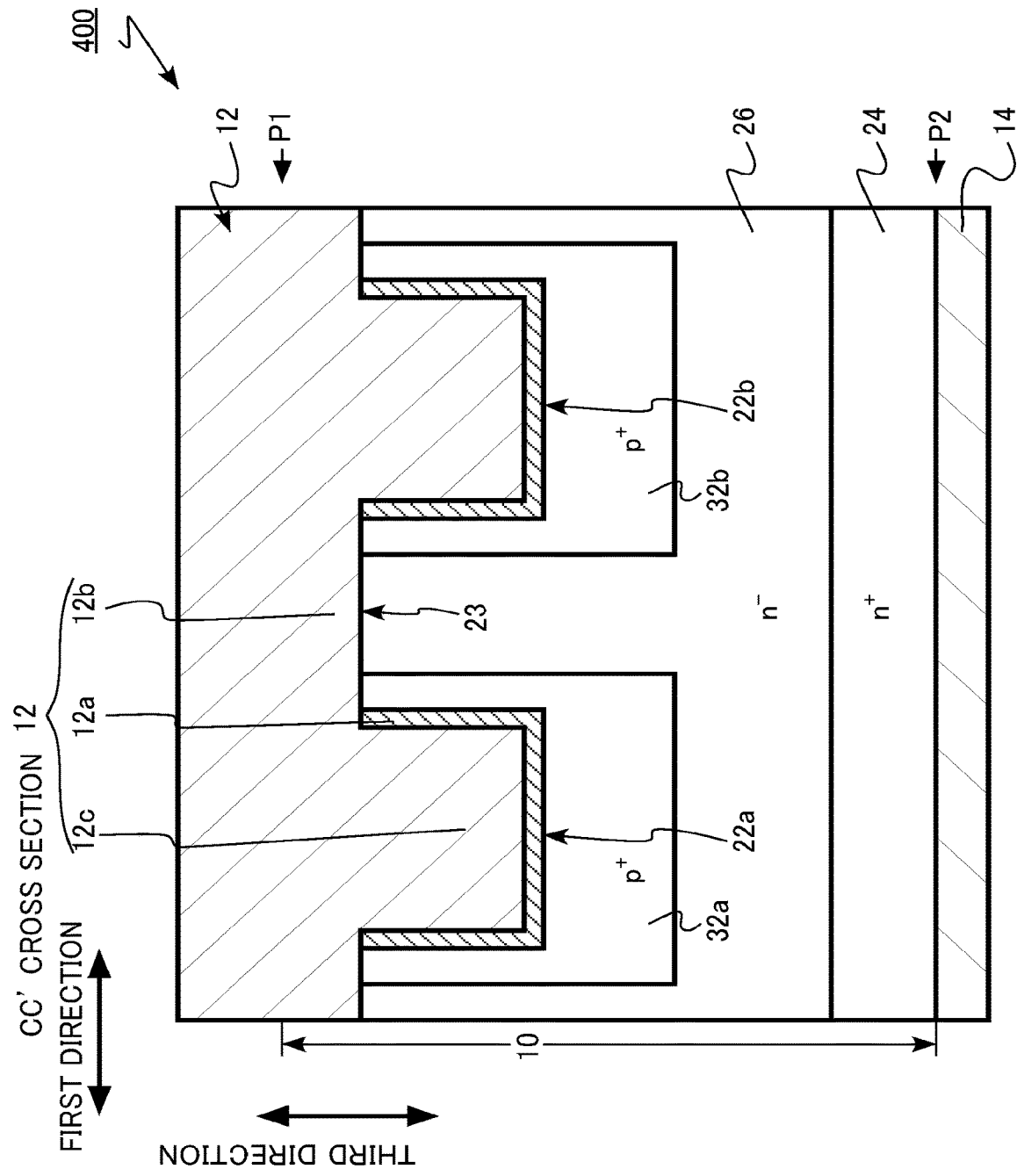
FIG. 45 is a schematic cross-sectional view of the semiconductor device of the fourth embodiment.

FIGS. 43 to 45 are schematic cross-sectional views of the semiconductor device of the fourth embodiment. FIGS. 43, 44, and 45 correspond to FIGS. 1, 2, and 4, respectively, of the first embodiment.

The MOSFET 400 includes the silicon carbide layer 10, the source electrode 12 (first electrode), the drain electrode 14 (second electrode), the gate electrode 16, the gate insulating layer 18, and the interlayer insulating layer 20. The source electrode 12 has a silicide region 12a (first portion), a Schottky region 12b (second portion), and an embedded region 12c (third portion).

The silicon carbide layer 10 has the gate trench 21 (first trench), the contact trench 22a (second trench), the contact trench 22b (third trench), the contact trench 22c, the contact trench 22d, a shallow trench 23 (fourth trench), the drain region of $n^+$ type 24, the drift region of $n^-$ type 26 (first silicon carbide region), the body region of p type 28 (second silicon carbide region), the source region of $n^+$ type 30 (third silicon carbide region), the electric field relaxation region of p' type 32a (fourth silicon carbide region), the electric field relaxation region of $p^+$ type 32b (fifth silicon carbide region), the electric field relaxation region of $p^+$ type 32c, the high concentration region of $p^{++}$ type 34 (sixth silicon carbide region), and the gate trench bottom region of $p^+$ type 36 (seventh silicon carbide region).

Hereinafter, the contact trench 22a, the contact trench 22b, the contact trench 22c, and the contact trench 22d are sometimes collectively referred to simply as the contact trench 22. The electric field relaxation region 32a, the electric field relaxation region 32b, and the electric field relaxation region 32c are sometimes collectively referred to simply as the electric field relaxation region 32.

The shallow trench 23 exists in the silicon carbide layer 10. The shallow trench 23 is located on a side of the first face P1 of the silicon carbide layer 10. The shallow trench 23 is a groove formed in the silicon carbide layer 10.

The shallow trench 23 is provided between the two contact trenches 22 adjacent to each other in the first direction. The shallow trench 23 is provided between the contact trench 22a and the contact trench 22b, for example. The shallow trench 23 is repeatedly disposed in the first direction with the contact trench 22 in between.

The depth of the shallow trench 23 is smaller than the depth of the contact trench 22. The depth of the shallow trench 23 is smaller than the depth of the gate trench 21, for example. The depth of the shallow trench 23 is smaller than the depth of the body region 28, for example.

The Schottky region 12b, which is a part of the source electrode 12, is located in the shallow trench 23. The Schottky region 12b is embedded in the shallow trench 23.

The silicide region 12a is in contact with the high concentration region 34 on the side face of the shallow trench 23. In other words, the source electrode 12 is in contact with the high concentration region 34 on the side face of the shallow trench 23.

According to the MOSFET 400 of the fourth embodiment, by including the shallow trench 23, the source electrode 12 is in contact with the high concentration region 34 on the side face of the shallow trench 23. Therefore, the contact area between the source electrode 12 and the high concentration region 34 increases as compared with that in the MOSFET 100 of the first embodiment. Therefore, the contact resistance between the source electrode 12 and the high concentration region 34 is reduced.

As described above, according to the fourth embodiment, it is possible to realize a MOSFET capable of improving reliability. Furthermore, it is possible to realize a MOSFET in which the leakage current of the built-in SBD is suppressed. Furthermore, it is possible to realize a MOSFET in which the contact resistance is reduced.

Fifth Embodiment

A semiconductor device of the fifth embodiment includes: a silicon carbide layer having a first face and a second face opposite to the first face, the first face being parallel to a first direction and a second direction orthogonal to the first direction, the silicon carbide layer including a trench located on a side of the first face and extending in the first direction, a first silicon carbide region of n type, a second silicon carbide region of p type located between the first silicon carbide region and the first face, a third silicon carbide region of n type located between the second silicon carbide region and the first face, a fourth silicon carbide region of p type located in the second direction with respect to the trench, the first silicon carbide region located between the fourth silicon carbide region and the trench, and the fourth silicon carbide region being deeper than the trench, and a fifth silicon carbide region of p type located in the first direction with respect to the fourth silicon carbide region, the first silicon carbide region located between the fifth silicon carbide region and the fourth silicon carbide region, and the fifth silicon carbide region being deeper than the trench; a gate electrode located in the trench; a gate insulating layer located between the gate electrode and the silicon carbide layer; a first electrode located on a side of the first face of the silicon carbide layer, the first electrode including a first portion and a second portion, the first portion being in contact with the third silicon carbide region, and the second portion being in contact with the first silicon carbide region located between the fourth silicon carbide region and the fifth silicon carbide region; and a second electrode located on a side of the second face of the silicon carbide layer.

The semiconductor device of the fifth embodiment is different from that of the first embodiment in that the silicon carbide layer does not include the second trench and the third trench. A part of description will be omitted regarding the contents overlapping with the description of the first embodiment.

The semiconductor device of the fifth embodiment is a vertical MOSFET 500 using silicon carbide. The MOSFET 500 is a MOSFET having a trench gate structure in which a gate electrode is provided in a trench. The MOSFET 500 includes an SBD as a built-in diode. The MOSFET 500 is a MOSFET of n channel type with electrons as carriers.

Figure 46:
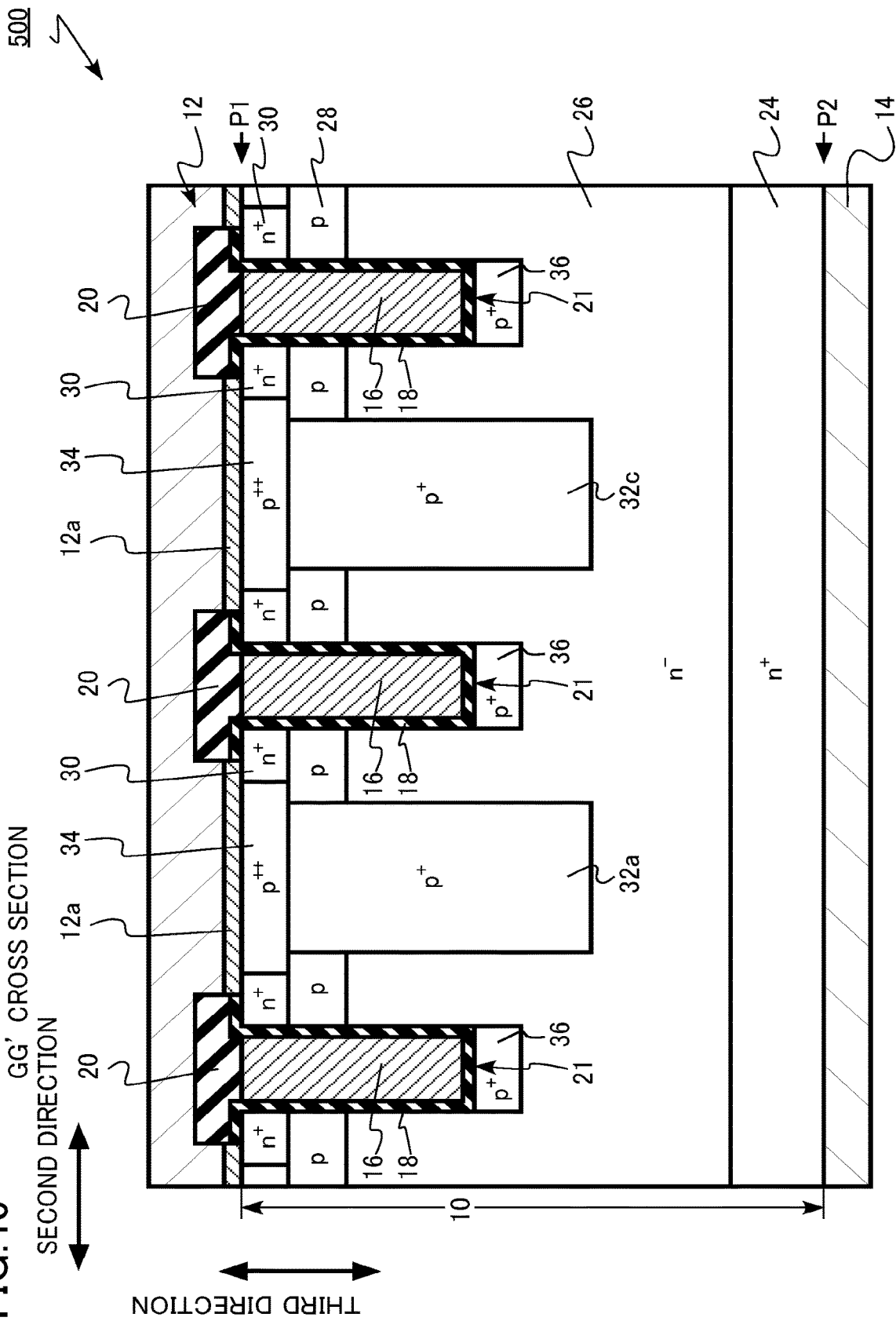
FIG. 46 is a schematic cross-sectional view of a semiconductor device of a fifth embodiment.
Figure 47:
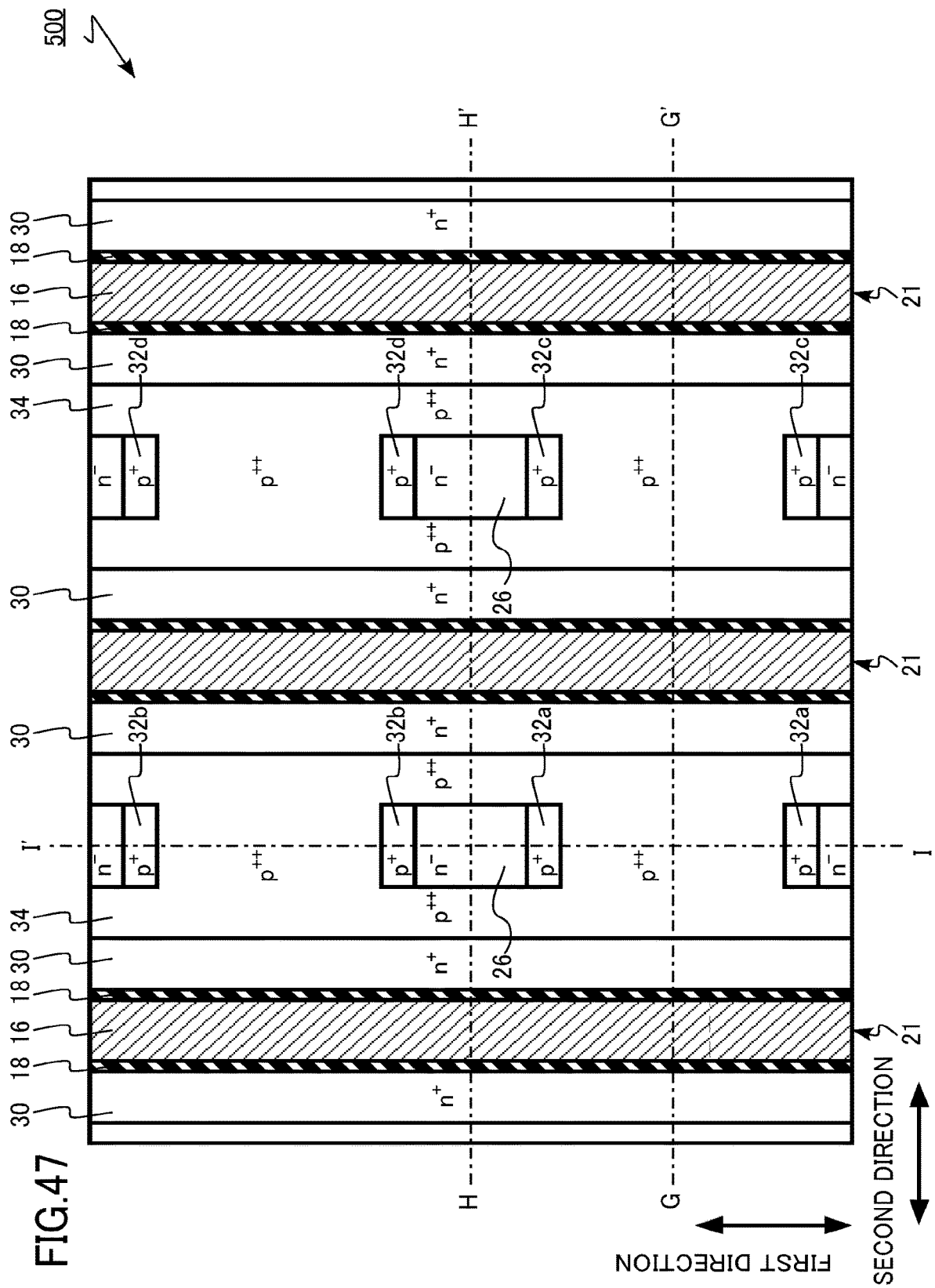
FIG. 47 is a schematic plan view of the semiconductor device of the fifth embodiment.
Figure 48:
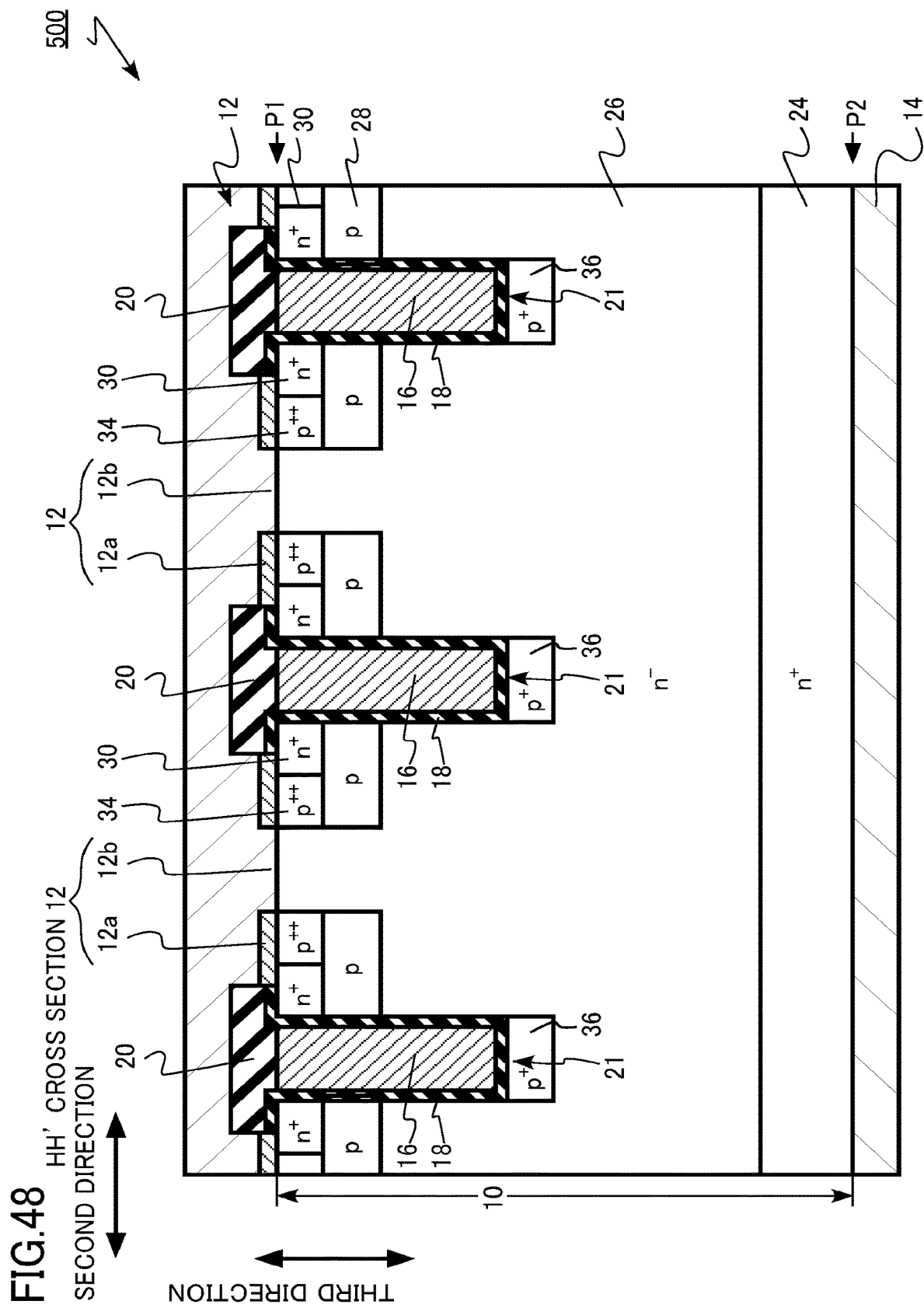
FIG. 48 is a schematic cross-sectional view of the semiconductor device of the fifth embodiment.
Figure 49:
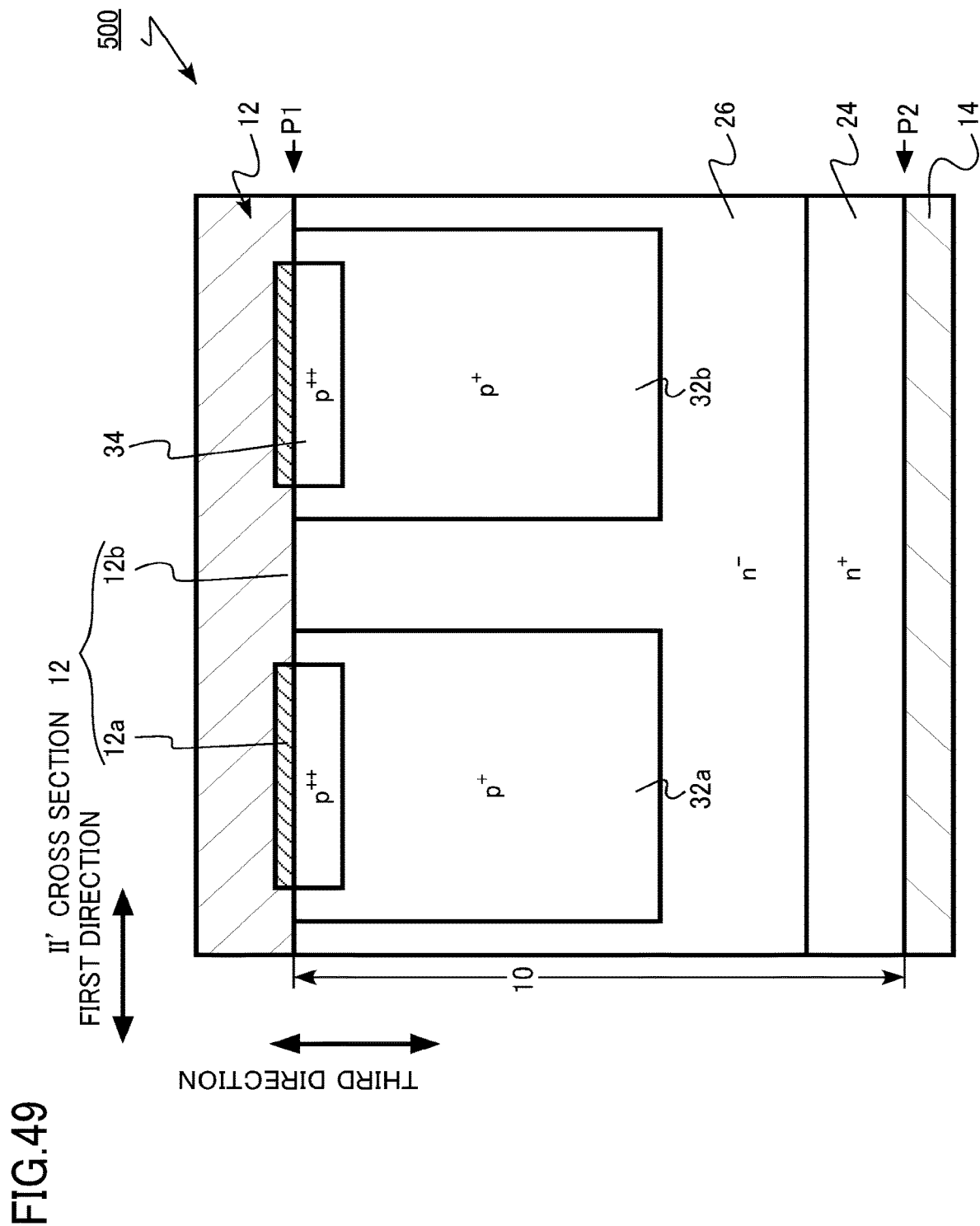
FIG. 49 is a schematic cross-sectional view of the semiconductor device of the fifth embodiment.

FIG. 46 is a schematic cross-sectional view of the semiconductor device of the fifth embodiment. FIG. 47 is a schematic plan view of the semiconductor device of the fifth embodiment. FIG. 48 is a schematic cross-sectional view of the semiconductor device of the fifth embodiment. FIG. 49 is a schematic cross-sectional view of the semiconductor device of the fifth embodiment.

FIG. 46 is a cross-sectional view of GG' of FIG. 47. FIG. 47 shows a pattern on the first face P1 of FIG. 46. FIG. 48 is a cross-sectional view of HH' of FIG. 46. FIG. 49 is a cross-sectional view of II' of FIG. 46.

The MOSFET 500 includes the silicon carbide layer 10, the source electrode 12 (first electrode), the drain electrode 14 (second electrode), the gate electrode 16, the gate insulating layer 18, and the interlayer insulating layer 20. The source electrode 12 has a silicide region 12a (first portion) and a Schottky region 12b (second portion).

The silicon carbide layer 10 has the gate trench 21 (trench), the drain region of $n^+$ type 24, the drift region of $n^-$ type 26 (first silicon carbide region), the body region of p type 28 (second silicon carbide region), the source region of $n^+$ type 30 (third silicon carbide region), the electric field relaxation region of $p^+$ type 32a (fourth silicon carbide region), the electric field relaxation region of $p^+$ type 32b (fifth silicon carbide region), the electric field relaxation region of $p^+$ type 32c, the high concentration region of $p^{++}$ type 34 (sixth silicon carbide region), and the gate trench bottom region of $p^+$ type 36 (seventh silicon carbide region).

Hereinafter, the electric field relaxation region 32a, the electric field relaxation region 32b, and the electric field relaxation region 32c are sometimes collectively referred to simply as the electric field relaxation region 32.

The silicon carbide layer 10 is located between the source electrode 12 and the drain electrode 14. The silicon carbide layer 10 includes the first face ("P1" in FIG. 46) and a second face ("P2" in FIG. 46). Hereinafter, the first face P1 is referred to as a front face, and the second face P2 is referred to as a back face. The second face P2 is opposite to the first face P1.

The first direction and the second direction are directions parallel to the first face P1. The second direction is a direction orthogonal to the first direction. The third direction is a direction perpendicular to the first face P1. The third direction is a direction perpendicular to the first direction and the second direction.

Hereinafter, "depth" means a depth based on the first face P1.

The silicon carbide layer 10 is SiC of a single crystal. The silicon carbide layer 10 is 4H—SiC, for example. The thickness of the silicon carbide layer 10 is, for example, equal to or more than 5 μm and equal to or less than 500 μm.

The first face P1 is a face inclined by equal to or more than 0 degrees and equal to or less than 8 degrees with respect to a (0001) face, for example. That is, the first face P1 is a face whose normal is inclined by equal to or more than 0 degrees and equal to or less than 8 degrees with respect to a c axis in a [0001] direction. In other words, an off angle with respect to the (0001) face is equal to or more than 0 degrees and equal to or less than 8 degrees. The second face P2 is a face inclined by equal to or more than 0 degrees and equal to or less than 8 degrees with respect to a (000-1) face, for example.

The (0001) face is referred to as a silicon face. The (000-1) face is referred to as a carbon face. The inclination direction of the first face P1 and the second face P2 is a [11-20] direction, for example. The [11-20] direction is an a axis direction. In FIGS. 46 to 49, for example, the first direction or the second direction shown in the figures is the a axis direction.

The gate trench 21 exists in the silicon carbide layer 10. The gate trench 21 is located on a side of the first face P1 of the silicon carbide layer 10. The gate trench 21 is a groove formed in the silicon carbide layer 10.

The gate trench 21 extends in the first direction as shown in FIG. 47. The gate trench 21 has a stripe shape as shown in FIG. 47.

The gate trench 21 is repeatedly disposed in the second direction as shown in FIGS. 46 and 47. The length of the gate trench 21 in the second direction is equal to or more than 0.5 μm and equal to or less than 1 μm, for example.

The gate trench 21 penetrates the source region 30 and the body region 28. The depth of the gate trench 21 is, for example, equal to or more than 1 μm and equal to or less than 2 μm.

The gate electrode 16 is located in the gate trench 21. The gate electrode 16 is provided between the source electrode 12 and the drain electrode 14. The gate electrode 16 extends in the first direction.

The gate electrode 16 is a conductive layer. The gate electrode 16 is, for example, polycrystalline silicon containing a p type impurity or an n type impurity.

The gate insulating layer 18 is located between the gate electrode 16 and the silicon carbide layer 10. The gate insulating layer 18 is provided between the source region 30, the body region 28, the drift region 26 and the gate trench bottom region 36, and the gate electrode 16.

The gate insulating layer 18 is, for example, a silicon oxide film. For example, a high dielectric constant insulating film can be applied to the gate insulating layer 18. For example, a stacked film of a silicon oxide film and a high dielectric constant insulating film can be applied to the gate insulating layer 18.

The interlayer insulating layer 20 is provided on the gate electrode 16. The interlayer insulating layer 20 is provided between the gate electrode 16 and the source electrode 12.

The thickness of the interlayer insulating layer 20 is larger than the thickness of the gate insulating layer 18, for example. The interlayer insulating layer 20 is, for example, a silicon oxide film. The interlayer insulating layer 20 electrically separates the gate electrode 16 from the source electrode 12.

The source electrode 12 is located on the first face P1 side of the silicon carbide layer 10. The source electrode 12 is provided on the first face P1 of the silicon carbide layer 10.

The source electrode 12 includes metal. The source electrode 12 includes, for example, aluminum (Al) or titanium (Ti).

The source electrode 12 is electrically connected to the source region 30, the body region 28, the electric field relaxation region 32, and the high concentration region 34.

The source electrode 12 has a silicide region 12a (first portion) and a Schottky region 12b (second portion).

The silicide region 12a is in contact with the source region 30 and the high concentration region 34. The source electrode 12 is in contact with the source region 30 on the first face P1 of the silicon carbide layer 10. The source electrode 12 is in contact with the high concentration region 34 on the first face P1 of the silicon carbide layer 10. The silicide region 12a is an example of the first portion.

The silicide region 12a includes a metal silicide, for example. The metal silicide is, for example, a nickel silicide or a titanium silicide.

By providing the silicide region 12a, contact resistance between the source electrode 12 and the source region 30 and contact resistance between the source electrode 12 and the high concentration region 34 are reduced. Connection between the source electrode 12 and the source region 30, and connection between the source electrode 12 and the high concentration region 34 are, for example, an ohmic connection.

The Schottky region 12b is in contact with the drift region 26 between the electric field relaxation region 32a and the electric field relaxation region 32b. The Schottky region 12b is in contact with the drift region 26 between the two contact trenches 22 adjacent to each other in the first direction.

The Schottky region 12b is in contact with the drift region 26 at a position shallower than the bottom of the contact trench 22. The Schottky region 12b is in contact with the drift region 26 on the first face P1. The Schottky region 12b is an example of the second portion.

The chemical composition of the Schottky region 12b is different from the chemical composition of the silicide region 12a. The Schottky region 12b includes, for example, polycrystalline silicon, aluminum (Al), titanium (Ti), tungsten (W), molybdenum (Mo), or nickel (Ni).

By providing the Schottky region 12b, a Schottky barrier is formed between the source electrode 12 and the drift region 26. The connection between the Schottky region 12b and the drift region 26 is a Schottky connection.

The drain electrode 14 is located on the second face P2 side of the silicon carbide layer 10. The drain electrode 14 is provided on the second face P2 of the silicon carbide layer 10. The drain electrode 14 is in contact with the drain region 24.

The drain electrode 14 is, for example, a metal or a metal semiconductor compound. The drain electrode 14 includes at least one material selected from the group consisting of a nickel silicide, titanium (Ti), nickel (Ni), silver (Ag), and gold (Au), for example.

The drain region of $n^+$ type 24 is provided on the second face P2 side of the silicon carbide layer 10. The drain region 24 includes, for example, nitrogen (N) as an n type impurity. The n type impurity concentration of the drain region 24 is, for example, equal to or more than $1\times10^{18}$ cm$^{-3}$ and equal to or less than $1\times10^{21}$ cm$^{-3}$.

The drift region of $n^-$ type 26 is provided on the drain region 24. The drift region 26 is located between the drain region 24 and the first face P1.

A part of the drift region 26 is located between the two contact trenches 22 adjacent to each other in the first direction. A part of the drift region 26 is interposed between the two contact trenches 22 adjacent to each other in the first direction. A part of the drift region 26 is located between the contact trench 22a and the contact trench 22b, for example.

A part of the drift region 26 is located between the two electric field relaxation regions 32 adjacent to each other in the first direction. A part of the drift region 26 is located between the electric field relaxation region 32a and the electric field relaxation region 32b, for example.

A part of the drift region 26 is in contact with the first face P1. A part of the drift region 26 is in contact with the Schottky region 12b.

The drift region 26 includes, for example, nitrogen (N) as an n type impurity. The n type impurity concentration of the drift region 26 is lower than the n type impurity concentration of the drain region 24. The n type impurity concentration of the drift region 26 is, for example, equal to or more than $4\times10^{14}$ cm$^{-3}$ and equal to or less than $1\times10^{18}$ cm$^{-3}$.

The body region of p type 28 is located between the drift region 26 and the first face P1. The body region 28 is located between the gate trench 21 and the contact trench 22.

The body region 28 functions as a channel forming region of the MOSFET 500. For example, when the MOSFET 500 is turned on, a channel through which electrons flow is formed in a region of the body region 28 in contact with the gate insulating layer 18. The region of the body region 28 in contact with the gate insulating layer 18 becomes a channel forming region.

The body region 28 includes, for example, aluminum (Al) as a p type impurity. The p type impurity concentration of the body region 28 is, for example, equal to or more than $5\times10^{16}$ cm$^{-3}$ and equal to or less than $5\times10^{17}$ cm$^{-3}$.

The depth of the body region 28 is smaller than the depth of the gate trench 21. The depth of the body region 28 is, for example, equal to or more than 0.4 μm and equal to or less than 1.0 μm.

The thickness of the body region 28 in the depth direction (third direction) is, for example, equal to or more than 0.1 μm and equal to or less than 0.3 μm.

The source region of $n^+$ type 30 is located between the body region 28 and the first face P1. The source region 30 is located between the gate trench 21 and the contact trench 22. The source region 30 extends in the first direction.

The source region 30 is in contact with the source electrode 12. The source region 30 is in contact with the silicide region 12a. The source region 30 is in contact with the gate insulating layer 18.

The source region 30 includes, for example, phosphorus (P) as an n type impurity. The n type impurity concentration of the source region 30 is higher than the n type impurity concentration of the drift region 26. The n type impurity concentration of the source region 30 is, for example, equal to or more than $1\times10^{19}$ cm$^{-3}$ and equal to or less than $1\times10^{21}$ cm$^{-3}$.

The depth of the source region 30 is smaller than the depth of the body region 28. The depth of the source region 30 is, for example, equal to or more than 0.1 μm and equal to or less than 0.4 μm.

The electric field relaxation region of $p^+$ type 32 is located between the drift region 26 and the first face P1. The electric field relaxation region 32 is located in the second direction of the gate trench 21.

The electric field relaxation regions 32 are adjacent to each other in the first direction. For example, the electric field relaxation region 32a and the electric field relaxation region 32b are adjacent to each other in the first direction. For example, the electric field relaxation region 32b is located in the first direction with respect to the electric field relaxation region 32a. For example, the electric field relaxation region 32c and the electric field relaxation region 32d are adjacent to each other in the first direction. For example, the electric field relaxation region 32d is located in the first direction with respect to the electric field relaxation region 32c.

The two electric field relaxation regions 32 adjacent to each other in the first direction interpose the drift region 26 in between. For example, the electric field relaxation region 32a and the electric field relaxation region 32b interpose the drift region 26 in between. For example, the electric field relaxation region 32c and the electric field relaxation region 32d interpose the drift regions 26 in between.

The depth of the electric field relaxation region 32 is larger than the depth of the gate trench 21.

The electric field relaxation region 32 has a function of relaxing an electric field strength applied to the gate insulating layer 18 at the time of the off operation of the MOSFET 500. The electric field relaxation region 32 is fixed at the same electric potential as the source electrode 12, for example.

The electric field relaxation region 32 includes, for example, aluminum (Al) as a p type impurity. The p type impurity concentration of the electric field relaxation region 32 is higher than the p type impurity concentration of the body region 28. The p type impurity concentration of the electric field relaxation region 32 is, for example, equal to or more than 10 times the p type impurity concentration of the body region 28. The p type impurity concentration of the electric field relaxation region 32 is, for example, equal to or more than $5\times10^{17}$ cm$^{-3}$ and equal to or less than $5\times10^{20}$ cm$^{-3}$.

The high concentration region of p$^+$ type 34 is located between the body region 28 and the first face P1. The high concentration region 34 is located between the electric field relaxation region 32 and the first face P1. The high concentration region 34 is located between the drift region 26 in a portion in contact with the Schottky region 12b and the source region 30.

The high concentration region 34 is in contact with the first face P1, for example. The high concentration region 34 is in contact with the source electrode 12 on the first face.

The high concentration region 34 has a function of reducing the contact resistance of the source electrode 12. By providing the high concentration region 34, the electric resistance between the source electrode 12 and the electric field relaxation region 32 is reduced. By providing the high concentration region 34, the electric resistance between the source electrode 12 and the body region 28 is reduced.

The high concentration region 34 has a function of suppressing punch-through between the drift region 26 in a portion in contact with the Schottky region 12b and the source region 30 at the time of the off operation of the MOSFET 500.

The high concentration region 34 includes, for example, aluminum (Al) as a p type impurity. The p type impurity concentration of the high concentration region 34 is higher than the p type impurity concentration of the body region 28. The p type impurity concentration of the high concentration region 34 is, for example, equal to or more than 10 times and equal to or less than 1000 times the p type impurity concentration of the body region 28.

The p type impurity concentration of the high concentration region 34 is, for example, equal to or more than $1\times10^{19}$ cm$^{-3}$ and equal to or less than $1\times10^{21}$ cm$^{-3}$. The p type impurity concentration of the portion of the high concentration region 34 in contact with the source electrode 12 is, for example, equal to or more than $1\times10^{19}$ cm$^{-3}$ and equal to or less than $1\times10^{21}$ cm$^{-3}$.

The gate trench bottom region of p' type 36 is provided between the drift region 26 and the bottom face of the gate trench 21. The gate trench bottom region 36 is in contact with the bottom face of the gate trench 21.

The gate trench bottom region 36 has a function of relaxing an electric field strength applied to the gate insulating layer 18 at the time of the off operation of the MOSFET 500. The gate trench bottom region 36 is fixed at the same electric potential as the source electrode 12, for example.

The gate trench bottom region 36 includes, for example, aluminum (Al) as a p type impurity. The p type impurity concentration of the gate trench bottom region 36 is higher than the p type impurity concentration of the body region 28.

The p type impurity concentration of the gate trench bottom region 36 is, for example, equal to or more than 10 times the p type impurity concentration of the body region 28. The p type impurity concentration of the gate trench bottom region 36 is, for example, equal to or more than $5\times10^{17}$ cm$^{-3}$ and equal to or less than $5\times10^{20}$ cm$^{-3}$.

Next, the functions and effects of the semiconductor device of the fifth embodiment will be described.

A trench gate structure is applied to the MOSFET 500 similarly to the MOSFET 100 of the first embodiment. Therefore, the on-resistance of the MOSFET 500 is reduced.

Similarly to the MOSFET 100 of the first embodiment, the MOSFET 500 includes the electric field relaxation region 32 deeper than the gate trench 21. This improves the reliability of the gate insulating layer 18.

Similarly to the MOSFET 100 of the first embodiment, the MOSFET 500 includes the gate trench bottom region 36 on the bottom face of the gate trench 21. This improves the reliability of the gate insulating layer 18.

Similarly to the MOSFET 100 of the first embodiment, the MOSFET 500 of the fifth embodiment includes an SBD as a built-in diode. Then, the drift region 26 in the portion in contact with the Schottky region 12b is interposed between the two electric field relaxation regions 32 adjacent to each other in the first direction. Therefore, the leakage current at the time of reverse bias of the SBD is suppressed. Therefore, an increase in power consumption of the MOSFET 500 is suppressed.

As described above, according to the fifth embodiment, it is possible to realize a MOSFET capable of improving reliability. Furthermore, it is possible to realize a MOSFET in which the leakage current of the built-in SBD is suppressed.

Sixth Embodiment

A semiconductor device of the sixth embodiment is different from that of the fifth embodiment in that the first silicon carbide region includes a first region and a second region, the second region is located between the first region and the second silicon carbide region, between the trench and the fourth silicon carbide region, and between the fourth silicon carbide region and the fifth silicon carbide region, and the n type impurity concentration of the second region is higher than the n type impurity concentration of the first region. A part of description will be omitted regarding the contents overlapping with the description of the fifth embodiment.

The semiconductor device of the sixth embodiment is a vertical MOSFET 600 using silicon carbide.

Figure 50:
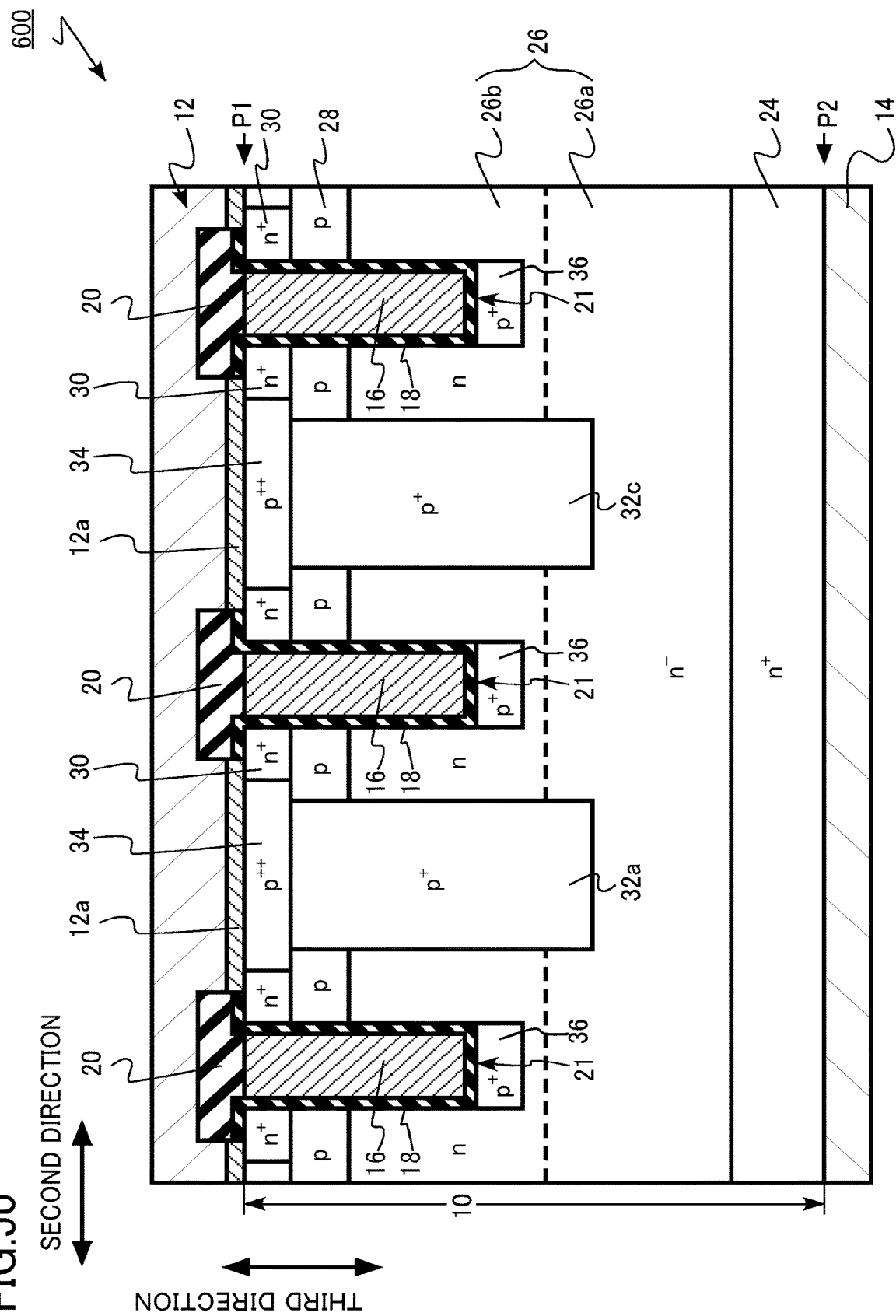
FIG. 50 is a schematic cross-sectional view of a semiconductor device of a sixth embodiment.
Figure 51:
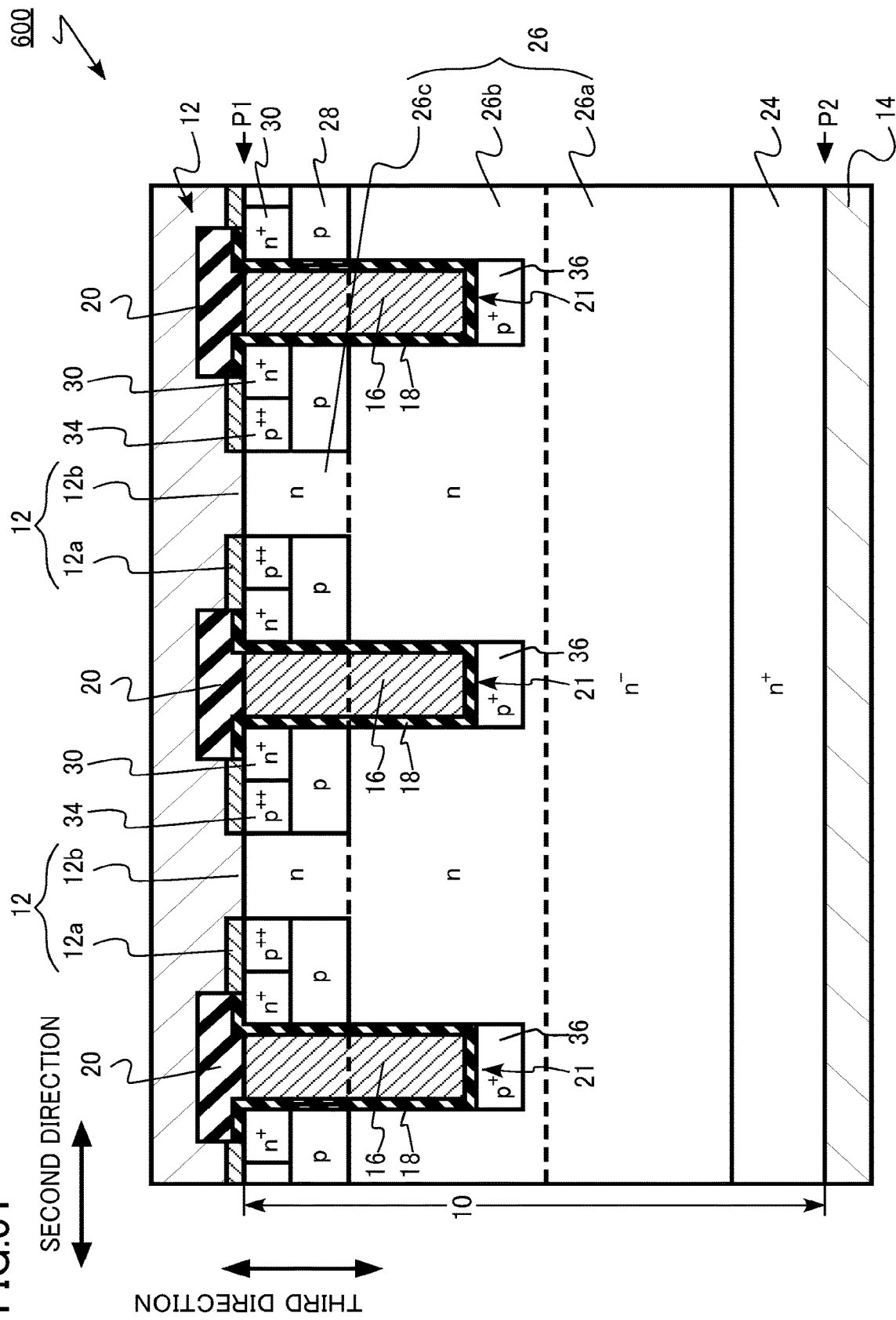
FIG. 51 is a schematic cross-sectional view of the semiconductor device of the sixth embodiment.
Figure 52:
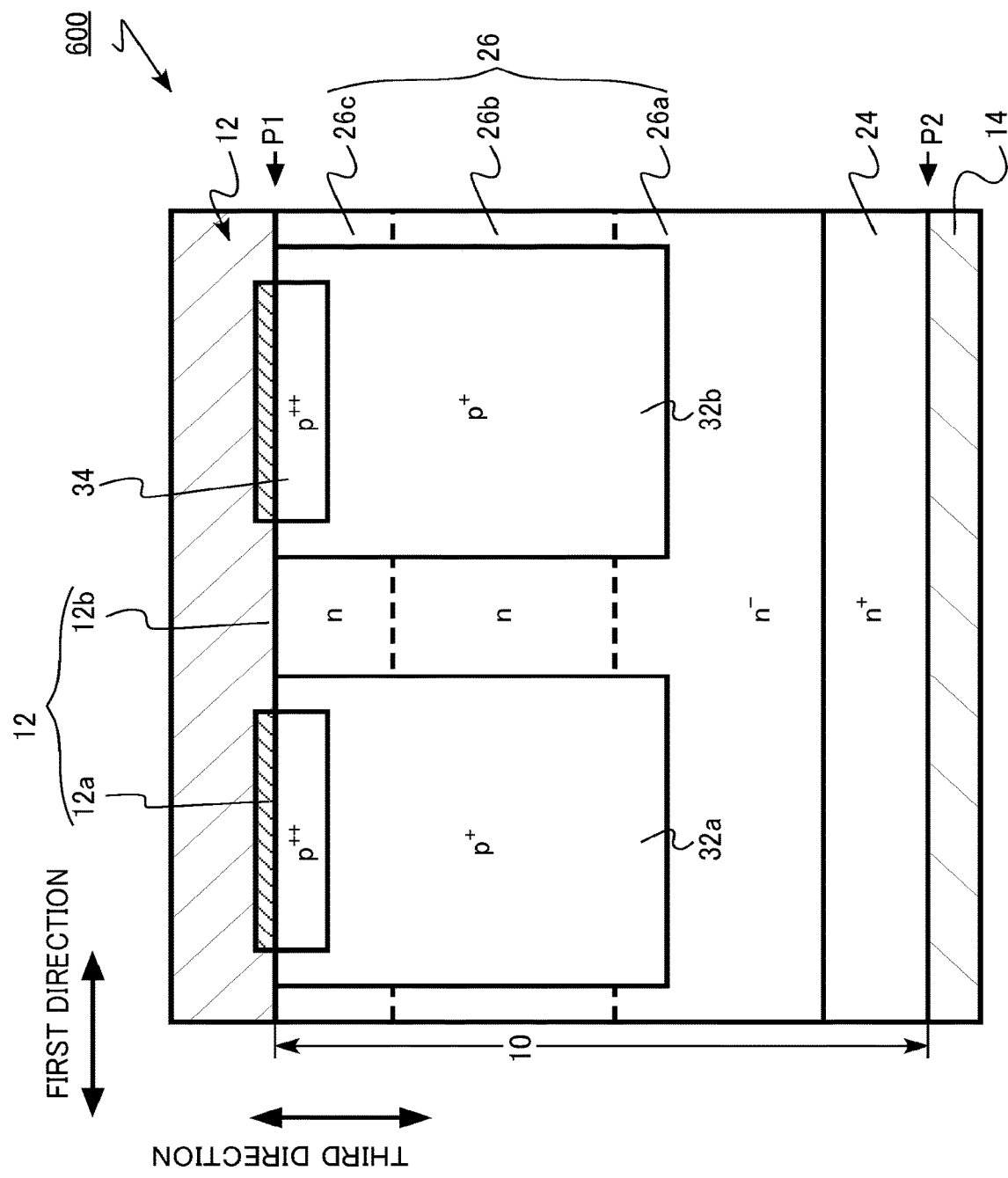
FIG. 52 is a schematic cross-sectional view of the semiconductor device of the sixth embodiment.

FIGS. 50 to 52 are schematic cross-sectional views of the semiconductor device of the sixth embodiment. FIGS. 50, 51, and 52 correspond to FIGS. 46, 47, and 49, respectively, of the fifth embodiment.

The MOSFET 600 includes the silicon carbide layer 10, the source electrode 12 (first electrode), the drain electrode 14 (second electrode), the gate electrode 16, the gate insulating layer 18, and the interlayer insulating layer 20. The source electrode 12 has a silicide region 12a (first portion) and a Schottky region 12b (second portion).

The silicon carbide layer 10 has the gate trench 21 (trench), the drain region of n$^+$ type 24, the drift region of n type 26 (first silicon carbide region), the body region of p type 28 (second silicon carbide region), the source region of n$^+$ type 30 (third silicon carbide region), the electric field relaxation region of p$^+$ type 32a (fourth silicon carbide region), the electric field relaxation region of p$^+$ type 32b (fifth silicon carbide region), the electric field relaxation region of p' type 32c, the high concentration region of p++ type 34 (sixth silicon carbide region), and the gate trench bottom region of p+ type 36 (seventh silicon carbide region).

Hereinafter, the electric field relaxation region 32a, the electric field relaxation region 32b, and the electric field relaxation region 32c are sometimes collectively referred to simply as the electric field relaxation region 32.

The drift region 26 has a first region of n⁻ type 26a, a second region of n type 26b, and a third region of n type 26c.

The first region of n⁻ type 26a is located between the drain region 24 and the body region 28.

The first region 26a includes, for example, nitrogen (N) as an n type impurity. The n type impurity concentration of the first region 26a is, for example, equal to or more than $4 \times 10^{14}$ cm$^{-3}$ and equal to or less than $1 \times 10^{17}$ cm$^{-3}$.

The second region of n type 26b is located between the first region 26a and the body region 28. The second region 26b is located between the gate trench 21 and the electric field relaxation region 32. For example, the second region 26b is located between the gate trench 21 and the electric field relaxation region 32a. For example, the second region 26b is located between the gate trench 21 and the electric field relaxation region 32b.

The second region 26b is located between the two electric field relaxation regions 32 adjacent to each other in the first direction. The second region 26b is located between the electric field relaxation region 32a and the electric field relaxation region 32b, for example.

The second region 26b includes, for example, nitrogen (N) as an n type impurity. The n type impurity concentration of the second region 26b is higher than the n type impurity concentration of the first region 26a.

The n type impurity concentration of the second region 26b is, for example, equal to or more than 1.2 times and equal to or less than 5 times the n type impurity concentration of the first region 26a. The n type impurity concentration of the second region 26b is, for example, equal to or more than $1 \times 10^{15}$ cm$^{-3}$ and equal to or less than $5 \times 10^{17}$ cm$^{-3}$.

The depth of the second region 26b is larger than the depth of the gate trench 21, for example. The depth of the second region 26b is larger than the depth of the gate trench bottom region 36, for example. The depth of the second region 26b is larger than the depth of the electric field relaxation region 32, for example.

The third region 26c is located between the second region 26b and the Schottky region 12b. The third region 26c is located between the second region 26b and the first face P1.

The third region 26c is located between the two electric field relaxation regions 32 adjacent to each other in the first direction. The third region 26c is located between the electric field relaxation region 32a and the electric field relaxation region 32b, for example.

The third region 26c includes, for example, nitrogen (N) as an n type impurity. The n type impurity concentration of the third region 26c is higher than the n type impurity concentration of the second region 26b.

The n type impurity concentration of the third region 26c is, for example, equal to or more than 1.5 times and equal to or less than 5 times the n type impurity concentration of the second region 26b.

The n type impurity concentration of the third region 26c is, for example, equal to or more than $1 \times 10^{16}$ cm$^{-3}$ and equal to or less than $1 \times 10^{18}$ cm$^{-3}$.

The depth of the third region 26c is smaller than the depth of the gate trench 21, for example.

In the MOSFET 600 of the sixth embodiment, by having the second region 26b having a high n type impurity concentration, it becomes possible to reduce the on-resistance.

In the MOSFET 600 of the sixth embodiment, by having the third region 26c having a high n type impurity concentration, the current flowing at the time of forward bias of the SBD built in the MOSFET 600 increases. Therefore, the clamp voltage of the pn junction diode becomes high. Hence, the current flowing through the pn junction diode is suppressed, and the reliability of the MOSFET 600 is further improved.

The n type impurity concentration of the third region 26c is preferably equal to or more than 1.5 times, more preferably equal to or more than 2 times, the n type impurity concentration of the second region 26b. As the n type impurity concentration in the third region 26c becomes high, it becomes possible to increase the clamping voltage of the pn junction diode.

The n type impurity concentration of the third region 26c is preferably equal to or less than 5 times, more preferably equal to or less than 4 times, the n type impurity concentration of the second region 26b. As the n type impurity concentration in the third region 26c becomes low, the leakage current of SBD is reduced.

As described above, according to the sixth embodiment, it is possible to realize a MOSFET capable of improving reliability. Furthermore, it is possible to realize a MOSFET in which the leakage current of the built-in SBD is suppressed.

Seventh Embodiment

An inverter circuit and a drive device of the seventh embodiment are drive devices including the semiconductor device of the first embodiment.

Figure 53:
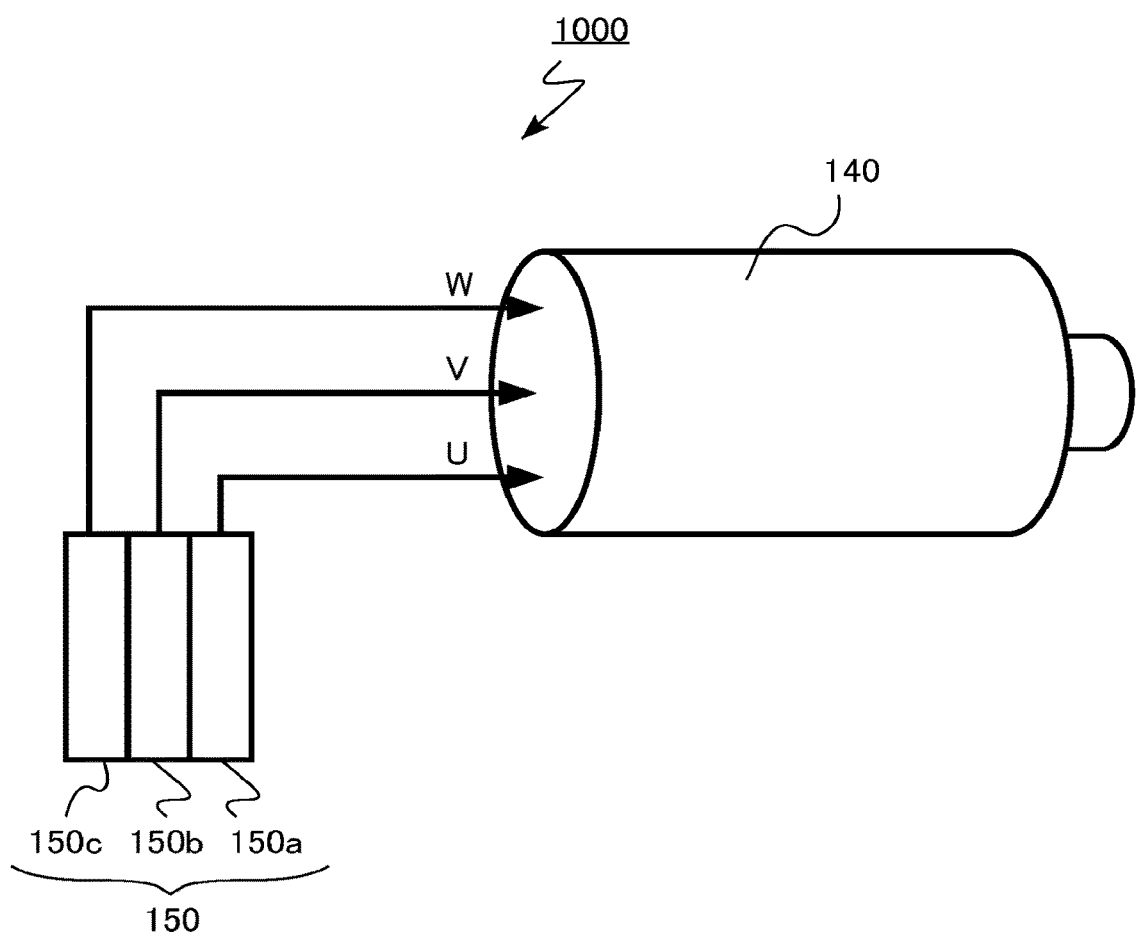
FIG. 53 is a schematic view of a drive device of a seventh embodiment.

FIG. 53 is a schematic view of the drive device of the seventh embodiment. A drive device 1000 includes a motor 140 and an inverter circuit 150.

The inverter circuit 150 includes three semiconductor modules 150a, 150b, and 150c having the MOSFET 100 of the first embodiment as a switching element. By connecting the three semiconductor modules 150a, 150b, and 150c in parallel, the three-phase inverter circuit 150 having three output terminals U, V, and W of alternate-current voltage is realized. The alternate-current voltage output from the inverter circuit 150 drives the motor 140.

According to the seventh embodiment, by providing the MOSFET 100 with improved characteristics, the characteristics of the inverter circuit 150 and the drive device 1000 are improved.

Eighth Embodiment

A vehicle of the eighth embodiment is a vehicle including the semiconductor device of the first embodiment.

Figure 54:
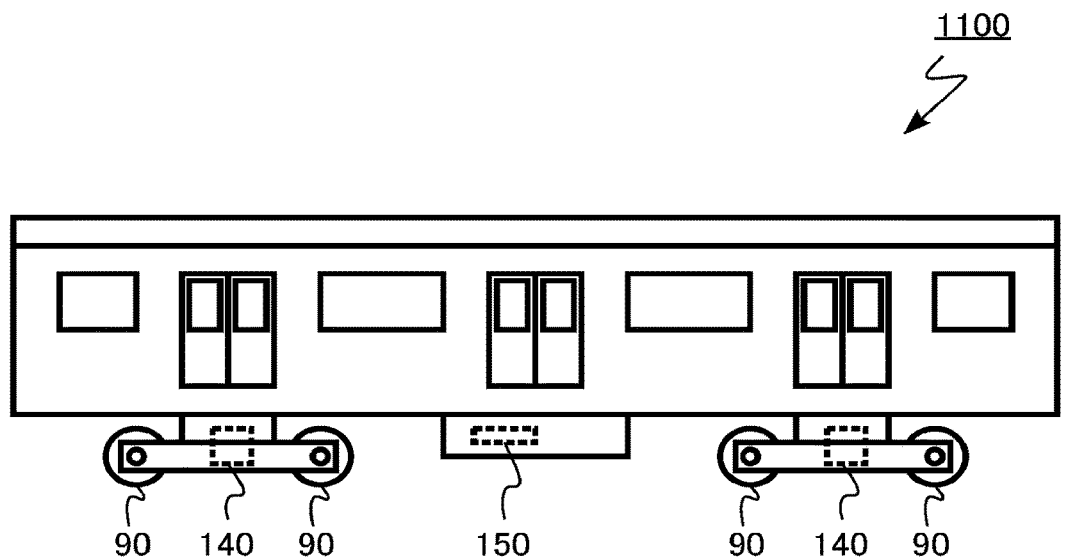
FIG. 54 is a schematic view of a vehicle of an eighth embodiment.

FIG. 54 is a schematic view of the vehicle of the eighth embodiment. A vehicle 1100 of the eighth embodiment is a railway vehicle. The vehicle 1100 includes the motor 140 and the inverter circuit 150.

The inverter circuit 150 includes three semiconductor modules having the MOSFET 100 of the first embodiment as a switching element. By connecting the three semiconductor modules in parallel, the three-phase inverter circuit 150 having three output terminals U, V, and W of alternate-current voltage is realized. The alternate-current voltage output from the inverter circuit 150 drives the motor 140. The motor 140 rotates wheels 90 of the vehicle 1100.

According to the eighth embodiment, by providing the MOSFET 100 with improved characteristics, the characteristics of the vehicle 1100 are improved.

Ninth Embodiment

A vehicle of the ninth embodiment is a vehicle including the semiconductor device of the first embodiment.

Figure 55:
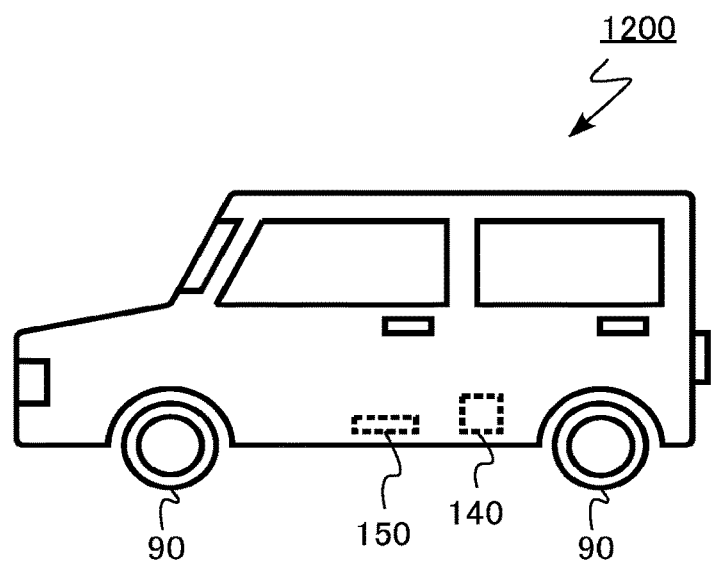
FIG. 55 is a schematic view of a vehicle of a ninth embodiment.

FIG. 55 is a schematic view of the vehicle of the ninth embodiment. A vehicle 1200 of the ninth embodiment is an automobile. The vehicle 1200 includes the motor 140 and the inverter circuit 150.

The inverter circuit 150 includes three semiconductor modules having the MOSFET 100 of the first embodiment as a switching element. By connecting the three semiconductor modules in parallel, the three-phase inverter circuit 150 having three output terminals U, V, and W of alternate-current voltage is realized.

The alternate-current voltage output from the inverter circuit 150 drives the motor 140. The motor 140 rotates wheels 90 of the vehicle 1200.

According to the ninth embodiment, by providing the MOSFET 100 with improved characteristics, the characteristics of the vehicle 1200 are improved.

Tenth Embodiment

An elevator of the tenth embodiment is an elevator including the semiconductor device of the first embodiment.

Figure 56:
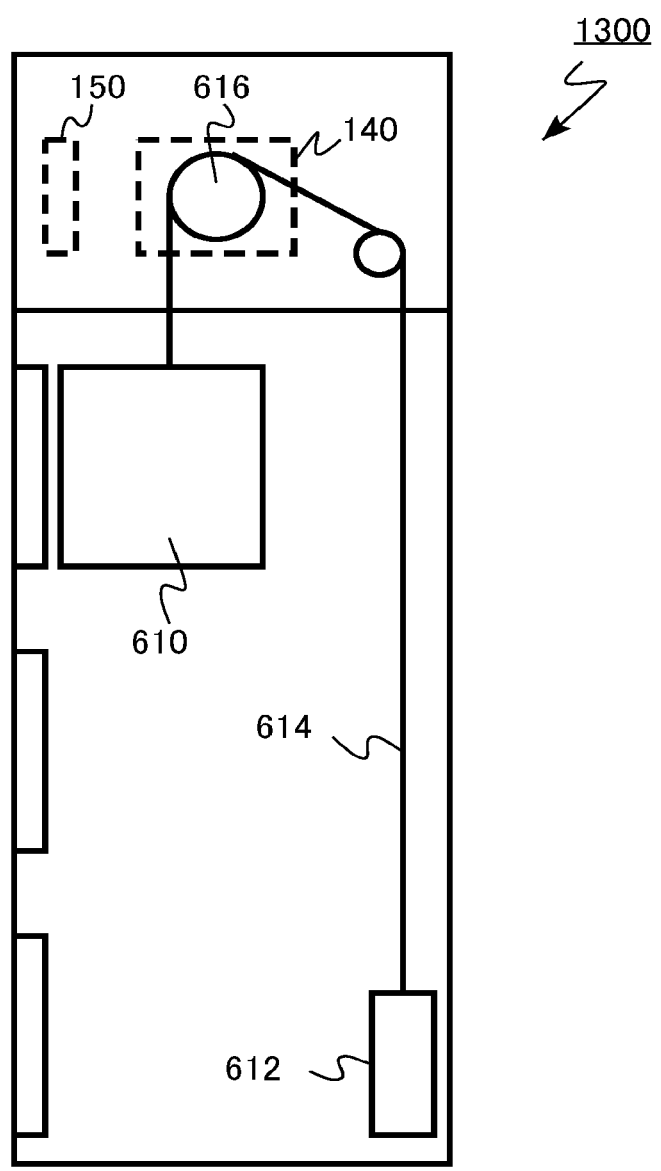
FIG. 56 is a schematic view of an elevator of a tenth embodiment.

FIG. 56 is a schematic view of the elevator of the tenth embodiment. An elevator 1300 of the tenth embodiment includes a car 610, a counter weight 612, a wire rope 614, a hoist 616, the motor 140, and the inverter circuit 150.

The inverter circuit 150 includes three semiconductor modules having the MOSFET 100 of the first embodiment as a switching element. By connecting the three semiconductor modules in parallel, the three-phase inverter circuit 150 having three output terminals U, V, and W of alternate-current voltage is realized.

The alternate-current voltage output from the inverter circuit 150 drives the motor 140. The motor 140 rotates the hoist 616 to move the car 610 up and down.

According to the tenth embodiment, by providing the MOSFET 100 with improved characteristics, the characteristics of the elevator 1300 are improved.

As described above, in the first to sixth embodiments, the case of 4H—SiC as the crystal structure of silicon carbide has been described, but the present disclosure can be applied to silicon carbide having other crystal structures such as 6H—SiC and 3C—SiC.

In the seventh to tenth embodiments, the case of including the semiconductor device of the first embodiment has been described as examples, but it is also possible to apply the semiconductor device of the second to sixth embodiments.

In the seventh to tenth embodiments, the case where the semiconductor device of the present disclosure is applied to a vehicle or an elevator has been described as examples, but it is also possible to apply the semiconductor device of the present disclosure to, for example, a power conditioner of a photovoltaic power generation system and the like.

While certain embodiments have been described, these embodiments have been presented by way of example only, and are not intended to limit the scope of the inventions. Indeed, the semiconductor device, the inverter circuit, the drive device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a silicon carbide layer having a first face and a second face opposite to the first face, the first face being parallel to a first direction and a second direction orthogonal to the first direction, the silicon carbide layer including
     a first trench located on a side of the first face and extending in the first direction,
     a second trench located on a side of the first face and located in the second direction with respect to the first trench,
     a third trench located on a side of the first face, the third trench located in the second direction with respect to the first trench, the third trench located in the first direction with respect to the second trench,
     a first silicon carbide region of n type,
     a second silicon carbide region of p type located between the first silicon carbide region and the first face,
     a third silicon carbide region of n type located between the second silicon carbide region and the first face,
     a fourth silicon carbide region of p type located between the first silicon carbide region and the second trench, and
     a fifth silicon carbide region of p type located between the first silicon carbide region and the third trench, and the first silicon carbide region located between the fourth silicon carbide region and the fifth silicon carbide region;
   a gate electrode located in the first trench;
   a gate insulating layer located between the gate electrode and the silicon carbide layer;
   a first electrode located on a side of the first face of the silicon carbide layer and including a first portion, a second portion, and a third portion, the first portion being in contact with the third silicon carbide region, the second portion being in contact with the first silicon carbide region located between the fourth silicon carbide region and the fifth silicon carbide region, and the third portion is located in the second trench; and
   a second electrode located on a side of the second face of the silicon carbide layer.

2. The semiconductor device according to claim 1, wherein the second portion and the first silicon carbide region are in contact with each other on the first face.

3. The semiconductor device according to claim 1, wherein the silicon carbide layer further including a sixth silicon carbide region of p type, the sixth silicon carbide region located between the third silicon carbide region and a portion of the first silicon carbide region in contact with the second portion, and a p type impurity concentration of the sixth silicon carbide region being higher than a p type impurity concentration of the second silicon carbide region.

4. The semiconductor device according to claim 1, wherein
   the first silicon carbide region includes a first region and a second region,
   the second region is located between the first region and the second silicon carbide region, the second region is located between the first trench and the second trench, the second region is located between the fourth silicon carbide region and the fifth silicon carbide region, and an n type impurity concentration of the second region is higher than an n type impurity concentration of the first region.

5. The semiconductor device according to claim 4, wherein the first silicon carbide region further includes a third region located between the second region and the second portion, and an n type impurity concentration of the third region is higher than the n type impurity concentration of the second region.

6. The semiconductor device according to claim 5, wherein an n type impurity concentration of the third region is equal to or more than 1.5 times an n type impurity concentration of the second region.

7. The semiconductor device according to claim 1, wherein a chemical composition of the first portion and a chemical composition of the second portion are different.

8. The semiconductor device according to claim 1, wherein the first portion includes a metal silicide.

9. The semiconductor device according to claim 1, wherein a length of the second trench in the first direction is larger than a length of the second trench in the second direction.

10. The semiconductor device according to claim 1, wherein a distance between the second trench and the third trench is larger than a length of the second trench in the second direction.

11. The semiconductor device according to claim 1, wherein the silicon carbide layer further including a seventh silicon carbide region of p type located between the first silicon carbide region and the first trench.

12. A semiconductor device, comprising:
a silicon carbide layer having a first face and a second face opposite to the first face, the first face being parallel to a first direction and a second direction orthogonal to the first direction, the silicon carbide layer including
a trench located on a side of the first face and extending in the first direction,
a first silicon carbide region of n type,
a second silicon carbide region of p type located between the first silicon carbide region and the first face,
a third silicon carbide region of n type located between the second silicon carbide region and the first face,
a fourth silicon carbide region of p type located in the second direction with respect to the trench, the first silicon carbide region located between the fourth silicon carbide region and the trench, and the fourth silicon carbide region being deeper than the trench, and
a fifth silicon carbide region of p type located in the first direction with respect to the fourth silicon carbide region, the first silicon carbide region located between the fifth silicon carbide region and the fourth silicon carbide region, and the fifth silicon carbide region being deeper than the trench;
a gate electrode located in the trench;
a gate insulating layer located between the gate electrode and the silicon carbide layer;
a first electrode located on a side of the first face of the silicon carbide layer, the first electrode including a first portion and a second portion, the first portion being in contact with the third silicon carbide region, and the second portion being in contact with the first silicon carbide region located between the fourth silicon carbide region and the fifth silicon carbide region; and
a second electrode located on a side of the second face of the silicon carbide layer.

13. The semiconductor device according to claim 12, wherein the second portion and the first silicon carbide region are in contact with each other on the first face.

14. The semiconductor device according to claim 12, wherein the silicon carbide layer further including a sixth silicon carbide region of p type, the sixth silicon carbide region located between the third silicon carbide region and a portion of the first silicon carbide region in contact with the second portion, and a p type impurity concentration of the sixth silicon carbide region being higher than a p type impurity concentration of the second silicon carbide region.

15. The semiconductor device according to claim 12, wherein
the first silicon carbide region includes a first region and a second region,
the second region is located between the first region and the second silicon carbide region, the second region is located between the trench and the fourth silicon carbide region, and the second region is located between the fourth silicon carbide region and the fifth silicon carbide region, and an n type impurity concentration of the second region is higher than an n type impurity concentration of the first region.

16. The semiconductor device according to claim 15, wherein the first silicon carbide region further includes a third region located between the second region and the second portion, and an n type impurity concentration of the third region is higher than the n type impurity concentration of the second region.

17. An inverter circuit comprising a semiconductor device according to claim 1.

18. A drive device comprising a semiconductor device according to claim 1.

19. A vehicle comprising a semiconductor device according to claim 1.

20. An elevator comprising a semiconductor device according to claim 1.

* * * * *